US009202832B2

(12) United States Patent
Kaiser et al.

(10) Patent No.: US 9,202,832 B2
(45) Date of Patent: Dec. 1, 2015

(54) INTEGRATED CIRCUIT ARRANGEMENTS

(75) Inventors: Dieter Kaiser, Dresden (DE); Dirk Meinhold, Dresden (DE); Thoralf Kautzsch, Dresden (DE); Georg Holfeld, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 658 days.

(21) Appl. No.: 13/089,379

(22) Filed: Apr. 19, 2011

(65) Prior Publication Data
US 2012/0267694 A1    Oct. 25, 2012

(51) Int. Cl.
*H01L 27/146* (2006.01)
*H01L 31/0232* (2014.01)
*H01L 27/144* (2006.01)

(52) U.S. Cl.
CPC ...... *H01L 27/14621* (2013.01); *H01L 27/1443* (2013.01); *H01L 27/14614* (2013.01); *H01L 27/14685* (2013.01); *H01L 31/02327* (2013.01); H01L 27/1463 (2013.01); H01L 27/14643 (2013.01)

(58) Field of Classification Search
CPC ............... H01L 27/14625; H01L 31/02019; H01L 31/02327; H01L 27/14614; H01L 27/14647; H01L 27/1443; H01L 27/14643; H01L 27/14645; H01L 247/14647; G02B 6/42
USPC ...................................................... 257/291
See application file for complete search history.

(56) References Cited

U.S. PATENT DOCUMENTS

| 6,121,667 | A | 9/2000 | Lee |
| 7,250,591 | B2 | 7/2007 | Mouli |
| 7,439,479 | B2 | 10/2008 | Mouli |
| 7,683,311 | B2 | 3/2010 | Mouli |
| 7,821,091 | B2 | 10/2010 | Fertig et al. |
| 2008/0198454 | A1 | 8/2008 | Wang et al. |
| 2009/0111200 | A1 | 4/2009 | Carothers et al. |
| 2009/0140362 | A1* | 6/2009 | Fertig et al. .................. 257/432 |
| 2009/0200587 | A1* | 8/2009 | Venezia et al. ................ 257/292 |
| 2010/0122221 | A1* | 5/2010 | Fertig et al. ....................... 716/2 |
| 2013/0093035 | A1* | 4/2013 | Fertig et al. .................. 257/432 |

FOREIGN PATENT DOCUMENTS

| CN | 101261345 A | 9/2008 |
| WO | 2009113961 A1 | 9/2009 |

OTHER PUBLICATIONS

"Color filter based on a subwavelength patterned mettal grating" Hong-Shik et al. Nov. 12, 2007 / vol. 15, No. 23 / Optics Express / pp. 15457-15463.
"Hyperspectral imaging" Kunstmaan http://imec.be/ScientificReport/SR2009/HTML/1213334.html pp. 1-5.
Electronic Imaging & Signal Processing "Black Silicon is ready to revolutionize photoelectronics" Mark Crawford Dec. 8, 2008 / SPIE Newsroom http://spie.org/x31676.xml?ArticleID=x316761 pp. 1-3.

(Continued)

*Primary Examiner* — Eva Y Montalvo
*Assistant Examiner* — Diana C Vieira

(57) ABSTRACT

An integrated circuit arrangement is provided, including a transistor including a gate region; and a wavelength conversion element, wherein the wavelength conversion element may include the same material or same materials as the gate region of the transistor.

22 Claims, 38 Drawing Sheets

(56) References Cited

OTHER PUBLICATIONS

"Eyeing the camera: into the Next Century" Richard F. Lyon and Paul M. Hubel Foveon, Inc. Santa Clara, California, USA pp. 1-7.

"Fabrication of Transmission Color Filters Using Silicon Subwavelength Gratings on Quartz Substrates" Yoshiaki Kanamori et al. IEEE Photonics Technology Letters, vol. 18, No. 20, Oct. 15, 2006 pp. 2126-2128.

"Annotated Integration Scheme" Infineon Technologies, 2010 pp. 1-13.

Office Action in the CN application No. 201210115711.4 issued on May 26, 2014 (10 pages) with its English translation (22 pages).

\* cited by examiner

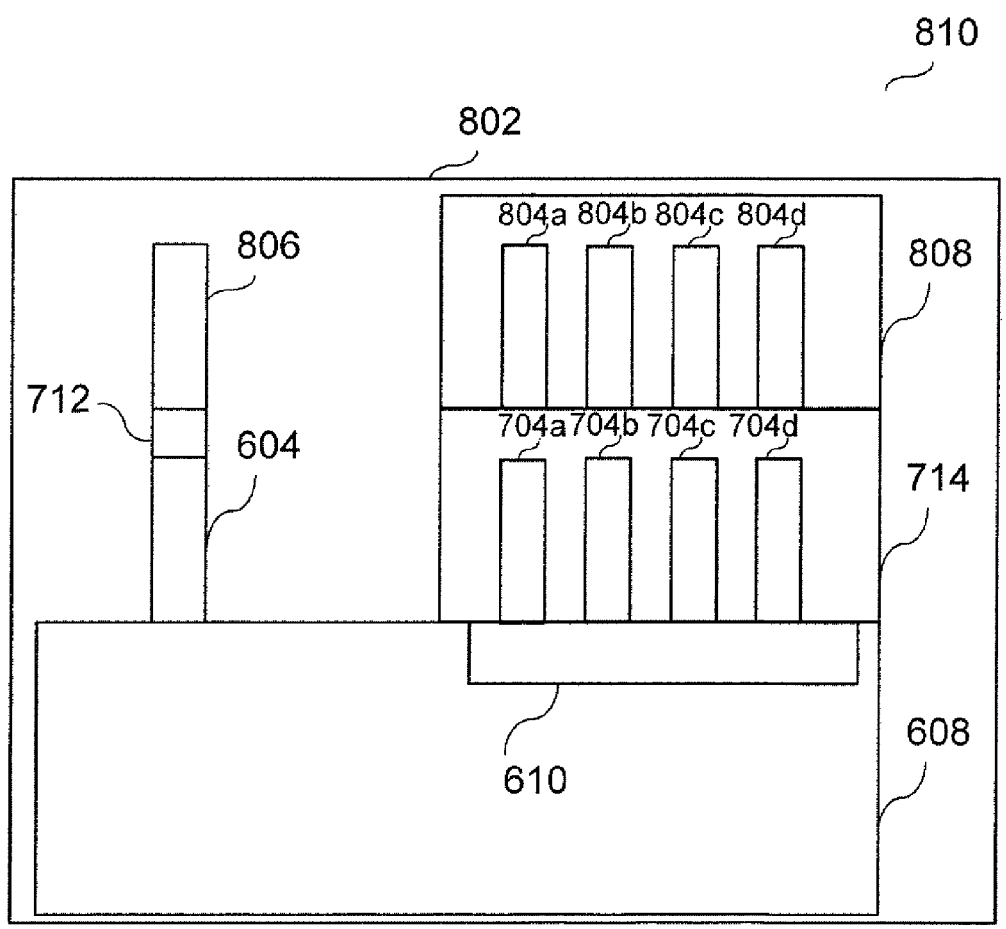

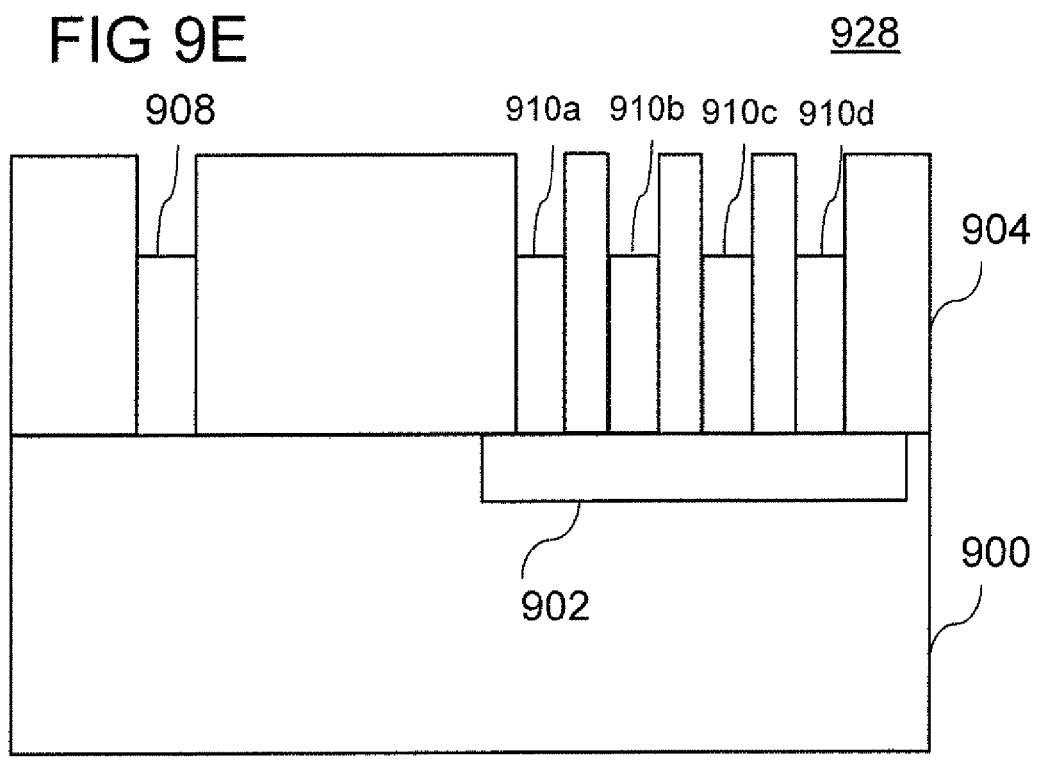
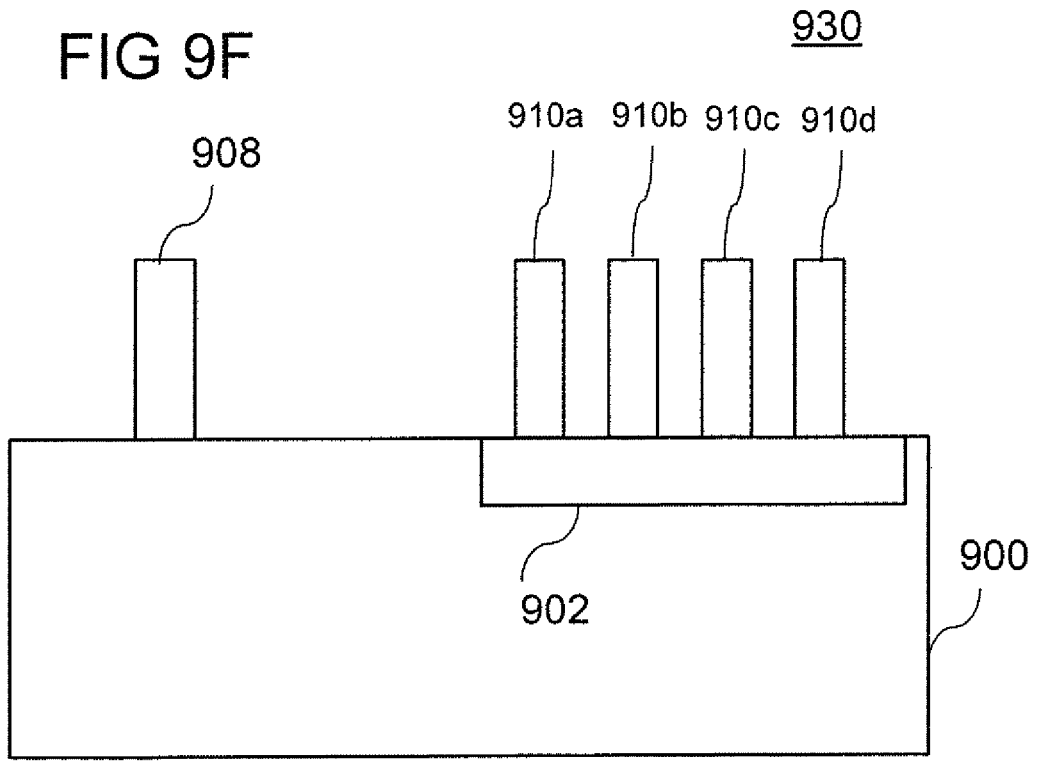

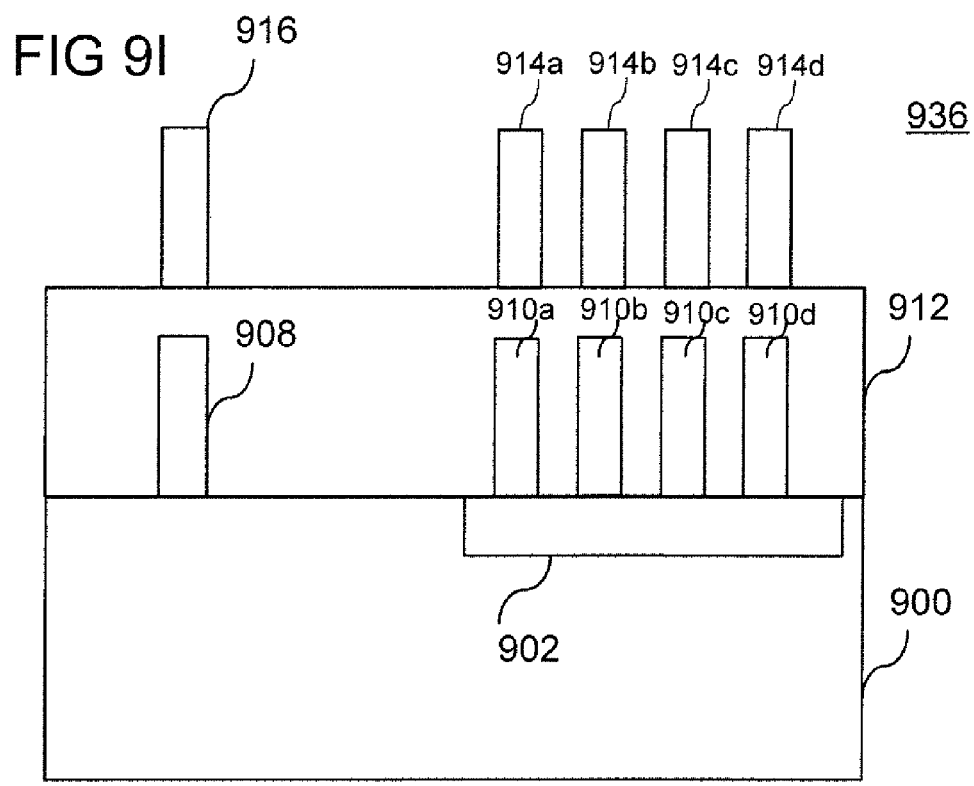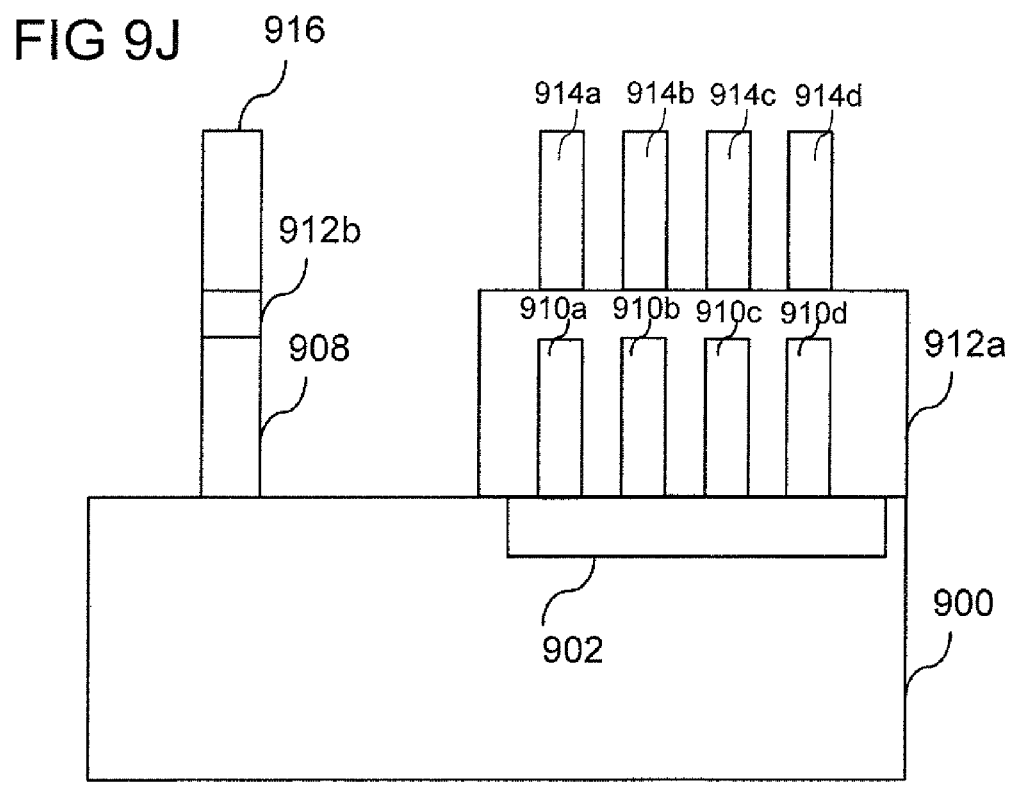

FIG 11
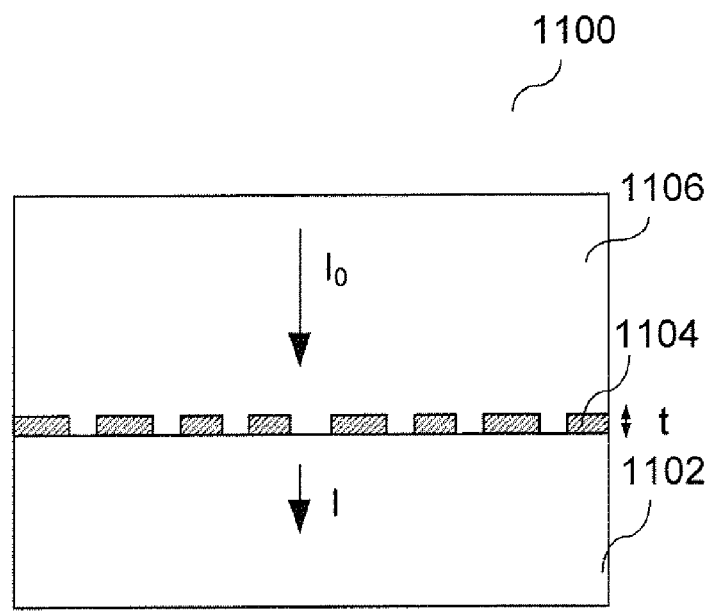
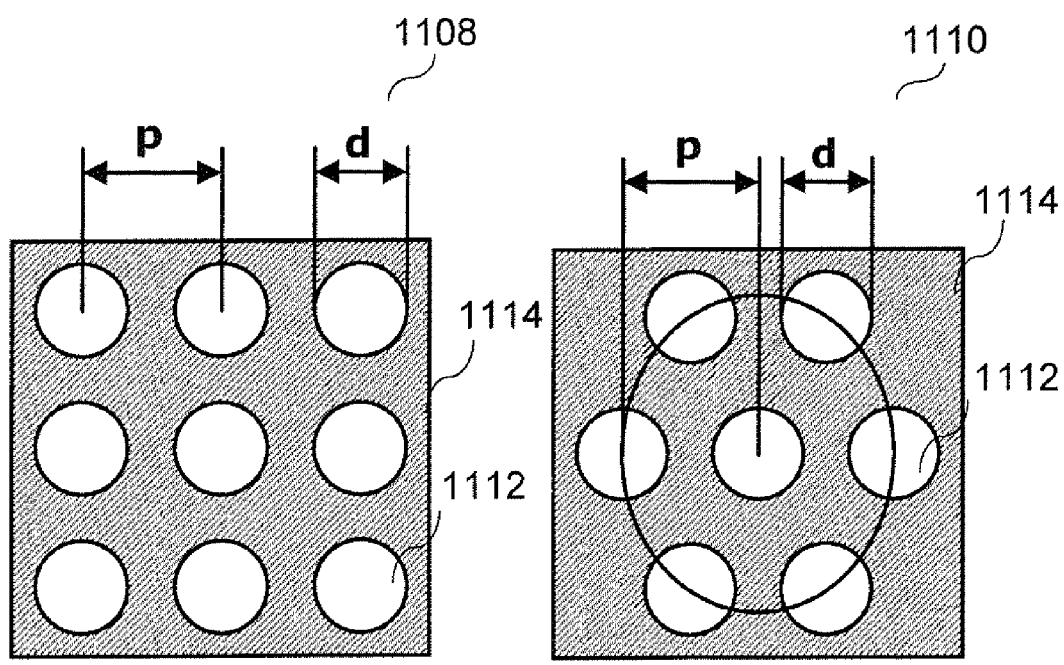

FIG 13
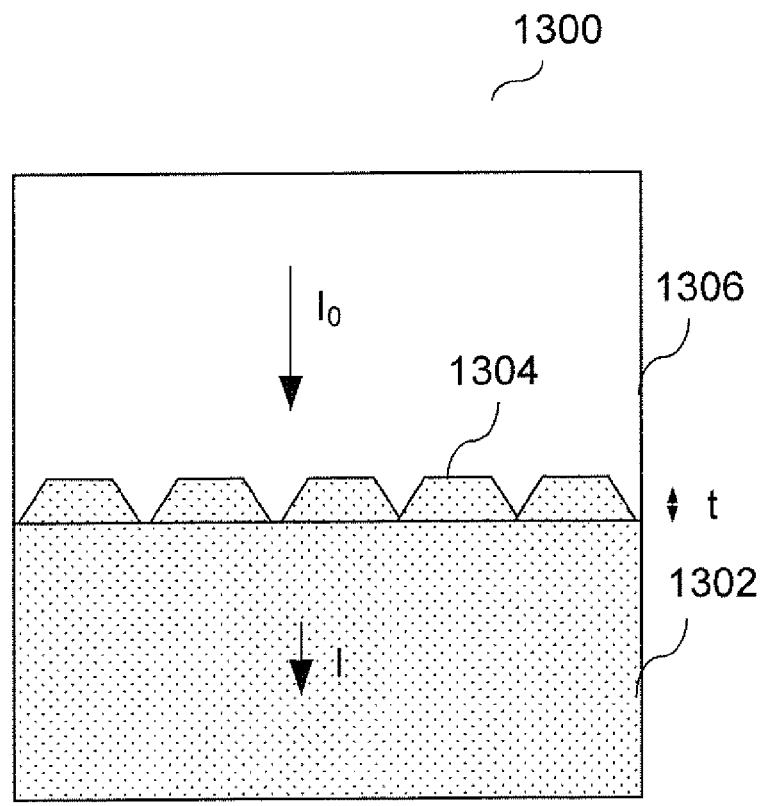
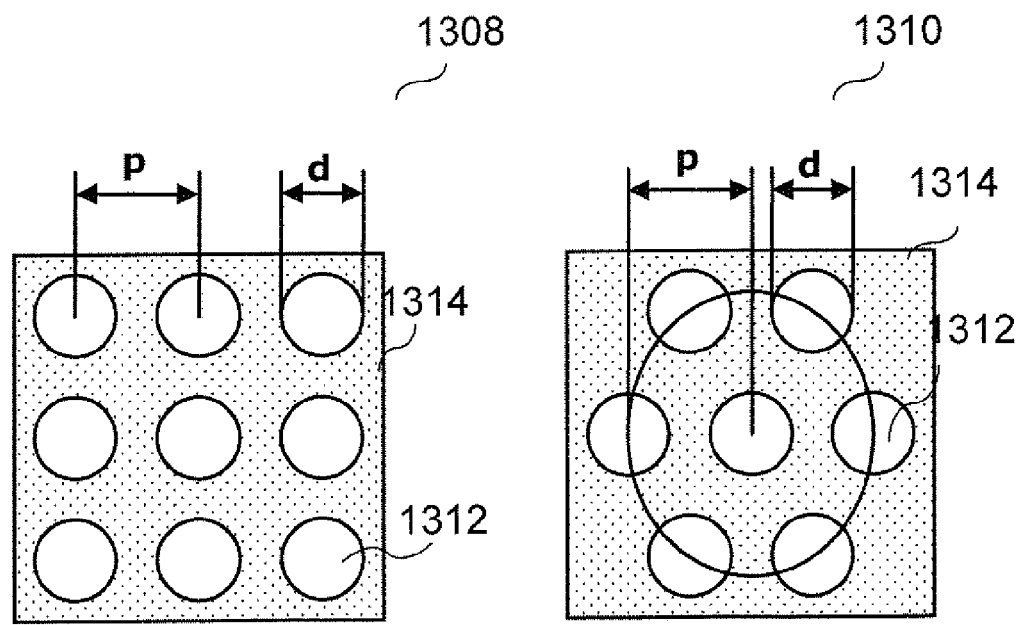

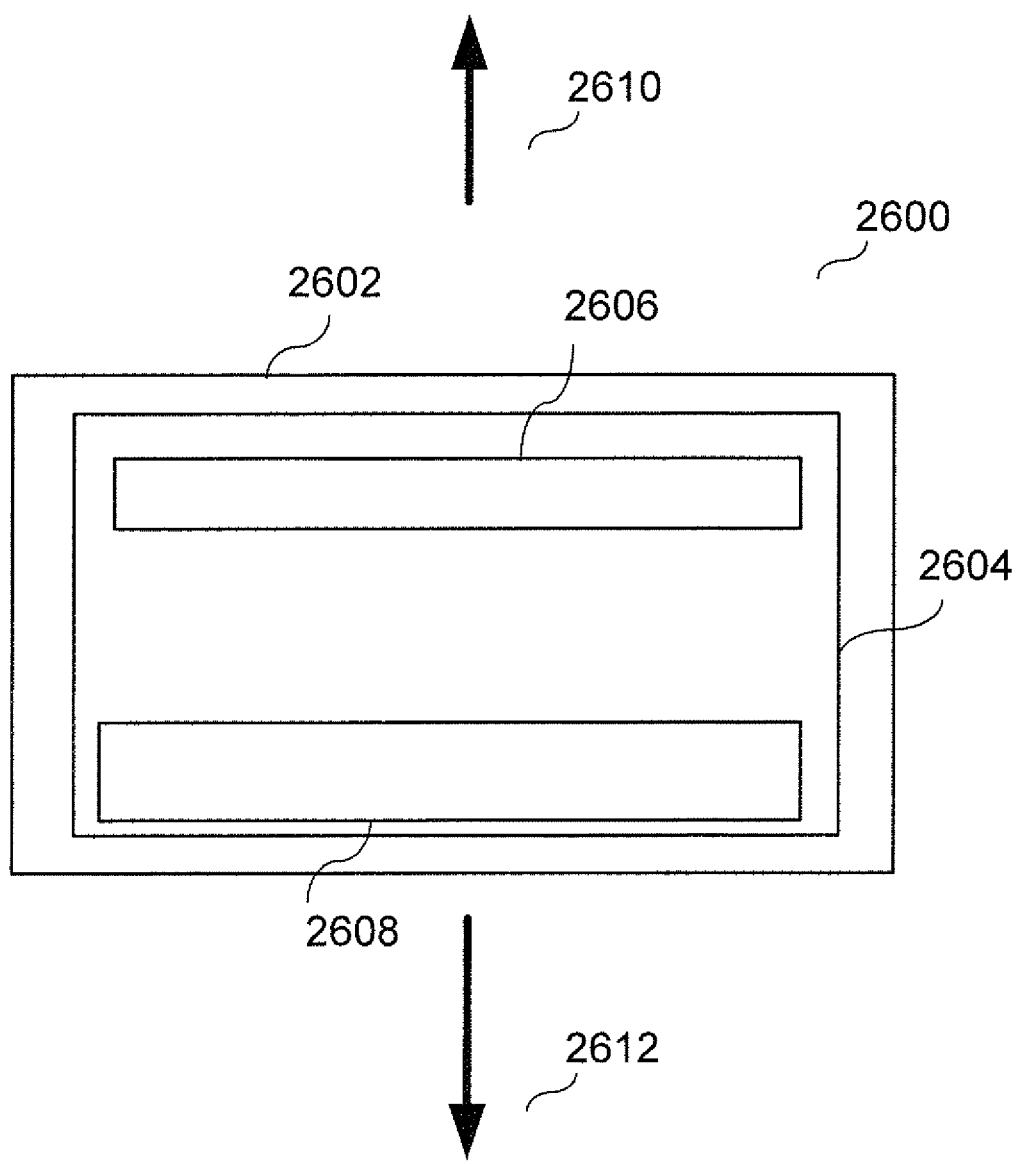

INTEGRATED CIRCUIT ARRANGEMENTS

TECHNICAL FIELD

Various embodiments relate generally to integrated circuit arrangements.

BACKGROUND

Photodetectors such as photodiodes may be used for sensing ambient light or colors by placing a spectral filter with the desired sensing characteristics in front of the photodetector to select wavelengths of ambient light reaching the photodetector. In the context of this disclosure, ambient light may be understood to mean surrounding light from the environment that may include a mixture of wavelengths from the visible spectrum, and/or a range of electromagnetic waves of unspecified wavelengths. Traditionally, spectral filters have comprised unpatterned stacks of dielectric layers. The sensing characteristics of the spectral filters could be selected by adjusting the thickness of the layer or by adjusting the spectral filter material. However, these kinds of dielectric filters are costly and offer only one filter option per wafer whereby the filter is processed in an additional manufacturing step.

Recently, spectral filters formed from gratings and arrays have been reported. Subwavelength silicon gratings on quartz substrates as color filters have been reportedly demonstrated.

Furthermore, color filter arrays have been used in applications for image sensing, e.g. to select a particular wavelength of electromagnetic radiation for sensing by a photoconversion device. That is, the color sensitivity of the eye may be reproduced through the use of, for example, three different filters of an image, each configured to select a particular wavelength of electromagnetic radiation, wherein each of the filters behaves as a respective one of the three different color receptors in the eye. Current devices which may exploit the use of spectral filters for wavelength selection for photodetectors, have traditionally incorporated spectral filters merely as add-on external components to the photodetector. That is, the spectral filters are constructed independently from the photodector, in a separate manufacturing process. The separate spectral filters are then added on as an external component after the separate manufacturing process. The use of externally produced spectral filters in combination with existing photodetectors therefore represents a high cost to the manufacturing process. Furthermore, the process of incorporating independently constructed spectral filters with a photodetector may add further technical complexity to the manufacturing process. The spectral filter would further need to be designed to function with other electronic components within an integrated circuit.

SUMMARY

An embodiment is an integrated circuit arrangement, including a transistor including a gate region; and a wavelength conversion element, wherein the wavelength conversion element may include the same material or same materials as the gate region of the transistor.

Another embodiment is an integrated circuit arrangement, including a transistor including a gate region; and a wavelength conversion element, wherein the wavelength conversion element may include an interlayer dielectric material, and wherein the interlayer dielectric layer material includes the same material or same materials as a region at least partially laterally isolating the gate region.

Another embodiment is an integrated circuit arrangement, including a plurality of devices, a device isolation region for separating at least one device of the plurality of devices from a further at least one device of the plurality of devices, and a wavelength conversion element, wherein the wavelength conversion element includes the same material or same materials as the device isolation region.

Another embodiment is an integrated circuit arrangement, including a carrier including a first side and a second side, wherein the second side faces the opposite direction to the direction which the first side faces, one or more devices formed in the first side of the carrier, and a wavelength conversion element formed in the second side of the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIGS. 8A and 8B show an integrated circuit arrangement in accordance with one embodiment;

FIGS. 9A to 9L show a method for fabricating an integrated circuit arrangement in accordance with one embodiment;

FIG. 11 shows a wavelength conversion element in accordance with one embodiment;

FIG. 13 shows a wavelength conversion element in accordance with one embodiment;

FIG. 26 shows an integrated circuit arrangement in accordance with various embodiments;

DETAILED DESCRIPTION

Figure 1:
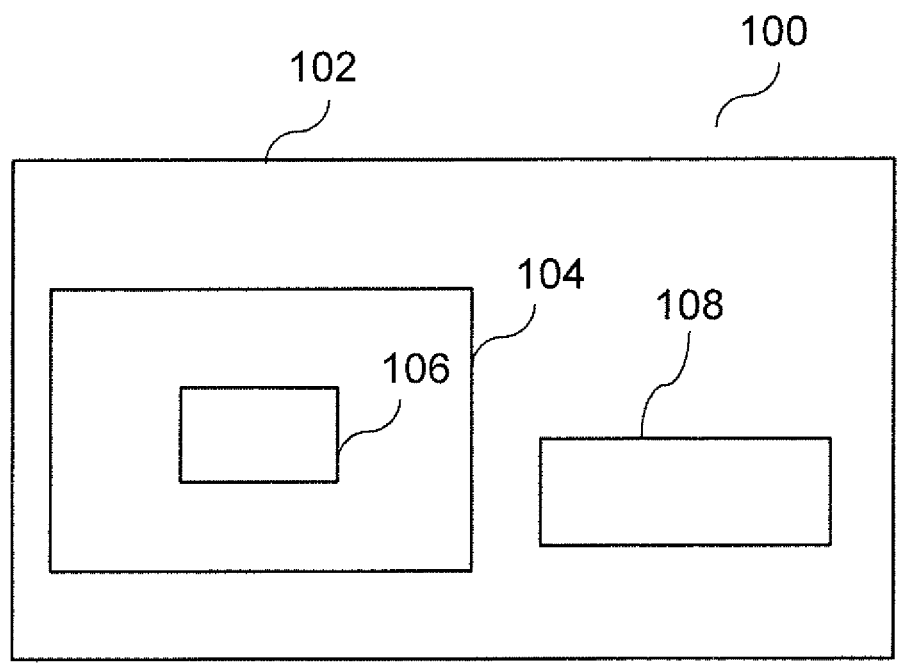
FIG. 1 shows an integrated circuit arrangement in accordance with one embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In various embodiments, a new device which contains a spectral filter integrated with electronic components within an integrated circuit and with a photodiode may provide an opportunity for cost savings to the manufacturing process, and reduced complexity to the manufacturing of image sensors. Components of a spectral filter-photodiode integrated circuit may be manufactured within the same manufacturing process, such that the spectral filter-photodiode integrated circuit can be manufactured with other electronic components, e.g. transistors within an integrated circuit in accordance with various embodiments.

Integrated spectral filters with appropriate structures and material combinations may be used to create a CMOS-compatible spectral filter-photodiode integrated circuit. Multiple sensors with different sensitivities can be seamlessly integrated with spectral filters with different lateral structures and material combinations within a chip. For example, RGB sensors can be produced by laterally patterning optical filters with adjustable spectral sensitivity, such as by producing optical filters with structures in the sub-wavelength region of visible light, e.g. optical filter arrays/gratings with periods of approximately 250 nm. It is also easily possible to manufacture photodiodes, e.g. RGB sensors, with different spectral responses on a single chip in accordance with various embodiments. To create a photonic crystal, the pattern forming the crystal structure, or the pitch of the elementary cell should be in the order of half the wavelength of the light or smaller. Hence, 193 nm lithography may be used to achieve the technological capability to create photonic structures for light in the visible spectral range.

By further using lateral subwavelength gratings structures, ambient light sensors (ALS) with ambient light sensitivity comparable to the sensitivity of the eye can be produced. Such sensors may be suitable as ambient light sensors for the light intensity control of displays, e.g. in the backlight in mobile phones, navigation devices, notebook PCs and netbooks, flat screen television liquid crystal displays (LCD) and plasma displays. Such sensors may further be used as color temperature sensors in LED room lighting. ALS and RGB sensors may be used to evaluate color temperature which may provide mixing of color temperatures in LED lighting. Proximity and ALS sensors may be used for the deactivation and activation of touch pads due to changes in background lighting e.g. due to the approach of a hand.

A CMOS-compatible spectral filter- photodiode integrated circuit represents a significant simplification of the manufacturing process of future image sensors. Furthermore, the simplified manufacturing process represents a huge cost savings to the manufacturing process. The cost in producing a CMOS-compatible spectral filter integrated with a photodiode is only marginally more than that of the cost of the photodiode itself, compared to an additional cost of more than US$100 per wafer for externally added dielectric stack filters, e.g. approximately 40000 ALS sensors per 8 inch wafer contribute to the high additional cost.

FIG. 1 shows an illustration 100 of an integrated circuit arrangement 102 in accordance with an embodiment. In this embodiment, an integrated circuit arrangement 102, may include a transistor 104 (or a plurality of transistors, in general an arbitrary number of transistors) (each) including a gate region 106; and a wavelength conversion element 108. The wavelength conversion element may include the same material or same materials as the gate region of the transistor.

Figure 2:
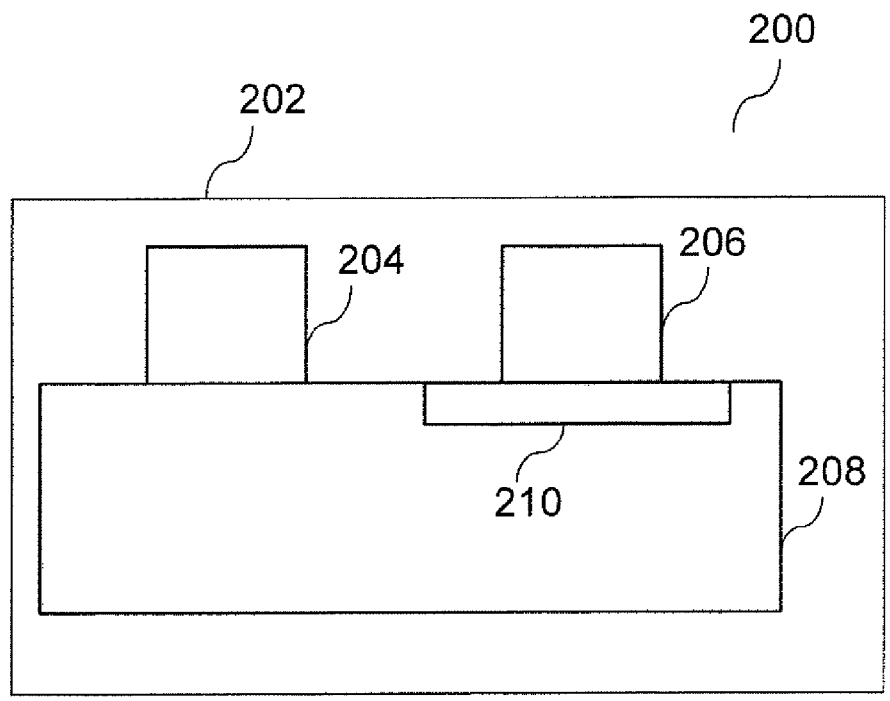
FIG. 2 shows an integrated circuit arrangement in accordance with one embodiment.

FIG. 2 shows an illustration 200 of an integrated circuit arrangement 202 in accordance with an embodiment. In this embodiment, an integrated circuit arrangement 202 may include a transistor including a gate region 204; and a wavelength conversion element 206. The wavelength conversion element 206 may include the same material or same materials as the gate region 204 of the transistor. The material of the gate region 204 and the wavelength conversion element 206 including the same material or same materials as the gate region are formed from the same processing layer above a carrier 208. The material of the gate region 204 of the transistor may include a front end of line (FEOL) material e.g. polysilicon. The material of the gate region 204 of the transistor may include a metal. The carrier 208 may further include a photoconverter 210, e.g. a p-n or pin photodiode, and the wavelength conversion element 206 may be disposed above the photoconverter 210.

Figure 3:
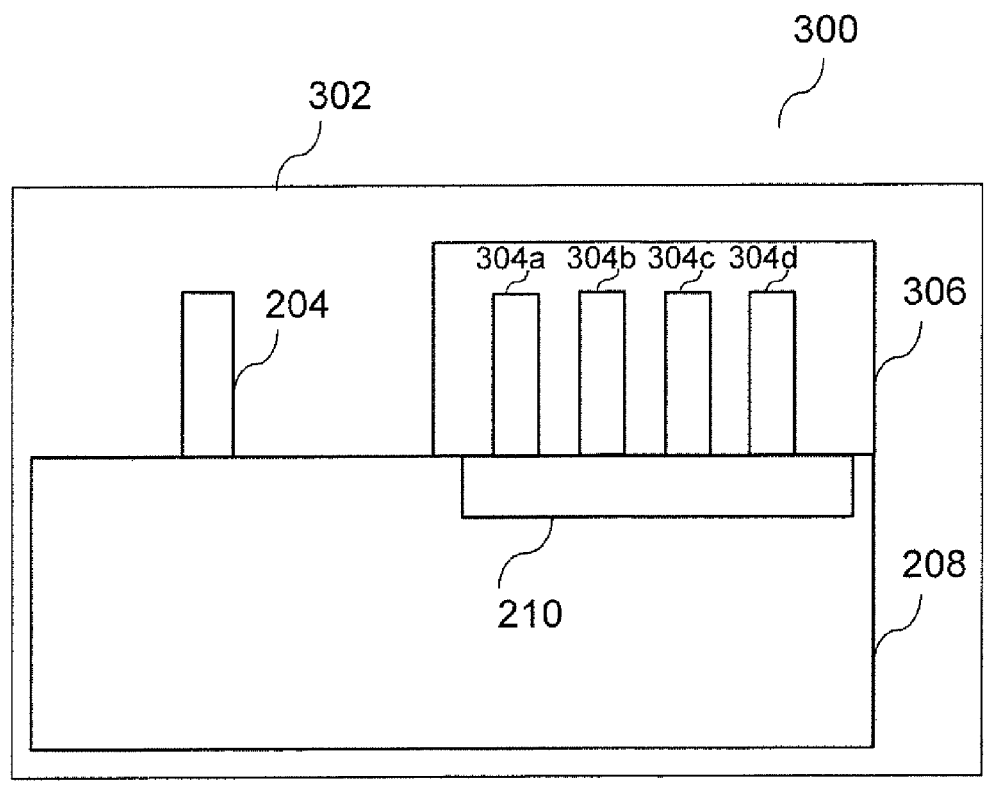
FIG. 3 shows an integrated circuit arrangement in accordance with one embodiment.

FIG. 3 shows an illustration 300 of an integrated circuit arrangement 302 in accordance with an embodiment. In this embodiment, an integrated circuit arrangement 302 may include a transistor including a gate region 204; and a wavelength conversion element 306, 304a-d. The wavelength conversion element 306, 304a-d may include the same material or same materials 304a-d as the gate region 204 of the transistor. The material of the gate region 204 and the wavelength conversion element 306, 304a-d including the same material or same materials 304a-d as the gate region 204, may be formed from the same processing layer above a carrier 208. The material of the gate region 204 of the transistor may include a front end of line (FEOL) material e.g. polysilicon. The material of the gate region 204 of the transistor may include a metal. The carrier 208 may further include a photoconverter 210, e.g. a p-n or pin photodiode, and the wavelength conversion element 306, 304a-d may be disposed above the photoconverter 210. The wavelength conversion element may further include one or more structural elements 304a-d forming an array, and wherein the one or more structural elements forming the array include the same material or same materials 304a-d as the gate region 204. The wavelength conversion element 306, 304a-d may further include an interlayer dielectric layer material 306, and wherein each of the elements 304a-d forming the array is at least partially laterally surrounded by the interlayer dielectric layer material 306.

Figure 4:
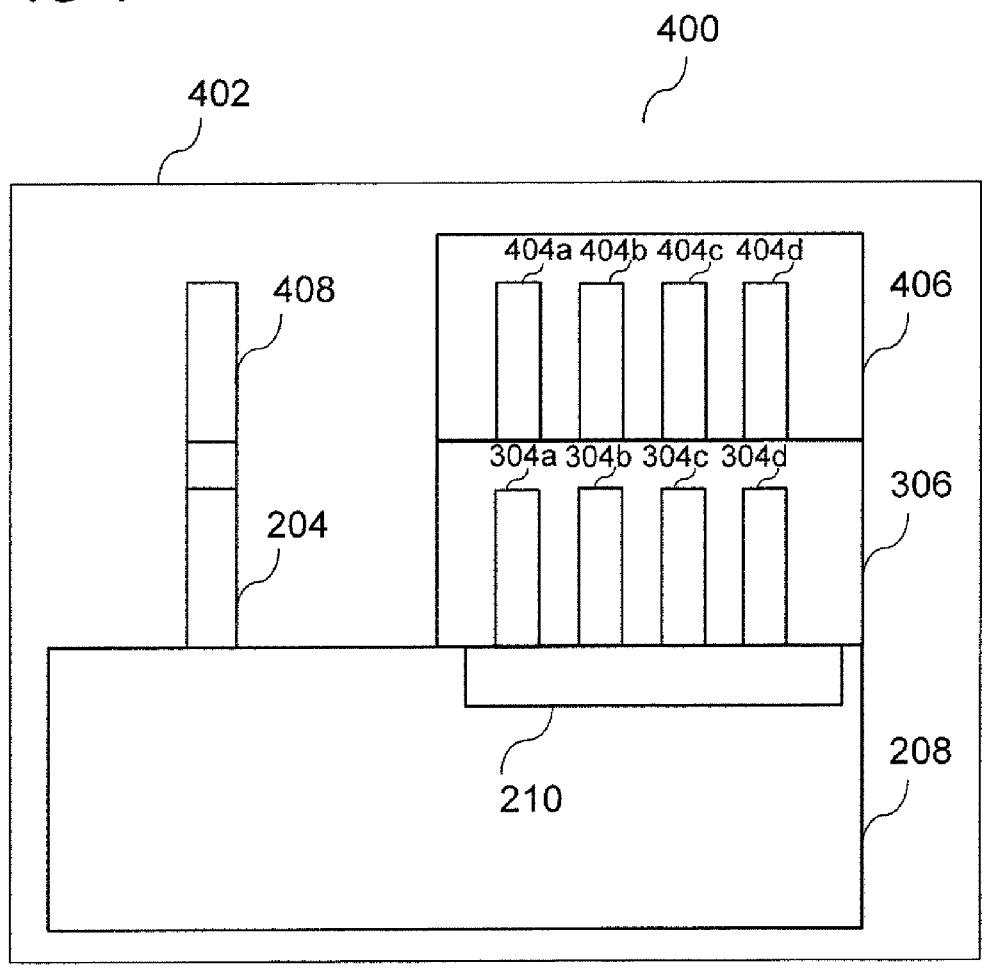
FIG. 4 shows an integrated circuit arrangement in accordance with one embodiment.

FIG. 4 shows an illustration 400 of an integrated circuit arrangement 402 in accordance with an embodiment. In this embodiment, an integrated circuit arrangement 402 may include a transistor including a gate region 204; and a wavelength conversion element 306, 304a-d. The wavelength conversion element 306, 304a-d, may include the same material or same materials 304a-d as the gate region 204 of the transistor. The material of the gate region 204 and the wavelength conversion element 306, 304a-d including the same material or same materials 304a-d as the gate region 204, are formed from the same processing layer above a carrier 208. The material of the gate region 204 of the transistor may include a front end of line (FEOL) material e.g. polysilicon. The material of the gate region 204 of the transistor may include a metal. The carrier 208 may further include a photoconverter 210, e.g. a p-n or pin photodiode, and the wavelength conversion element 306, 304a-d may be disposed above the photoconverter 210. The wavelength conversion element may further include one or more structural elements 304a-d forming an array, and wherein the one or more structural elements forming the array include the same material or same materials 304a-d as the gate region 204. The wavelength conversion element 306, 304a-d may further include an interlayer dielectric layer material 306, and wherein each of the elements 304a-d forming the array is at least partially laterally surrounded by the interlayer dielectric layer material 306. The integrated circuit arrangement 402 may further include a further wavelength conversion element 406, 404a-d; and a further gate region 408 disposed above the gate region 204, wherein the further wavelength conversion element 406, 404a-d may include the same material or same materials 404a-d as the further gate region 408 of the transistor. The gate region 204, the further gate region 408, the wavelength conversion element 306, 304a-d and further wavelength conversion element 406, 404a-d may be formed above a carrier 208, wherein the gate region 204 and the wavelength conversion element 306, 304a-d including the same material or same materials 304a-d as the gate region are formed from the same processing layer above the carrier 208, and wherein the further transistor gate region 408 and the further wavelength conversion element 406, 404a-d including the same material or same materials 404a-d as the further gate region 408 are formed from the same processing layer above the carrier 208. The material of the gate region 204 and the further gate region 408 of the transistor may include a front end of line (FEOL) material, e.g. polysilicon. The material of the gate region 204 and further gate region 408 of the transistor may include a metal.

Figure 5:
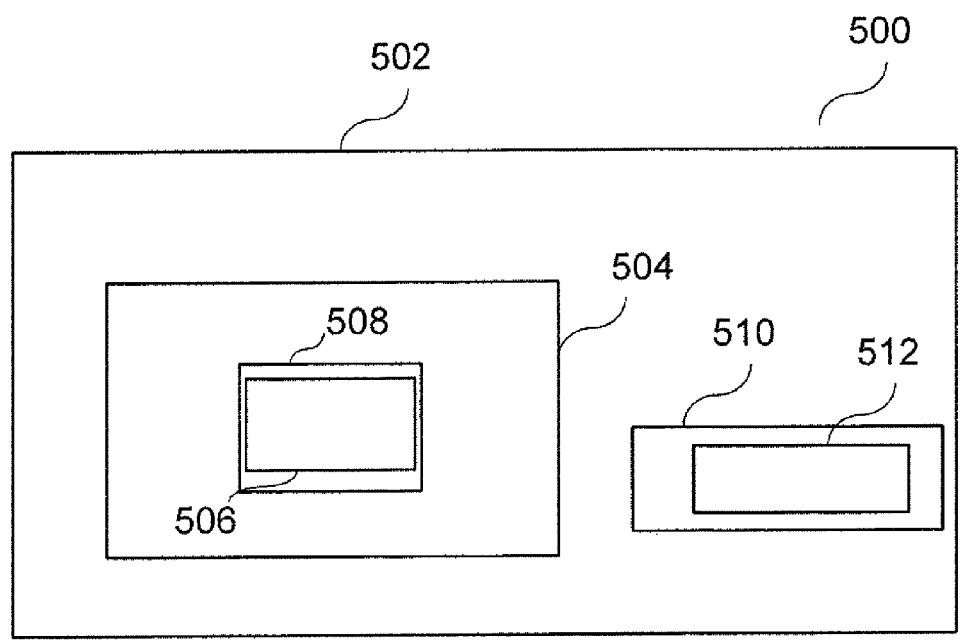
FIG. 5 shows an integrated circuit arrangement in accordance with one embodiment.

FIG. 5 shows an illustration 500 of an integrated circuit arrangement 502, including a transistor 504 including a gate region 506; and a wavelength conversion element 510 wherein the wavelength conversion element 510 may include an interlayer dielectric material 512, and wherein the interlayer dielectric layer material 512 may include the same material or same materials as a region at least partially laterally isolating the gate region 508.

Figure 6A:
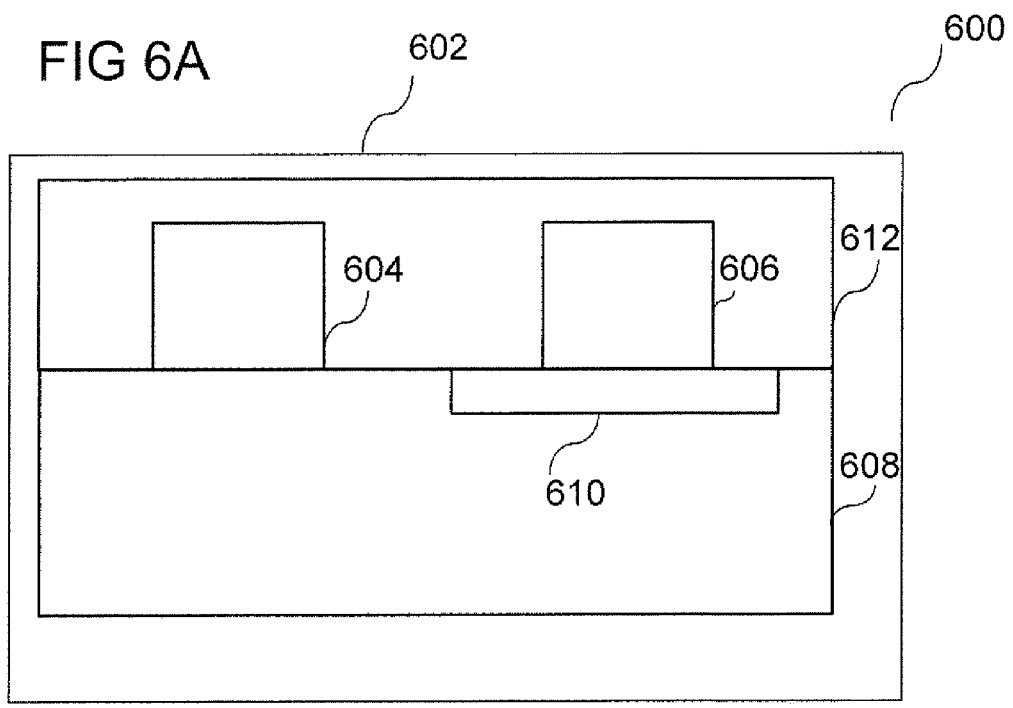
FIGS. 6A and 6B show an integrated circuit arrangement in accordance with one embodiment.

FIG. 6A shows an illustration 600 of an integrated circuit arrangement 602, including a transistor including a gate region 604; and a wavelength conversion element 606, 612, wherein the wavelength conversion element 606, 612 may include an interlayer dielectric material 612, and wherein the interlayer dielectric layer material 612 may include the same material or same materials as a region at least partially laterally isolating the gate region 612. The wavelength conversion element 606, 612 may include the same material or same materials as the gate region 604 of the transistor. The interlayer dielectric layer material 612 and the region at least partially laterally isolating the gate region 612 are formed from the same processing layer above a carrier. The material of the gate region 604 of the transistor may include a front end of line (FEOL) material, e.g. polysilicon. The material of the gate region 604 of the transistor may include a metal. The carrier 608 may further include a photoconverter 610, e.g. a p-n or pin photodiode, and wherein the wavelength conversion element 606 is disposed above the photoconverter 610.

Figure 6B:
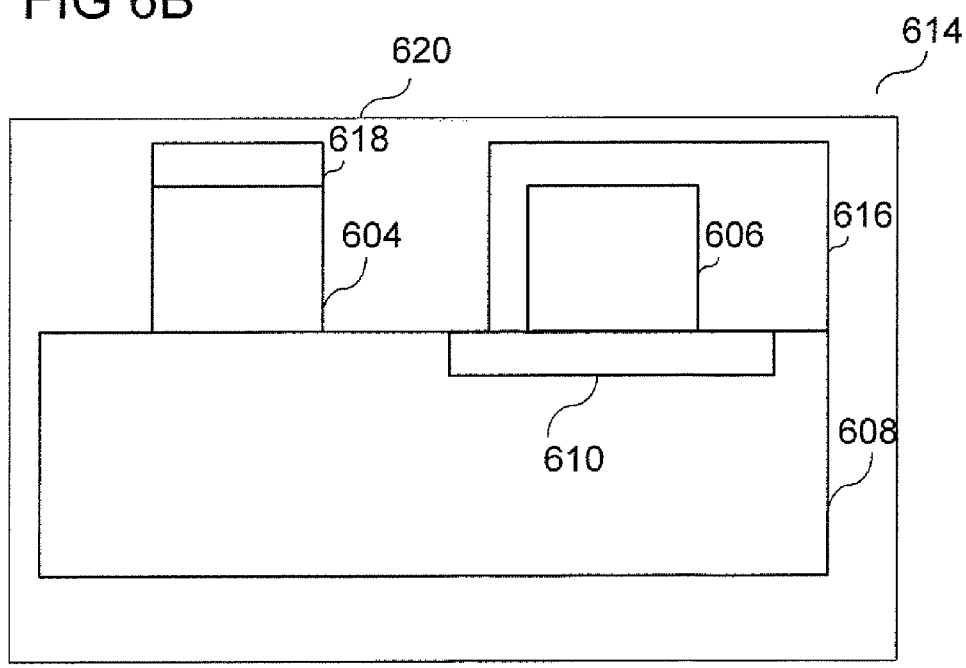

In another embodiment, the region at least partially laterally isolating the gate region 612 may be patterned according to the isolation requirements of the gate region 604. FIG. 6B shows an illustration 614 of the integrated circuit arrangement as described according to FIG. 6A, wherein the interlayer dielectric material 612 may be patterned to form regions 618 and 616. In FIG. 6B, interlayer dielectric layer material 616 may include the same material or same materials as a region at least partially laterally isolating the gate region 618, wherein the interlayer dielectric layer material 616 and the region at least partially laterally isolating the gate region 618 are formed from the same processing layer above a carrier 608.

Figure 7A:
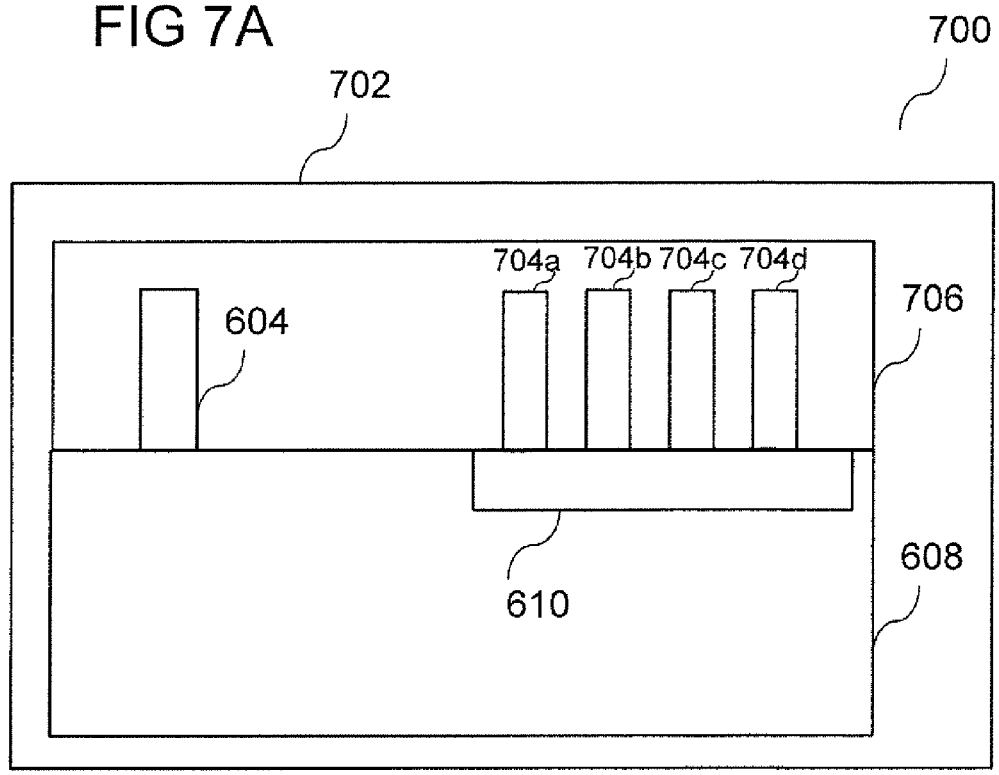
FIGS. 7A and 7B show an integrated circuit arrangement in accordance with one embodiment.

FIG. 7 shows an illustration 700 of an integrated circuit arrangement 702, including a transistor including a gate region 604; and a wavelength conversion element 706, 704a-d wherein the wavelength conversion element 706, 704a-d may include an interlayer dielectric material 706, and wherein the interlayer dielectric layer material 706 may include the same material or same materials as a region at least partially laterally isolating the gate region 706. The wavelength conversion element 706, 704a-d may include the same material or same materials as the gate region 604 of the transistor. The interlayer dielectric layer material 706 and the region at least partially laterally isolating the gate region 706 are formed from the same processing layer above a carrier. The material of the gate region 604 of the transistor may include a front end of line (FEOL) material, e.g. polysilicon. The material of the gate region 604 of the transistor may include a metal. The carrier 608 may further include a photoconverter 610, e.g. a p-n or pin photodiode, and wherein the wavelength conversion element 706, 704a-d is disposed above the photoconverter 610. The wavelength conversion element 706, 704a-d may further include one or more structural elements 704a-d forming an array, wherein the one or more structural elements 704a-d forming the array may include the same material or same materials as the gate region 604.

Figure 7B:
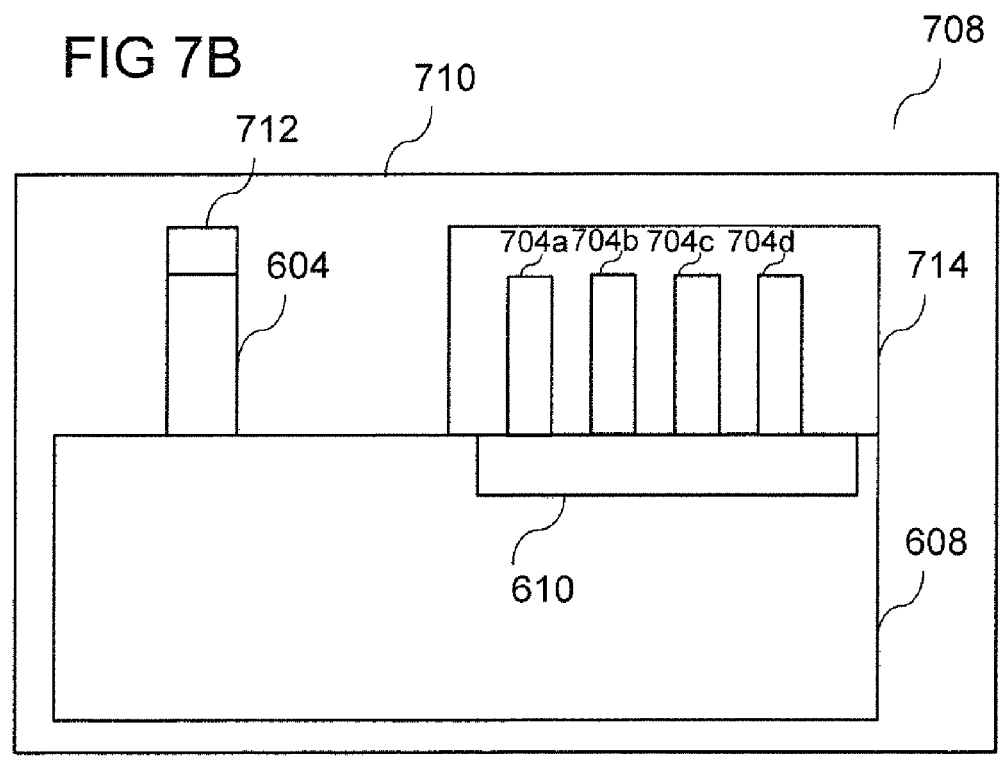

In another embodiment, the region at least partially laterally isolating the gate region 706 may be patterned according to the isolation requirements of the gate region 604. FIG. 7B shows an illustration 708 of the integrated circuit arrangement 710 as described according to FIG. 7A, wherein the interlayer dielectric material 706 may be patterned to form regions 712 and 714. In FIG. 7B the interlayer dielectric layer material 714 may include the same material or same materials as a region at least partially laterally isolating the gate region 712, wherein the interlayer dielectric layer material 714 and the region at least partially laterally isolating the gate region 712 are formed from the same processing layer above a carrier 608.

Figure 8A:
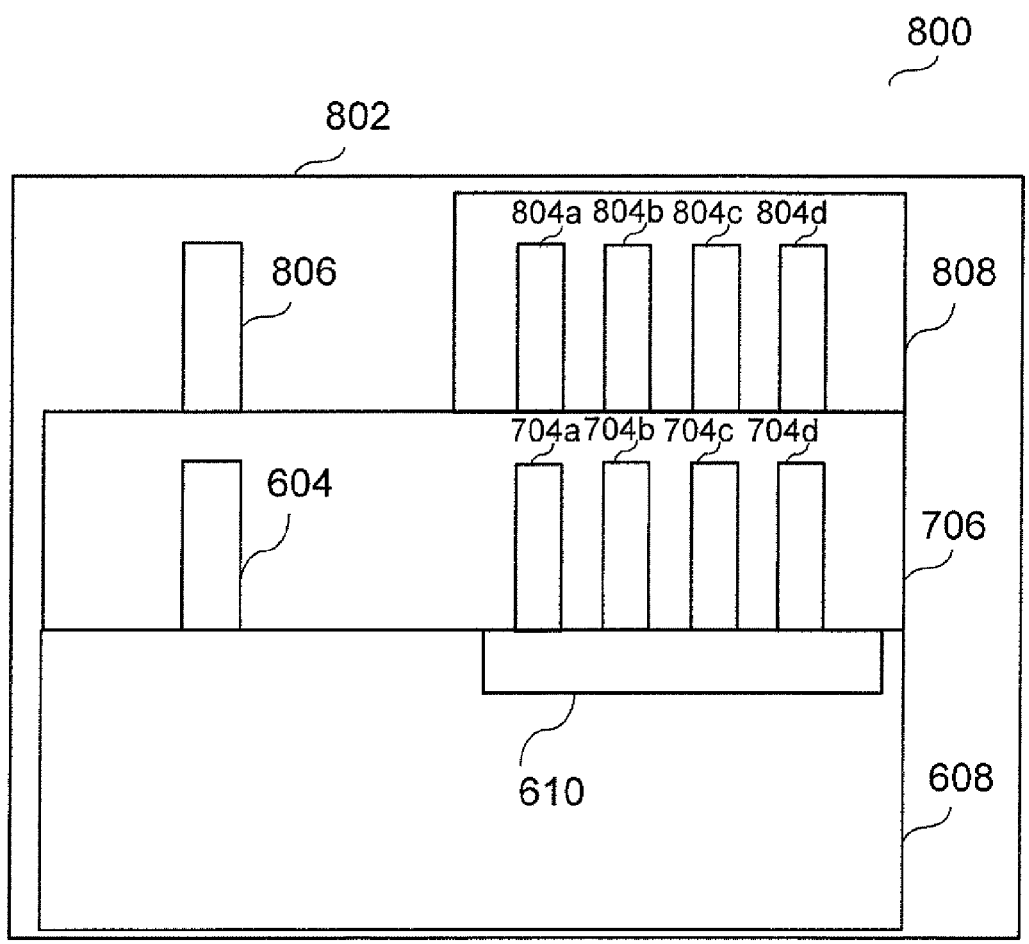

FIG. 8A shows an illustration 800 of an integrated circuit arrangement 802, including a transistor including a gate region 604; and a wavelength conversion element 706, 704a-d wherein the wavelength conversion element 706, 704a-d may include an interlayer dielectric material 706, and wherein the interlayer dielectric layer material 706 may include the same material or same materials 706 as a region at least partially laterally isolating the gate region 706. The wavelength conversion element 706, 704a-d may include the same material or same materials as the gate region 604 of the transistor. The interlayer dielectric layer material 706 and the region at least partially laterally isolating the gate region 706 are formed from the same processing layer above a carrier. The material of the gate region 604 of the transistor may include a front end of line (FEOL) material, e.g. polysilicon. The material of the gate region 604 of the transistor may include a metal. The carrier 608 may further include a photoconverter 610, e.g. a p-n or pin photodiode, and wherein the wavelength conversion element 706, 704a-d is disposed above the photoconverter 610. The integrated circuit arrangement 802 may further include a further wavelength conversion element 808, 804a-d; and a further gate region 806 disposed above the gate region 604 wherein the further wavelength conversion element 808, 804a-d may include a further interlayer dielectric layer material 808. The gate region 604 and further gate region 806 and the wavelength conversion element 706, 704a-d and further wavelength conversion element 808, 804a-d may be formed above a carrier 608, wherein the gate region 604 and the wavelength conversion element including the same material or same materials 704a-d as the gate region are formed from the same processing layer above the carrier, and wherein the further transistor gate region 806 and the further wavelength conversion element including the same material or same materials 804a-d as the further gate region 806 are formed from the same processing layer above the carrier. The material of the gate region 604 and further gate region 806 of the transistor may include a front end of line (FEOL) material, e.g. polysilicon. The material of the gate region 604 and further gate region 806 of the transistor may include a metal. The wavelength conversion element 706, 704a-d may further include one or more structural elements 704a-d forming an array, wherein the one or more structural elements 704a-d forming the array may include the same material or same materials as the gate region 604. The further wavelength conversion element 806, 806a-d may further include one or more structural elements 804a-d forming an array, wherein the one or more structural elements 804a-d forming the array may include the same material or same materials as the further gate region 806.

In another embodiment, the region at least partially laterally isolating the gate region 706 may be patterned according to the isolation requirements of the gate region 604. FIG. 8B shows an illustration 810 of the integrated circuit arrangement as described according to FIG. 8A, wherein the interlayer dielectric material 706 may be patterned to form regions 712 and 714. In FIG. 8B the interlayer dielectric layer material 714 may include the same material or same materials as a region at least partially laterally isolating the gate region 712, wherein the interlayer dielectric layer material 714 and the region at least partially laterally isolating the gate region 712 are formed from the same processing layer above a carrier 608.

In the following description, a method of fabricating an integrated circuit according to one embodiment will be explained. A method for producing an integrated circuit arrangement, including the steps of forming a transistor gate region and forming a wavelength conversion element including the same material or same materials as the gate region of the transistor, during the same processing step, wherein forming a transistor gate region and forming wavelength conversion element including the same material or same materials as the gate region of the transistor may include forming the transistor gate region and the wavelength conversion element including the same material or same materials as the gate region from the same processing layer above a carrier will be explained making references to FIGS. 9A to 9L.

Figure 9A:
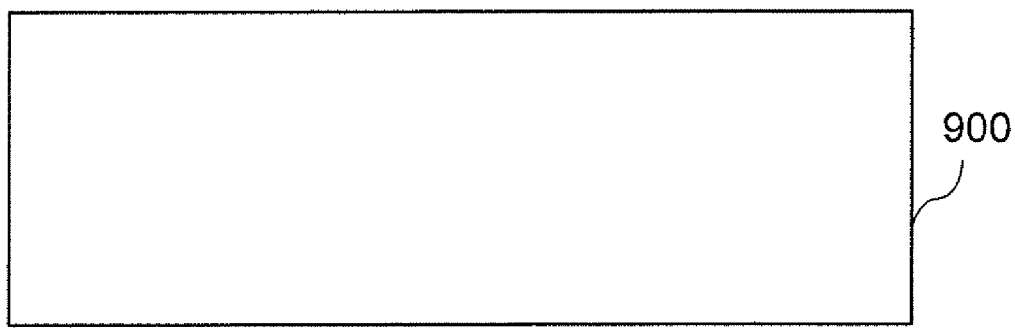

FIG. 9A shows a processing stage 920 of the method in which a carrier 900, e.g. a silicon substrate, may be selected.

Figure 9B:
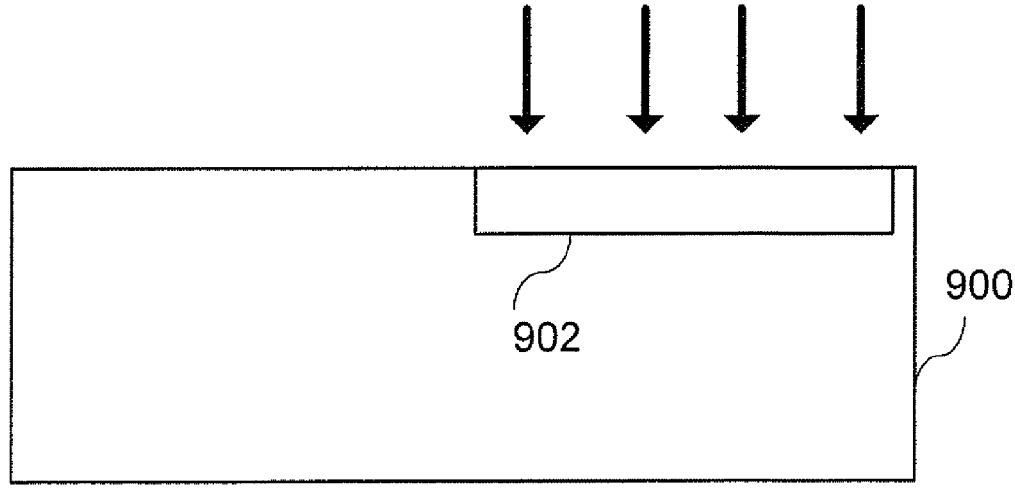

FIG. 9B shows a processing stage 922 of the method in which a photoconverter 902, e.g. a p-n or pin photodiode may be formed within the carrier 900. The photoconverter 902 may be formed within the carrier 900 using ion implantation. The forming of the photoconverter may take place in parallel with CMOS implantation of other electronic components within the integrated circuit, e.g. during implantation of source/drain regions/pocket implants/well implants of a transistor.

Figure 9C:
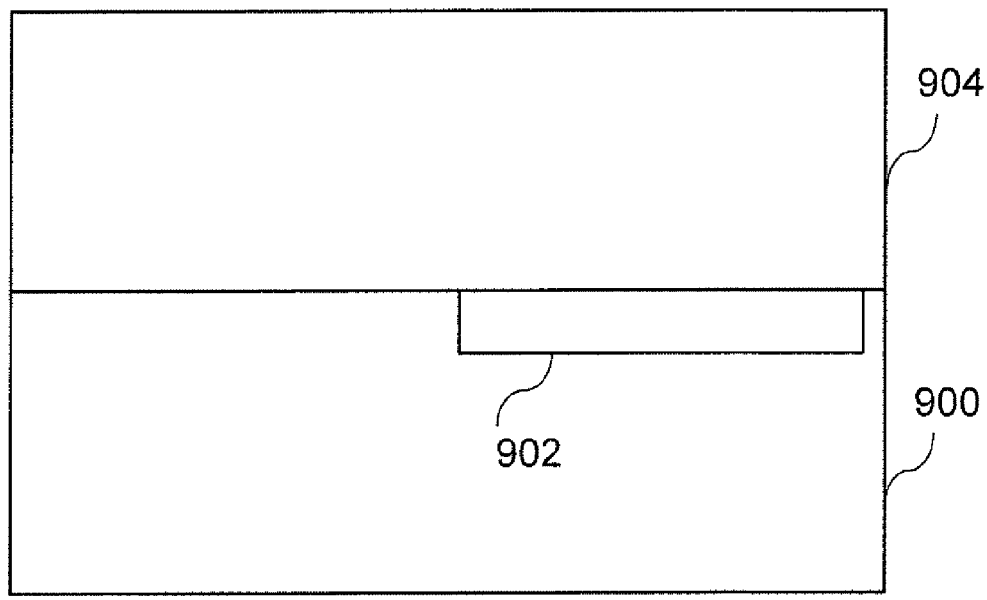

FIG. 9C shows a processing stage 924 of the method in which photolithography may be carried out to pattern a gate region of a transistor and a wavelength conversion element. A photoresist layer 904 may be formed over the carrier 900.

Figure 9D:
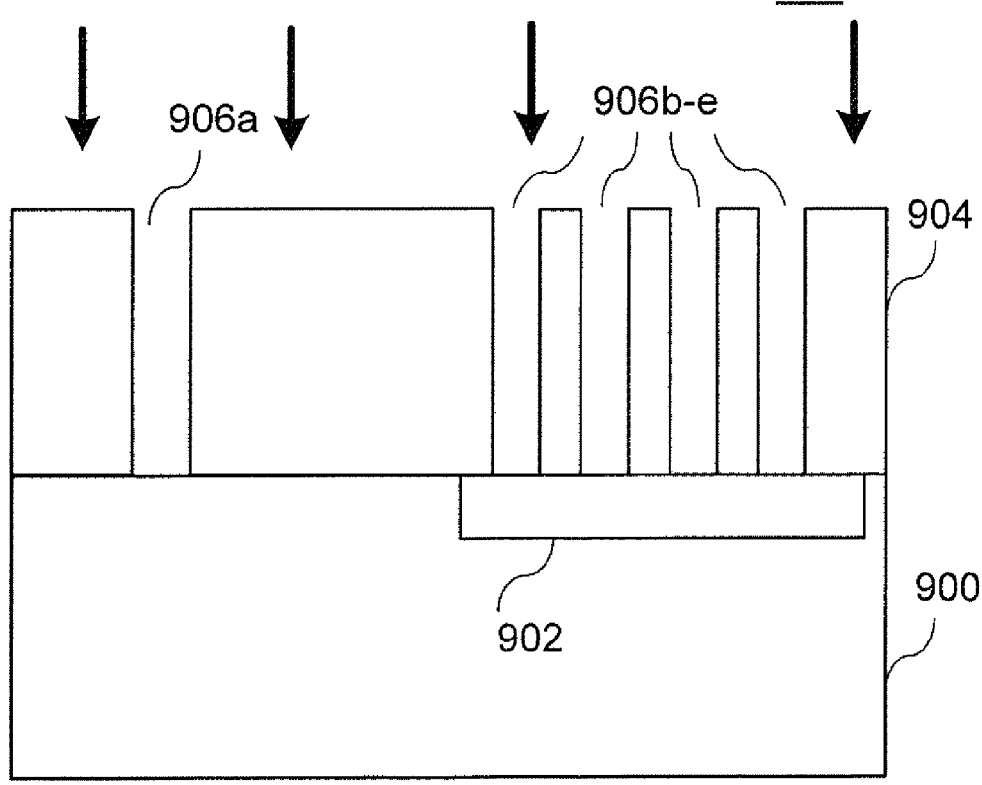

FIG. 9D shows a processing stage 926 of the method in which the photoresist 904 may be patterned to form a transistor gate region 906a and a wavelength conversion element region 906b-e. The photoresist may be patterned such that the wavelength conversion element is disposed above the photoconverter 902. The photoresist 904 may be patterned such that the wavelength conversion element includes one or more structural elements forming an array. Various embodiments illustrating possible patternable arrays/configurations of the wavelength conversion element will be described in further figures.

FIG. 9E shows a processing stage 928 of the method in which the gate region 908 of the transistor and the wavelength conversion element 910a-910d are formed of the same material or same materials in the same processing step, such that wavelength conversion element 910a-d having the same material or same materials as the gate region 908, are formed from the same processing layer as the gate region above a carrier 900. The transistor gate region 908 and wavelength conversion element 910a-910d may be formed using standard deposition techniques, e.g. sputtering, evaporation and chemical vapor deposition.

FIG. 9F shows a processing stage 930 of the method in which the photoresist may be removed, leaving the remaining gate region 908 and wavelength conversion element 910a-d disposed on the carrier 900.

Figure 9G:
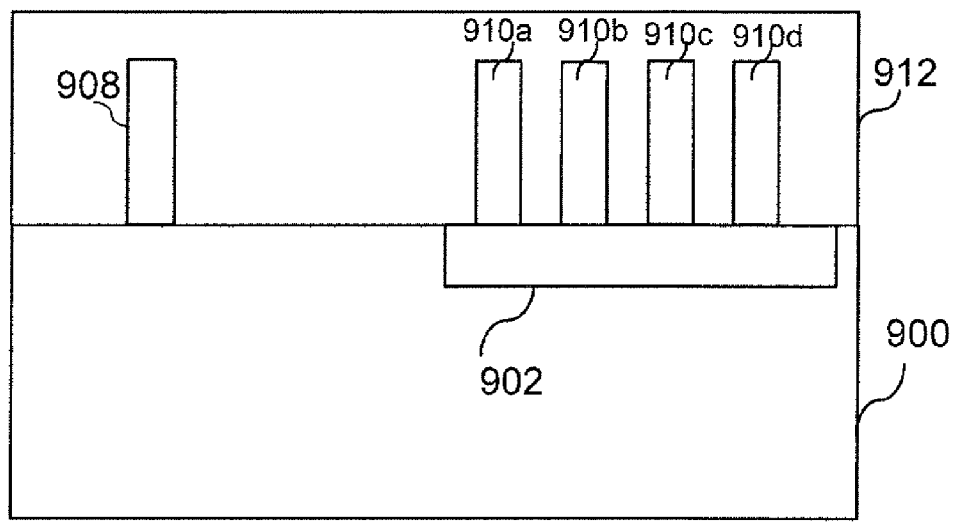

FIG. 9G shows a processing stage 932 of the method in which an interlayer dielectric layer material 912 may be formed such that each of the elements 9a-d forming the array is at least partially laterally surrounded by the interlayer dielectric layer material 912, and wherein the interlayer dielectric layer material includes the same material or same materials as a region at least partially laterally isolating the gate region 908.

Figure 9H:
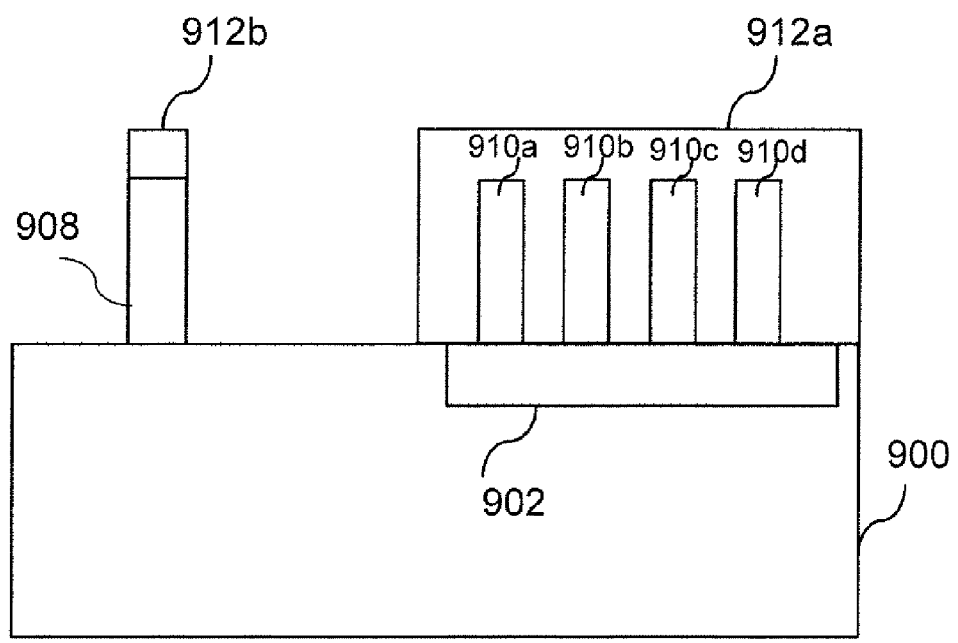

FIG. 9H shows a processing stage 934 of the method in which the region at least partially laterally isolating the gate region may be further patterned according to the isolation requirements of the gate region 908. The interlayer dielectric material may be patterned to form regions 912a and 912b. The interlayer dielectric layer material 912a may include the same material or same materials as a region at least partially laterally isolating the gate region 912b, wherein the interlayer dielectric layer material 912a and the region at least partially laterally isolating the gate region 912b are formed from the same processing layer above a carrier 900.

FIGS. 9I and 9J shows a processing stage 936 of the method in which a further wavelength conversion element 914a-d may be formed, and a further gate region 916 may be disposed above the gate region 908. Steps in accordance with processing stages 924 to 928 may be carried out to pattern a further gate region 916 of a transistor and a further wavelength conversion element 914a-d. Photolithography may be carried out to pattern a further gate region 916 of a transistor and a further wavelength conversion element 914a-d. A photoresist layer may be disposed above the interlayer dielectric layer 912 and the region at least partially laterally isolating the gate region 912, the wavelength conversion element 910a-d and the gate region 908. The photoresist may be patterned to form a further gate region 916 of the transistor and a further wavelength conversion element 914a-d. The photoresist may be patterned such that the further wavelength conversion element 914a-d is disposed above the wavelength conversion element 910a-d and the photoconverter 902. The photoresist may be patterned such that the further wavelength conversion element includes one or more structural elements 914a-d forming an array. A material may be deposited such that the further gate region 916 of the transistor and the further wavelength conversion element 914a-d are formed of the same material or same materials in the same processing step, such that further wavelength conversion element 914a-d may include the same material or same materials as the further gate region 916 and is formed from the same processing layer as the further gate region 916 above a carrier 900. The photoresist may be removed, leaving the remaining further gate region 916 and further wavelength conversion element 914a-d disposed above an interdielectric layer 912. The further gate region 916 may be disposed above the gate region 908. The further wavelength conversion element 914a-d may be disposed above the wavelength conversion element 910a-d. The gate region 908, the further gate region 916, the wavelength conversion element 910a-d and further wavelength conversion element 914a-d are formed above a carrier 900. The gate region 908 and the wavelength conversion element 910a-d including the same material or same materials as the gate region may be formed from the same processing layer above the carrier 900. The further transistor gate region 916 and the further wavelength conversion element 914a-d including the same material or same materials as the further gate region may be formed from the same processing layer above the carrier 900. The material forming the gate region 908 and the further gate region 916 of the transistor may include a front end of line (FEOL) material, e.g. polysilicon. The material forming the gate region and further gate region of the transistor may include a metal.

Figure 9K:
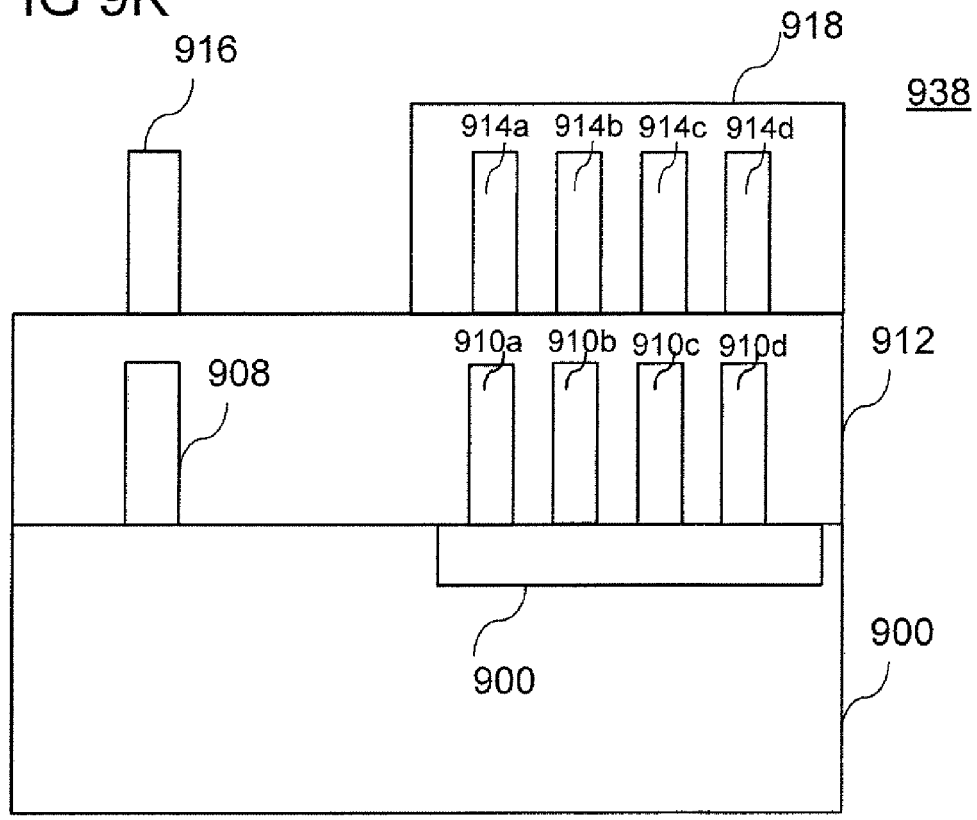
Figure 9L:
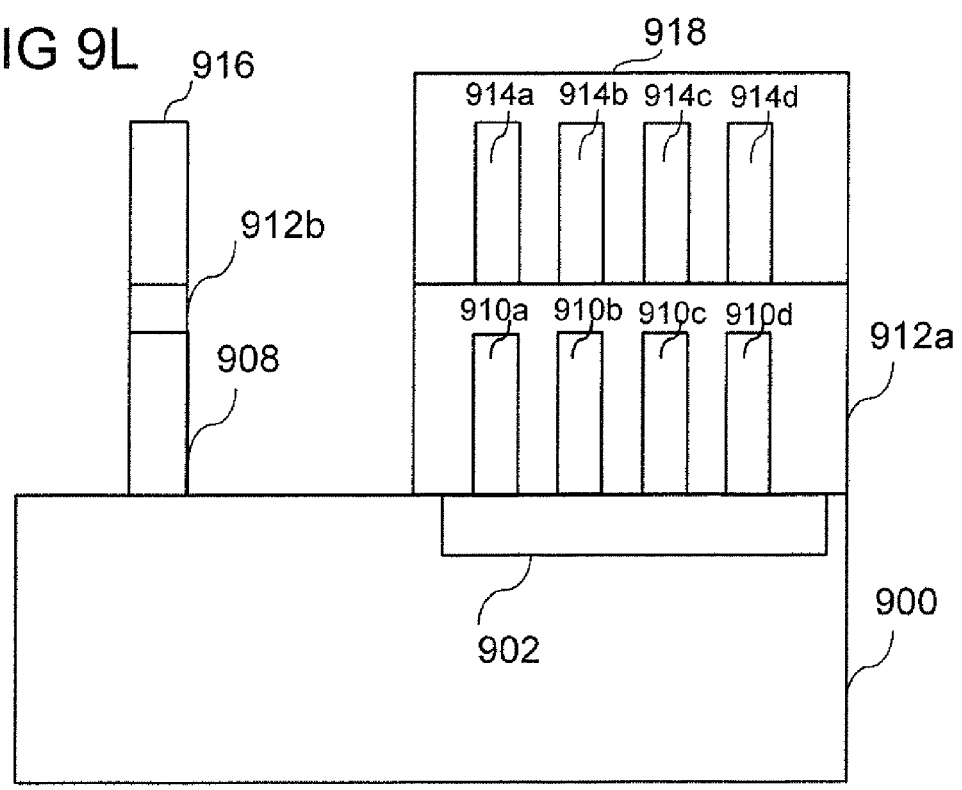

FIGS. 9K and 9L shows a processing stage 938 of the method in which a further interlayer dielectric layer material 918 may be formed such that each of the elements 914a-d forming the array is at least partially laterally surrounded by a further interlayer dielectric layer material 918.

In an alternative embodiment, the processing stages 924 to 928 may be carried out such that the choice of material deposition of the gate material and the interlayer dielectric layer material may be reversed. Therefore, an interlayer dielectric layer material may be deposited to form the structural elements forming the array, wherein each of the elements forming the array may be at least partially laterally surrounded by the same material or same materials as the gate region of the transistor. The material of the gate region and the material at least partially laterally surrounding each of the elements forming the array may include the same material or same materials. The material of the gate region and the material at least partially laterally surrounding each of the elements forming the array may be formed from the same processing layer above a carrier.

In an alternative embodiment, an integrated circuit arrangement may include a transistor including a gate region, and wavelength conversion element, wherein the wavelength conversion element includes the same material or same materials as a region at least partially laterally isolating the gate region. In various embodiments, the region at least partially laterally isolating the gate region may be an interlayer dielectric material. In various embodiments, the region at least partially laterally isolating the gate region (the interlayer dielectric layer) and the wavelength conversion element having the same material or same materials as a region at least partially laterally isolating the gate region may be formed from the same processing layer above a carrier.

Figure 10:
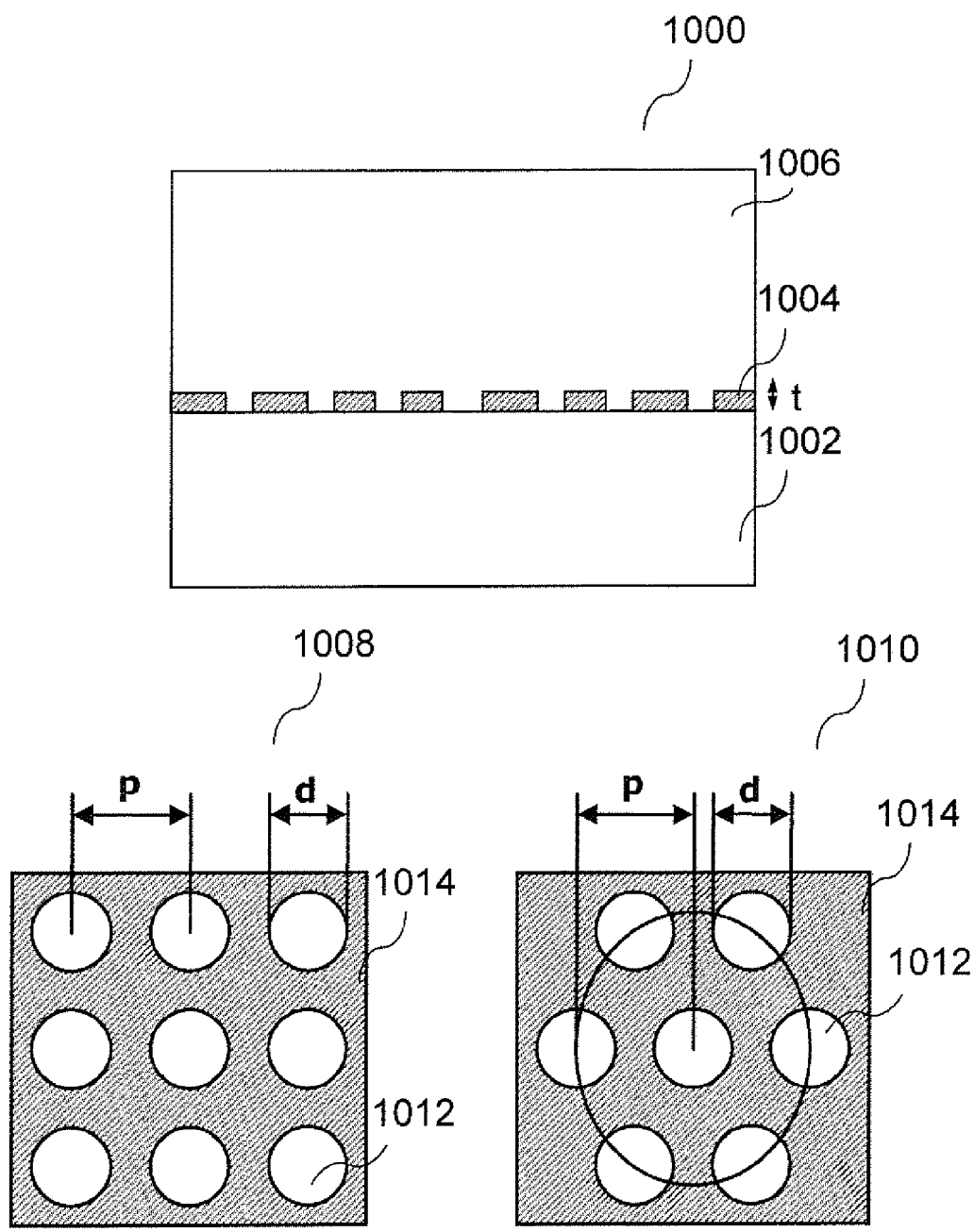
FIG. 10 shows a wavelength conversion element in accordance with one embodiment.

FIG. 10 shows an illustration of a cross sectional view 1000 and top view 1008, 1010 of a wavelength conversion element according to an embodiment. In this embodiment, an interlayer dielectric layer material may be chosen to be deposited to form the structural elements forming the array. The wavelength conversion element may be formed according to a wide choice of lattices, by which structural elements forming an array of the wavelength conversion element may be formed. A wavelength conversion element including a quadratic lattice and a hexagonal lattice are shown in illustrations 1008 and 1010 respectively. The lattice may have a pitch, p, and the structural elements may have a diameter, d.

An embodiment according to 1000 shows a wavelength conversion element including a polysilicon grating partially laterally surrounded by air according to an embodiment. The material forming the structural elements 1004 of the grating of the wavelength conversion element may be a front end of line (FEOL) material e.g. polysilicon, the structural elements forming an array partially laterally surrounded by air 1006. The wavelength conversion element may be formed on a substrate 1002. The lattice may have a pitch, p, e.g. p=220 nm, and the structural elements may have a diameter, d, e.g. d=180 nm. The structural elements 1004 of the grating of the wavelength conversion element may have a thickness, t, e.g. t=160 nm. The wavelength conversion element may behave as a spectral filter for light (of wavelengths between 300 nm to 800 nm) entering the wavelength conversion element. The material selection may also be reversed as shown in illustrations 1008 and 1010 respectively wherein the material forming the structural elements 1012 may be an interlayer dielectric material, e.g. air and the material at least partially surrounding the structural elements 1014 may be a front end of line (FEOL) material e.g. polysilicon.

FIG. 11 shows an illustration of a cross sectional view 1100 and top view 1108, 1110 of a wavelength conversion element according to an embodiment. An embodiment according to 1100 shows a wavelength conversion element including a polysilicon grating partially laterally surrounded by silicon dioxide ($SiO_2$) according to an embodiment. The material forming the structural elements 1104 of the grating of the wavelength conversion element may be a front end of line (FEOL) material e.g. polysilicon, the structural elements forming an array partially laterally surrounded by silicon dioxide (SiO$_2$) 1106. The wavelength conversion element may include a quadratic lattice and a hexagonal lattice which are shown in illustrations 1108 and 1110 respectively. The material selection may also be reversed wherein the material forming the structural elements 1112 may be an interlayer dielectric material, e.g. SiO$_2$ and the material at least partially surrounding the structural elements 1114 may be a front end of line (FEOL) material 1114 e.g. polysilicon.

The wavelength conversion element may be formed on a substrate 1102. The lattice may have a pitch, p, e.g. p=220 nm, and the structural elements may have a diameter, d, e.g. d=180 nm. The structural elements 1104 of the grating of the wavelength conversion element may have a thickness, t, e.g. t=160 nm. The wavelength conversion element may behave as a spectral filter for light (of wavelengths between 300 nm to 800 nm) entering the wavelength conversion element.

Figure 12:
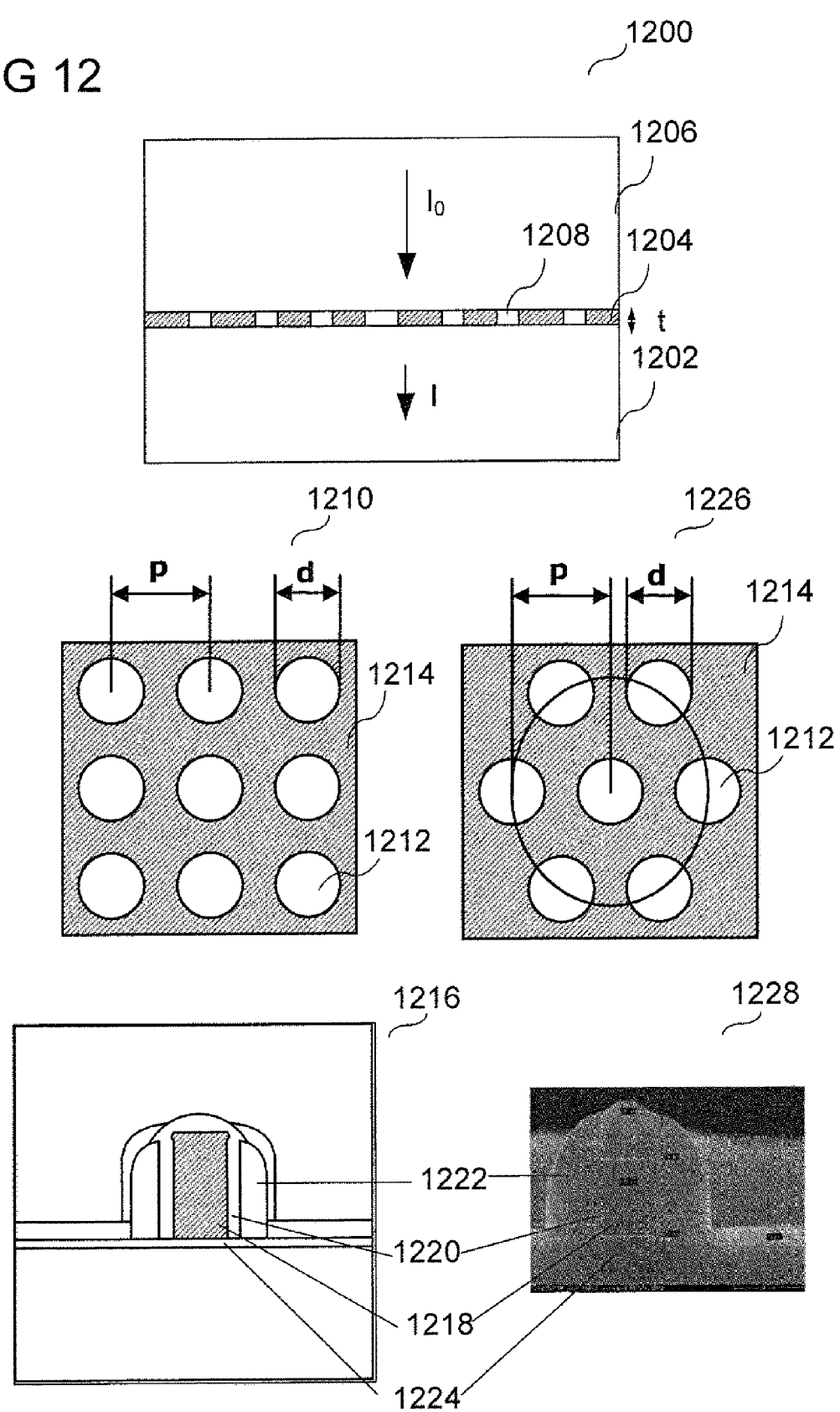
FIG. 12 shows a wavelength conversion element in accordance with one embodiment.

FIG. 12 shows an illustration of a cross sectional view 1200 and top view 1210, 1226 of a wavelength conversion element according to an embodiment. An embodiment according to 1200 shows a wavelength conversion element including a polysilicon grating partially laterally surrounded by silicon nitride (SiN) and partially laterally surrounded by silicon dioxide (SiO$_2$) according to an embodiment. The material forming the structural elements 1204 of the grating of the wavelength conversion element may be a front end of line (FEOL) material e.g. polysilicon, the structural elements forming an array partially laterally surrounded by silicon nitride (SiN) 1208 and partially laterally surrounded by silicon dioxide (SiO$_2$) 1206. The wavelength conversion element may include a quadratic lattice and a hexagonal lattice which are shown in illustrations 1210 and 1226 respectively. The material selection may also be reversed wherein the material forming the structural elements 1212 may be silicon nitride (SiN), and the material at least partially surrounding the structural elements 1214 may be a front end of line (FEOL) material e.g. polysilicon, wherein the structural elements 1212 and material 1214 and partially laterally surrounded by silicon dioxide (SiO$_2$). The wavelength conversion element may be formed on a substrate 1202. The lattice may have a pitch, p, e.g. p=220 nm, and the structural elements may have a diameter, d, e.g. d=180 nm. The structural elements 1204 of the grating of the wavelength conversion element may have a thickness, t, e.g. t=160 nm. The wavelength conversion element may behave as a spectral filter for light (of wavelengths between 300 nm to 800 nm) entering the wavelength conversion element.

An embodiment according to 1216 shows a cross-sectional view of a CMOS transistor. The CMOS transistor may include a CoSi blocking layer. The CMOS transistor may include a gate region 1218 wherein the gate region 1218 of the transistor may include a gate region material e.g. polysilicon. The gate 1218 of the CMOS transistor is surrounded at least partially by an interlayer dielectric layer material 1220, e.g. SiO$_2$ spacer, which at least partially laterally isolates the gate region. The polysilicon gate 1218 of the CMOS transistor may be surrounded at least partially by nitride spacer material 1222, e.g. SiN. The gate region 1218 may be formed over a gate oxide layer 1224. The SiN spacer 1222 may have a thickness, e.g. 60 nm. The SiO$_2$ spacer 1220 may have a thickness, e.g. 15 nm. The gate region 1218 may have a width, e.g. 80 nm, the gate oxide layer, e.g. an SiO$_2$ gate oxide layer 1224 may have a thickness, e.g. 5 nm. An embodiment according to 1228 shows an SEM image of a CMOS transistor according to an embodiment. The wavelength conversion element according to the embodiments of 1200, 1210, 1226, may include the same material or same materials as the gate region 1218 of the transistor.

FIG. 13 shows an illustration of a cross sectional view 1300 and top view 1308, 1310 of a wavelength conversion element according to an embodiment. An embodiment according to 1300 shows a wavelength conversion element created from patterning of a crystalline silicon substrate 1302 by shallow trench isolation (STI) etching. Structural elements of the crystalline silicon grating 1304 are at least partially laterally surrounded by an interlayer dielectric layer 1306, e.g. silicon dioxide (SiO$_2$) according to an embodiment. The material forming the structural elements 1304 of the grating of the wavelength conversion element may be STI etched crystalline silicon, the structural elements at least partially surrounded by an interlayer dielectric material 1206, e.g. silicon dioxide (SiO$_2$). The wavelength conversion element may be formed on a substrate 1302. The lattice may have a pitch, p, e.g. p=220 nm, and the structural elements may have a diameter, d, e.g. d=180 nm. The structural elements 1004 of the grating of the wavelength conversion element may have a thickness, t, e.g. t=400 nm. The wavelength conversion element may behave as a spectral filter for light (of wavelengths between 300 nm to 800 nm) entering the wavelength conversion element. The wavelength conversion element may include a quadratic lattice and a hexagonal lattice which are shown in illustrations 1308 and 1310 respectively. The material selection may also be reversed wherein the material forming the structural elements 1312 may be an interlayer dielectric material, e.g. SiO$_2$ and the material at least partially surrounding the structural elements 1314 may be crystalline silicon.

Figure 14:
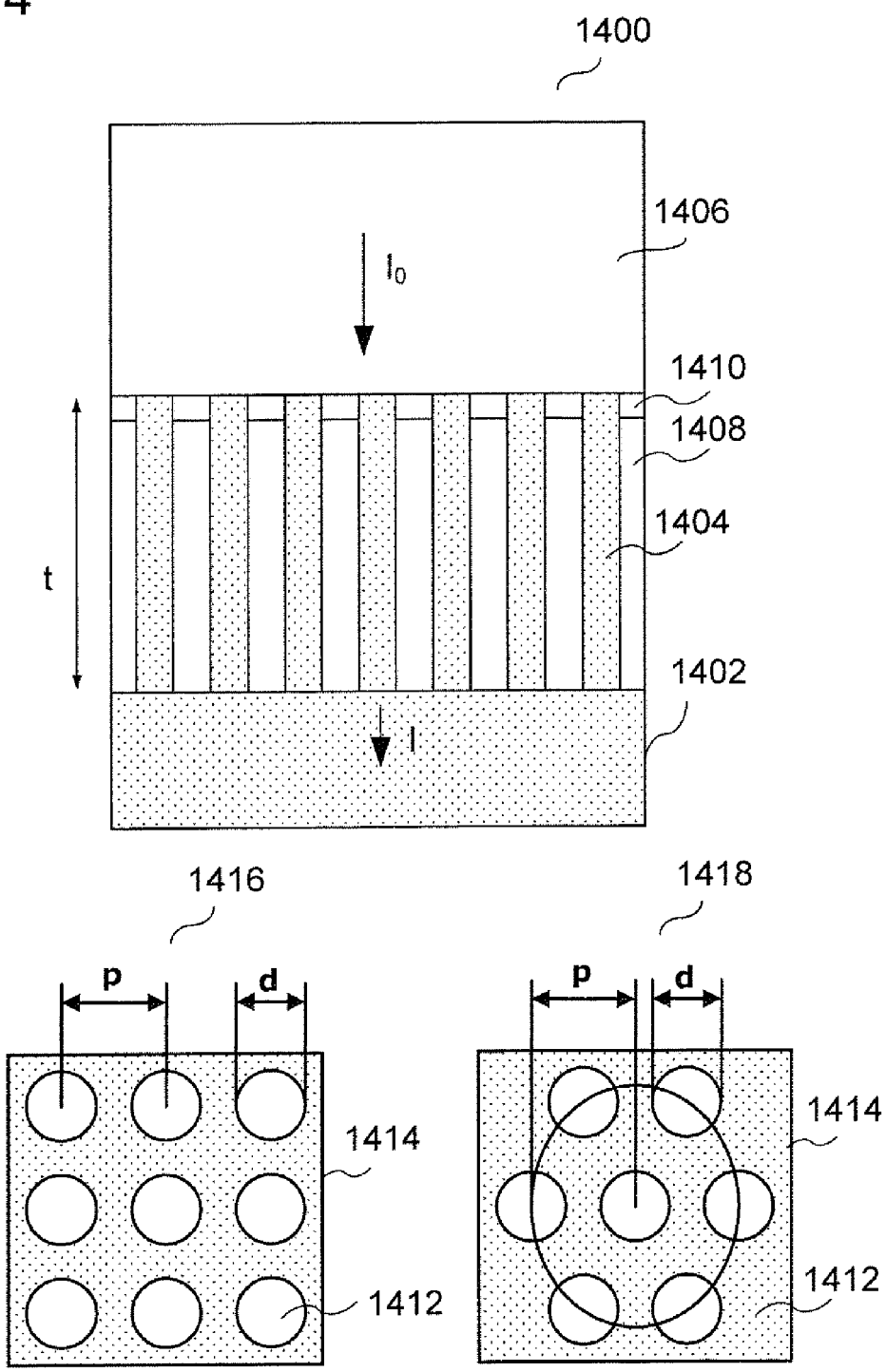
FIG. 14 shows a wavelength conversion element in accordance with one embodiment.

FIG. 14 shows an illustration of a cross sectional view 1400 and top view 1416, 1418 of a wavelength conversion element according to an embodiment. An embodiment according to 1400 shows a wavelength conversion element created from patterning of a crystalline silicon substrate 1402 by deep isolation (DT) etching. Structural elements of the crystalline silicon grating 1404 are at least partially laterally surrounded by an interlayer dielectric layer material 1406, 1410, e.g. silicon dioxide (SiO$_2$) and air 1408 according to an embodiment. The material forming the structural elements 1404 of the grating of the wavelength conversion element may include DT etched crystalline silicon, the structural elements at least partially surrounded by an interlayer dielectric material 1406, 1410, e.g. silicon dioxide (SiO$_2$). The wavelength conversion element may be formed on a substrate 1402. The lattice may have a pitch, p, e.g. p=220 nm, and the structural elements may have a diameter, d, e.g. d=140 nm. The structural elements 1004 of the grating of the wavelength conversion element may have a thickness, t, e.g. t=5 μm up to 10 μm. The wavelength conversion element may behave as a spectral filter for light (of wavelengths between 300 nm to 800 nm) entering the wavelength conversion element. The wavelength conversion element may include a quadratic lattice and a hexagonal lattice which are shown in illustrations 1416 and 1418 respectively. The material selection may also be reversed wherein the material forming the structural elements 1412 may be an interlayer dielectric material, e.g. SiO$_2$ and the material at least partially surrounding the structural elements 1414 may be crystalline silicon.

Figure 15A:
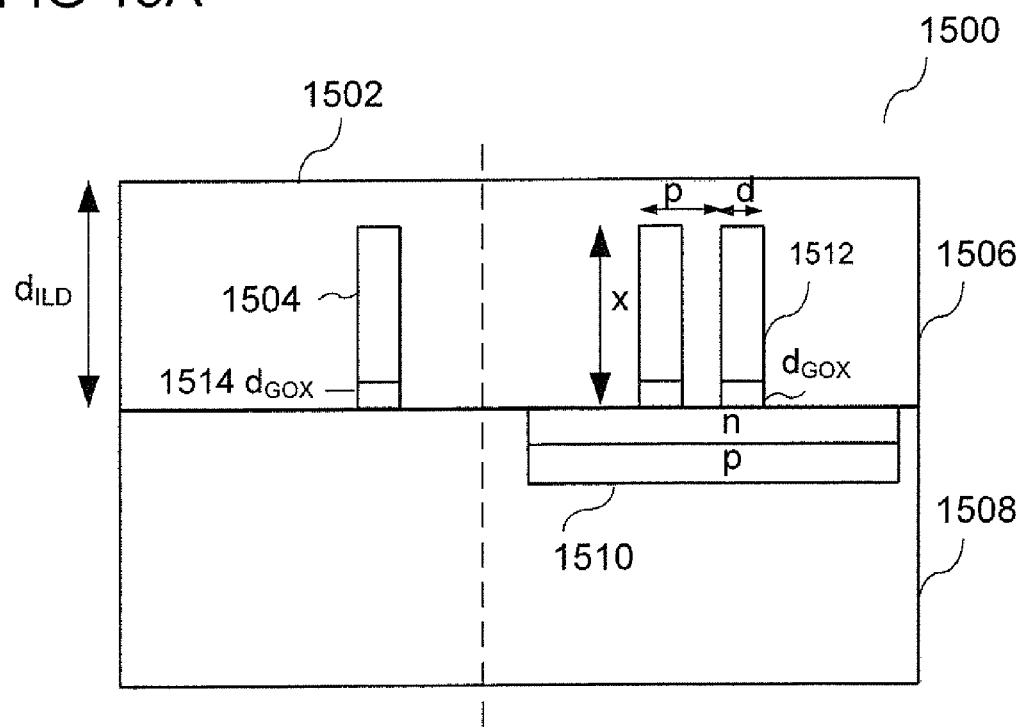
FIGS. 15A and 15B show a standard CMOS gate integrated with a photodiode with spectral filter in accordance with one embodiment.
Figure 15B:
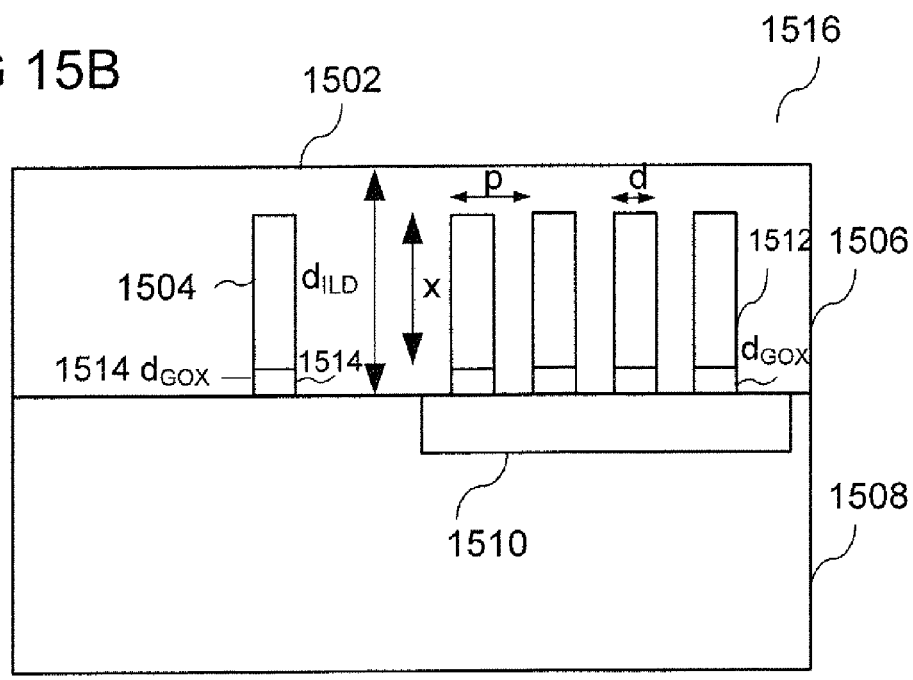

FIGS. 15A and 15B show illustrations 1500, 1516 of annotated integration schemes of a standard CMOS gate integrated with an integrated photodiode with spectral filter. In general, a high refractive index contrast $n_{Gate}/n_{ILD}$ between the refractive index of the gate 1504 and the interlayer dielectric layer 1506 with low extinction is desirable. The depth, x, of structural elements of the wavelength conversion element 1512 and the gate region 1504, which may include polysilicon, may be in the range from about 50 nm to about 250 nm, e.g in the range from about 75 nm to about 200 nm, e.g. in the range from about 100 nm to about 150 nm. The structural elements of the wavelength conversion element, 1512 and the gate region 1504 may be formed over a gate oxide layer, the thickness of the gate oxide layer may be in the range from about 0 nm to about 10 nm, e.g. from about 2 nm to about 8 nm, e.g. from about 4 nm to about 6 nm. The structural elements of the wavelength conversion elements may form an array with a pitch, p. The pitch, p, may range between ⅙ to ½ times the wavelength of interest. Each structural element may have a width, d. The width, d, may range from about 0.2 to about 1 times the value of p. The values of p and d would both depend strongly on the material and lattice type of the wavelength conversion element. No restrictions are placed on the thickness of the interlayer dielectric layer $d_{ILD}$, however typical values may be in the range from about 500 nm to about 2 μm e.g. in the range from about 750 nm to about 1 μm, e.g. in the range from about 750 nm to about 850 nm. A photoconverter 1510, such as a p-n or pin photodiode is shown. The photodiode may be defined by implants in parallel with CMOS implants. Furthermore, a wide choice of lattices are possible, such as quadratic and hexagonal lattices as previously shown, interlayer dielectric holes in a gate matrix, or inversed, round or square holes. The choice of which lattices are suitable will largely depend on manufacturability. The spectral sensitivity of the photoconverter/photodiode may be controlled to some extent by the implants, e.g. as with the FoveonX3 image sensor. The substrate 1508 may be crystalline silicon. The interlayer dielectric layer 1506 may be $SiO_2$, SiN or a low-k material. The material of the gate region 1504 may be polysilicon or a metal. The gate region 1504 and the structural elements of the wavelength conversion element 1512 may be disposed above a gate oxide layer. The gate oxide 1514 may be $SiO_2$ or a high-k dielectric material (a high-k dielectric material may be understood as a material having a greater dielectric constant than the dielectric constant of silicon dioxide, e.g. a dielectric constant greater than 3.9). A CoSi blocking layer (not shown) may be disposed above the gate region 1504.

Figure 16A:
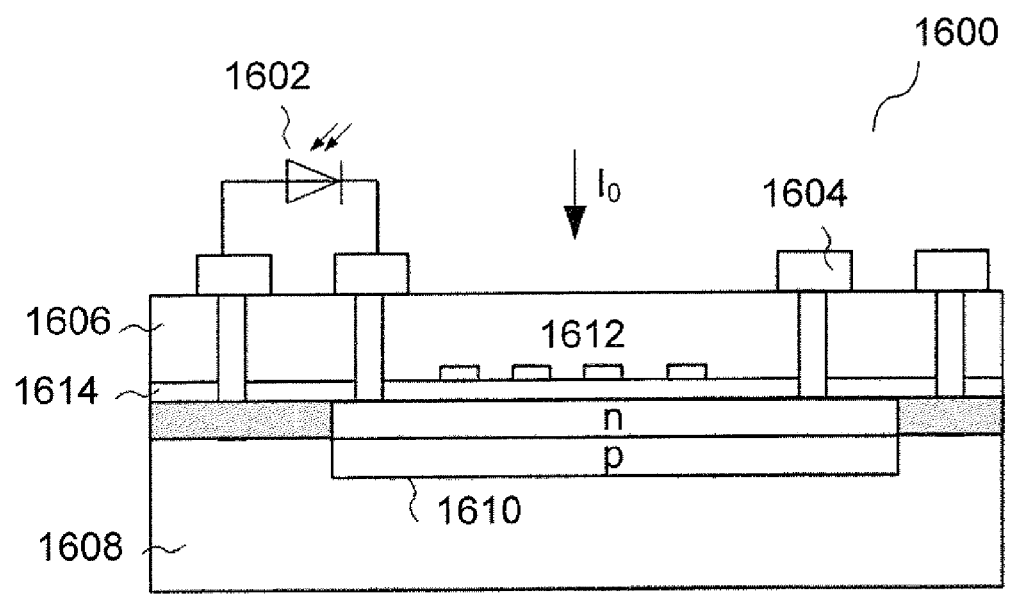
FIGS. 16A and 16B show an integrated photodiode with spectral filter in accordance with one embodiment.
Figure 16B:
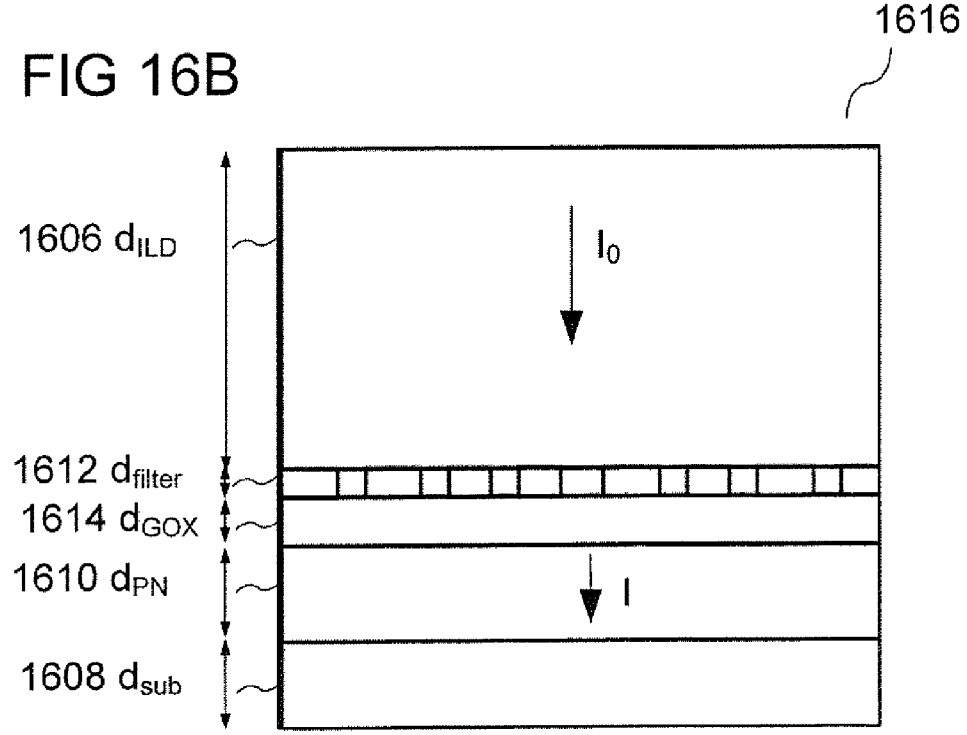

FIGS. 16A and 16B show illustrations 1600 and 1616 of an integrated photodiode with spectral filter (wavelength conversion element) 1612 in accordance with an embodiment. A spectral filter (wavelength conversion element) 1612 may be disposed above a photoconverter 1610. The photoconverter 1610 may be formed within a carrier, e.g. a silicon substrate 1608. A thin oxide layer 1614 may be disposed between the spectral filter 1612 and the photoconverter 1610. The photoconverter may be connected to a further circuit via interconnects 1604. Light, $I_0$, entering the spectral filter 1612 may be modified, or filtered, such that the light, I, entering the photodiode is wavelength converted.

Figure 17A:
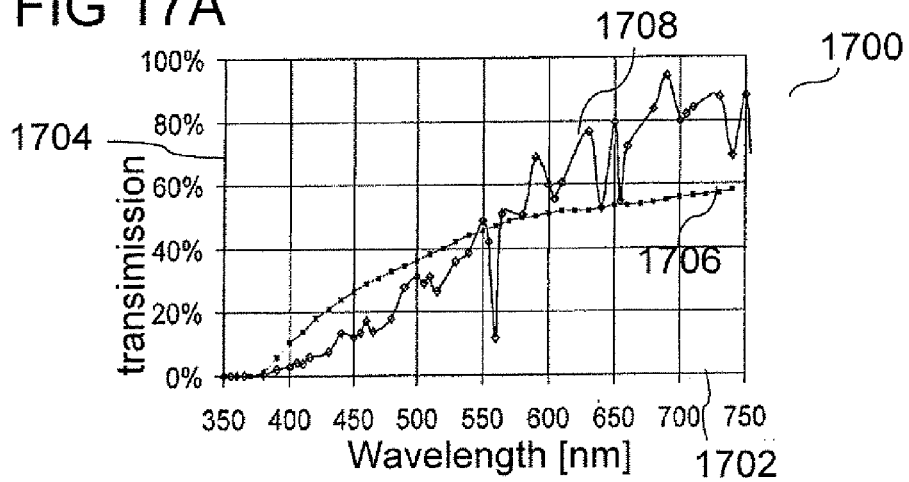
FIGS. 17A, 17B and 17C show reflection spectra and transmission spectra responses in accordance with one embodiment.

FIG. 17A shows an illustration 1700 of a simulation of transmitted light. 1708 shows the transmission response of a patterned polysilicon plate. 1706 shows the transmission response based on a diode that is covered with two material of the area ratio as in the patterned case. By subtraction of the signals, a high wavelength sensitive signal may be built.

Figure 17B:
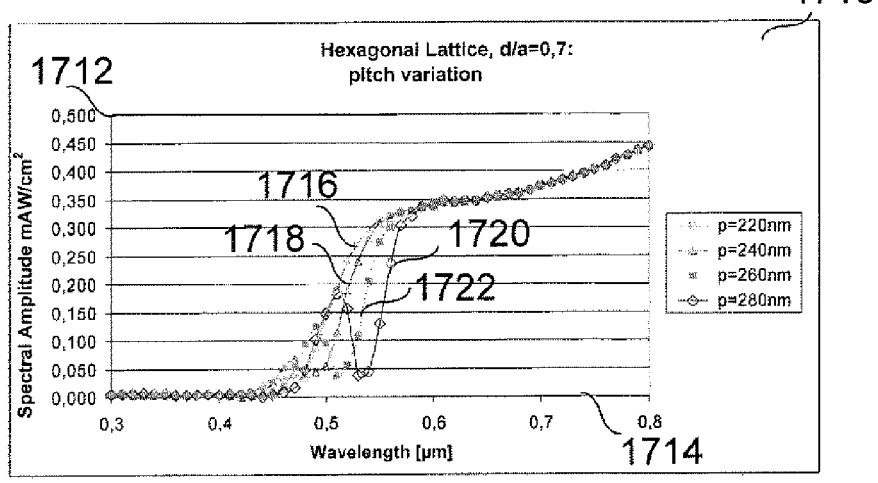

FIG. 17B shows an illustration 1710 of the simulated spectral amplitude response of a spectral filter array including polysilicon pillars with photodiode, the spectral filter array/wavelength conversion element having pillar diameter to lattice pitch ratio of 0.7. 1716, 1718, 1720 and 1720 show the spectral amplitude response of the spectral filter array-photodiode, wherein the spectral-filter array includes a hexagonal lattice of pillars, the array having a pitch of 220 nm, 240 nm, 260 nm and 280 nm, respectively. A sharp decrease in spectral amplitude is obtained at around 550 nm for the spectral filter array with pitch 280 nm.

Figure 17C:
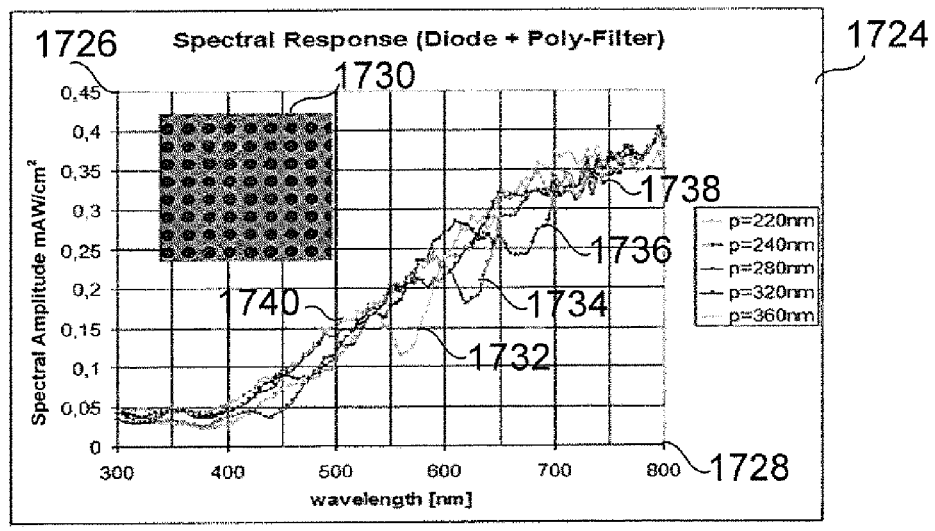

FIG. 17C shows an illustration 1724 of the measured spectral amplitude response of a spectral filter array such as that shown in 1730, including polysilicon pillars with photodiode, the spectral filter array/wavelength conversion element having pillar diameter to lattice pitch ratio of 0.7. 1732, 1734, 1736, 1738 and 1740 show the spectral amplitude response of the spectral filter array-photodiode, wherein the spectral-filter array has a pitch of 220 nm, 240 nm, 280 nm, 320 nm and 360 nm, respectively.

Figure 18:
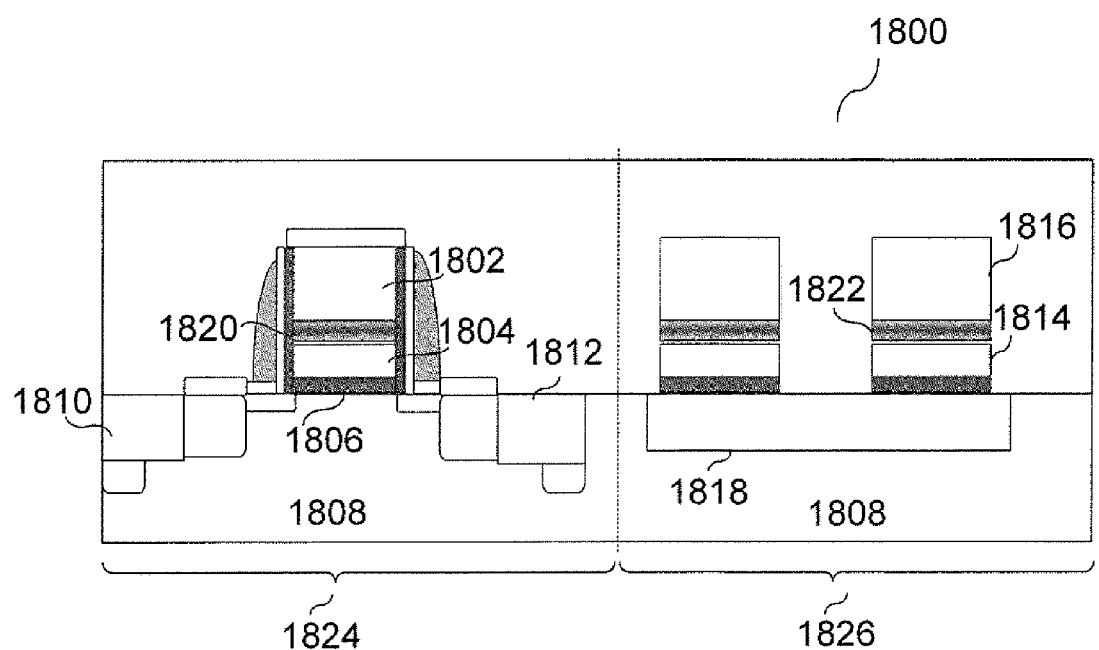
FIG. 18 shows an integrated circuit in accordance with one embodiment.

FIG. 18 shows an illustration 1800 of an integrated circuit in accordance with an embodiment which may be based on embedded flash technology. The integrated circuit may include a transistor including a sandwich of two gate layers including a floating gate 1804 and control gate 1802 which may be used in uniform channel programming The transistor may include a 25 nm high-voltage gate oxide layer 1806 and shallow trench isolation regions 1810 and 1812. The manufacturing of a wavelength conversion element may be combined with the manufacturing of the transistor such that a sequence of two optical filter layers 1814 and 1816 may be structured independently, wherein the optical filter layers 1814 and 1816 may include the same material or same materials as the gate regions of the transistor. The materials of the floating gate 1804 and the control gate 1802 may include polysilicon. The carrier 1808 may further include a photoconverter 1818, e.g. a p-n or pin photodiode, and the wavelength conversion element including 1816 and 1814 may be disposed above the photoconverter 1818. The structural elements 1814 forming the array may be at least partially laterally surrounded by the interlayer dielectric layer material 1822, and wherein the interlayer dielectric layer material may include the same material or same materials as a region 1820 at least partially laterally isolating the floating gate layer. The dielectric layer 1820, 1822 may be formed during the same processing step.

FIGS. 19A-D, FIGS. 20A-D and FIGS. 21A-D show illustrations of standard devices, e.g. field effect transistors, which are present in 130 nm CMOS embedded flash technology and, which may form other embodiments in accordance with the integrated circuit described in the embodiments. The devices include transistors which may include a gate region. The manufacturing of such field effect transistors are integrable with the manufacturing of a spectral-filter integrated with a photodiode as described in previous embodiments.

Figure 19A:
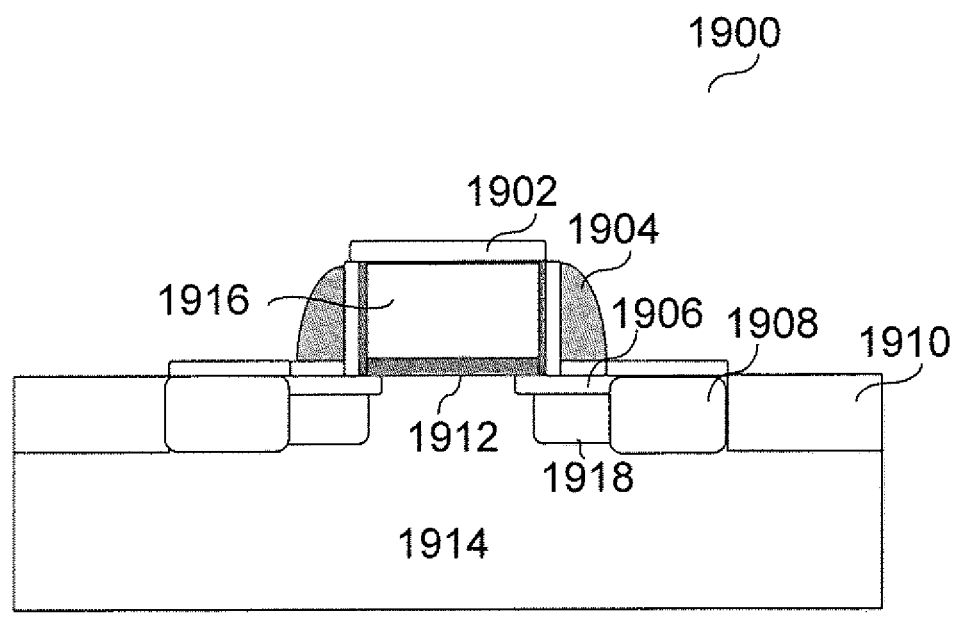
FIGS. 19A-D, FIGS. 20A-D and FIGS. 21A-D show standard devices in accordance with the integrated circuit described in various embodiments.

FIG. 19A shows an illustration 1900 of a hi/regular/low threshold voltage PFET. The device may include an N-well 1914 doped substrate, and shallow trench isolation region 1910. The device may further include source/drain regions 1908. The source/drain regions 1908 may be p-type. A p-type extension region 1906 may be formed in the device over an n-type pocket implant 1918. The device may include a CoSi blocking layer 1902 formed over the gate 1916 and source/drain 1908 regions. The device may include "L-shaped" spacers 1904 for isolating the gate region 1916. The gate region 1916 may include a p-doped polysilicon control gate. The gate region 1916 may be formed over a gate oxide layer 1912, e.g. a 2.2 nm gate oxide layer or a gate oxide layer having a thickness ranging from about 2 nm to about 7 nm.

Figure 19B:
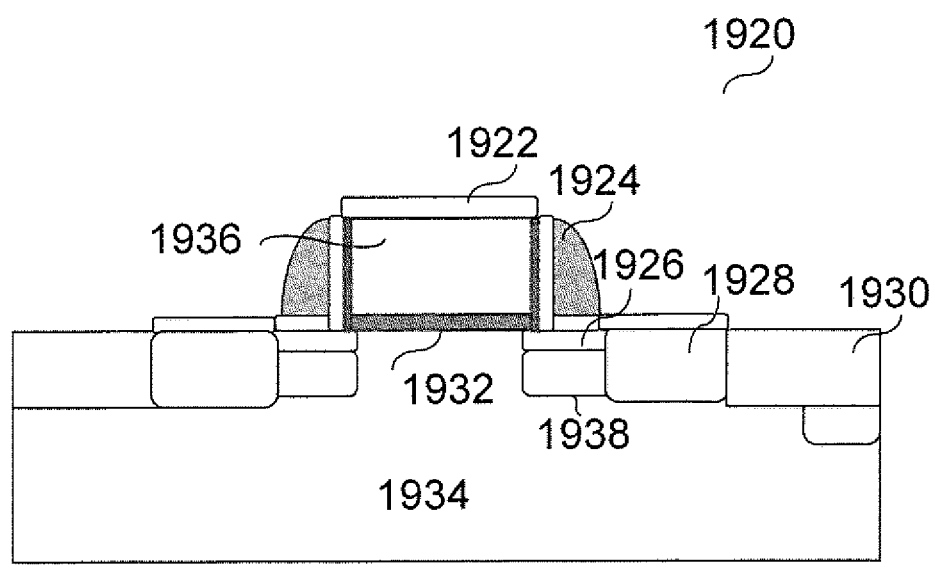

FIG. 19B shows an illustration 1920 of a hi/regular/low threshold voltage NFET. The device may include a P-well 1934 doped substrate, and shallow trench isolation region 1930. The device may further include source/drain regions 1928. The source/drain regions 1928 may be n-type. An n-type extension region 1926 may be formed in the device over a p-type pocket implant. The device may include a CoSi blocking layer 1922 formed over the gate 1936 and source/drain regions 1928. The device may include "L-shaped" spacers 1924 for isolating the gate region 1936. The gate region 1936 may include an n-doped polysilicon control gate. The gate region 1936 may be formed over a gate oxide layer 1932, e.g. a 2.2 nm gate oxide layer or a gate oxide layer having a thickness ranging from about 2 nm to about 7 nm.

Figure 19C:
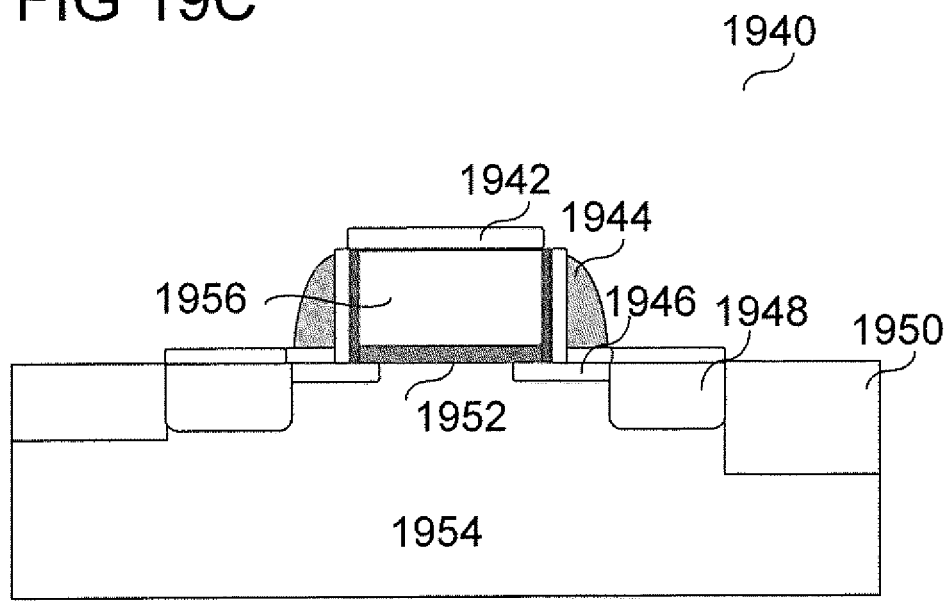

FIG. 19C shows an illustration 1940 of an analog PFET. The device may include an N-well 1954 doped substrate, and shallow trench isolation region 1950. The device may further include source/drain regions 1948. The source/drain regions 1948 may be p-type. A p-type extension region 1946 may be formed in the device. The device may include a CoSi blocking layer 1942 formed over the gate 1956 and source/drain 1948 regions. The device may include "L-shaped" spacers 1944 for isolating the gate region 1956. The gate region 1956 may include a p-doped polysilicon control gate. The gate region 1956 may be formed over a gate oxide layer 1952, e.g. a 5.2 nm gate oxide layer or a gate oxide layer having a thickness ranging from about 5 nm to about 10 nm.

Figure 19D:
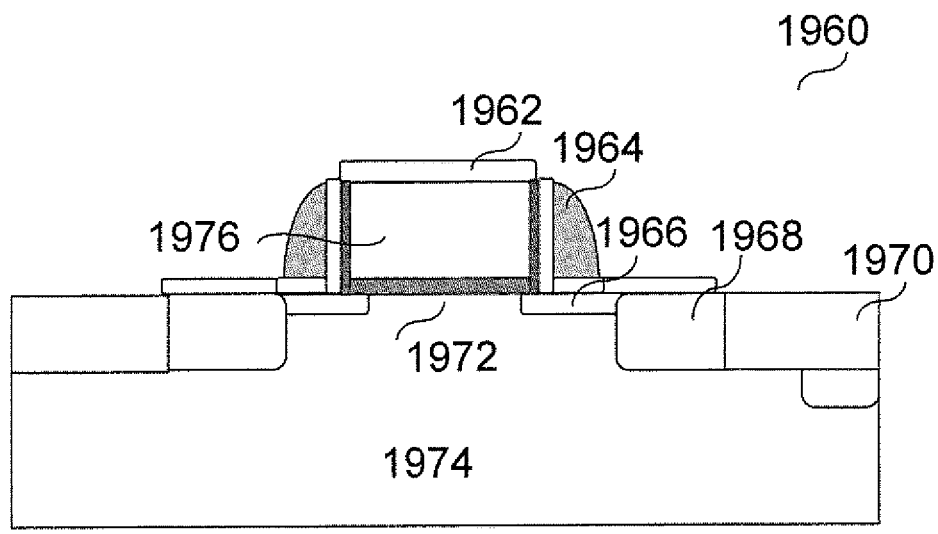

FIG. 19D shows an illustration 1960 of an analog NFET. The device may include a P-well 1974 doped substrate, and shallow trench isolation region 1970. The device may further include source/drain regions 1968. The source/drain regions 1968 may be n-type. An n-type extension region 1966 may be formed in the device. The device may include a CoSi blocking layer 1962 formed over the gate 1976 and source/drain regions 1968. The device may include "L-shaped" spacers 1964 for isolating the gate region 1976. The gate region 1976 may include an n-doped polysilicon control gate. The gate region 1976 may be formed over a gate oxide layer 1972, e.g. a 5.2 nm gate oxide layer or a gate oxide layer having a thickness ranging from about 5 nm to about 10 nm.

Figure 20A:
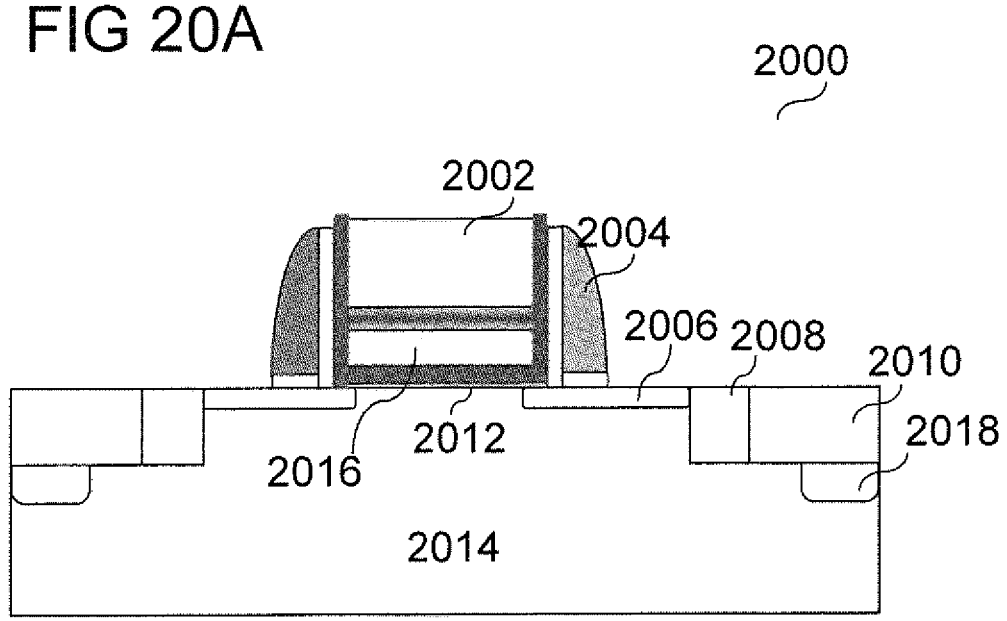

FIG. 20A shows an illustration 2000 of a high voltage PMOS device. The device may include an N-well 2014 doped substrate, and shallow trench isolation region 2010 formed over a channel stop region 2018. The device may further include source/drain regions 2008. The source/drain regions 2008 may be p-type. The device may further include a p-type lightly doped drain region 2006. The device may include a gate region 2016 and a further gate region 2002 disposed above the gate region 2016. The gate region 2016 may include a floating gate and the further gate region 2002 may include a control gate. The device may include "L-shaped" spacers 2004 for isolating the gate regions 2016 and 2002. The gate region 2016 may be formed over a gate oxide layer 2012, e.g. a 25 nm high voltage gate oxide layer or a gate oxide layer having a thickness ranging from about 15 nm to about 30 nm.

Figure 20B:
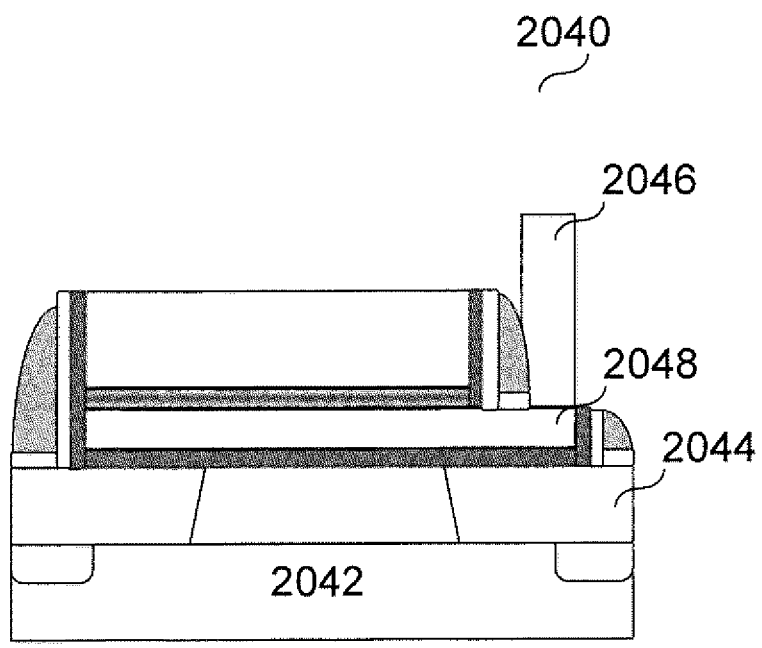

FIG. 20B shows an illustration 2040 of the high voltage PMOS device of FIG. 20A in which a gate contact 2046 may be made to the floating polysilicon gate 2048. The device may include an N-well 2042 doped substrate, and shallow trench isolation region 2044.

Figure 20C:
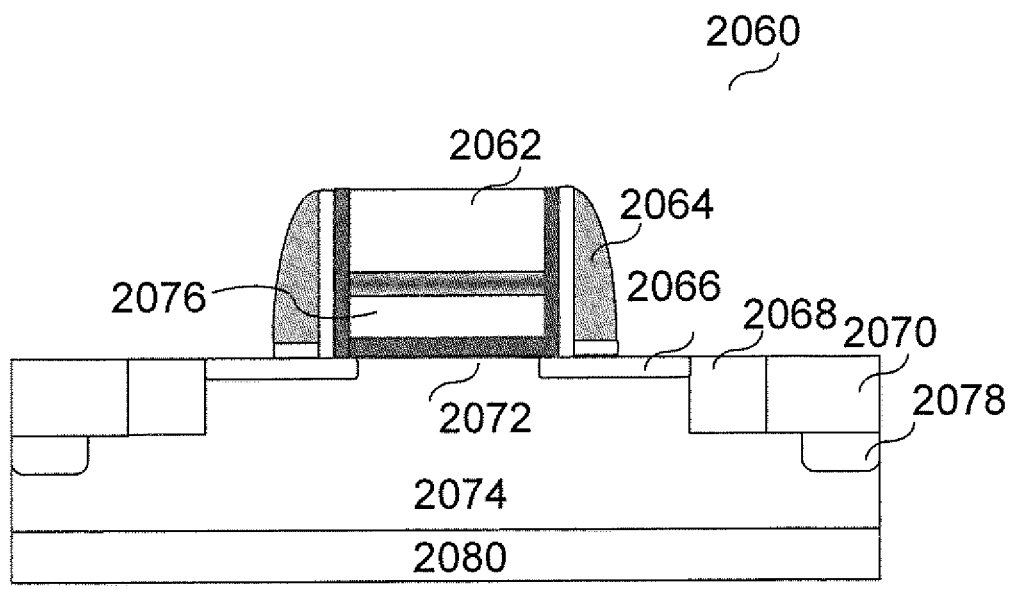

FIG. 20C shows an illustration 2060 of a high voltage NMOS device. The device may include a P-well 2074 formed over an N-well 2080 disposed in a substrate, and a shallow trench isolation region 2070 formed over a channel stop region 2078. The device may further include source/drain regions 2068. The source/drain regions 2068 may be n-type. The device may further include an n-type lightly doped drain region 2066. The device may include a gate region 2076 and a further gate region 2062 disposed above the gate region 2076. The gate region 2076 may include a floating gate and the further gate region 2062 may include a control gate. The device may include "L-shaped" spacers 2064 for isolating the gate regions 2076 and 2062. The gate region 2076 may be formed over a gate oxide layer 2072, e.g. a 25 nm high voltage gate oxide layer or a gate oxide layer having a thickness ranging from about 15 nm to about 30 nm.

Figure 20D:
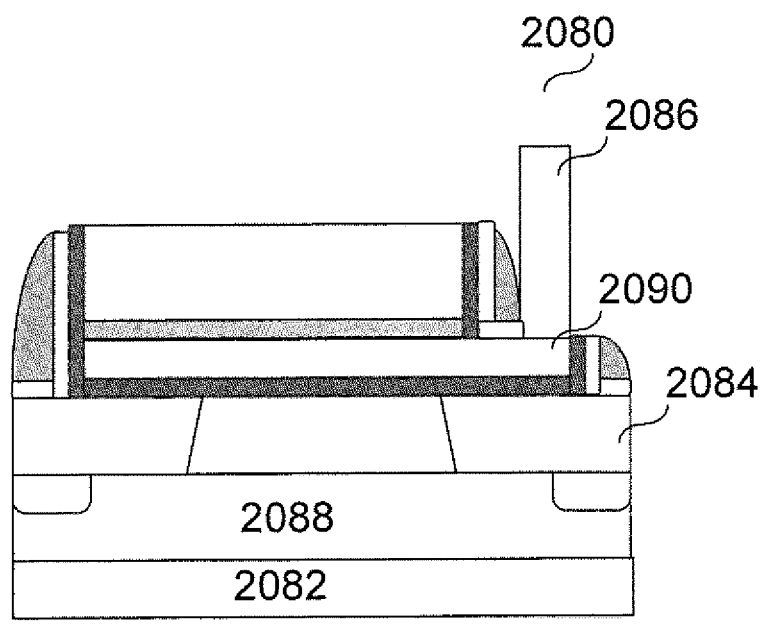

FIG. 20D shows an illustration 2080 of the high voltage NMOS device of FIG. 20C in which a gate contact 2086 may be made to contact the floating polysilicon gate 2090. The device may include a P-well 2088 formed over an N-well 2082 disposed in a substrate, and a shallow trench isolation region 2084 formed over a channel stop region 2092.

Figure 21A:
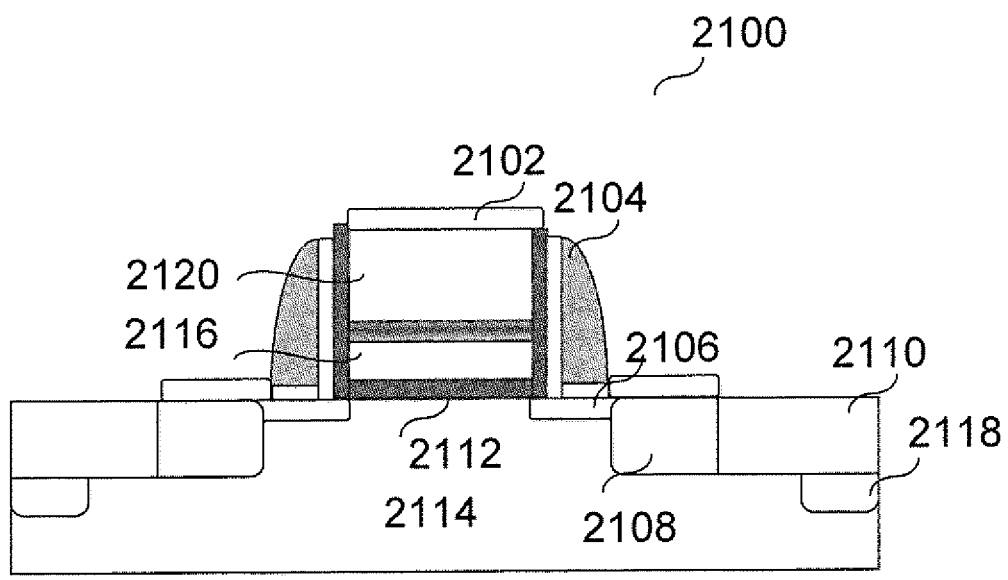

FIG. 21A shows an illustration 2100 of a medium voltage PMOS device. The device may include an N-well 2114 doped substrate, and shallow trench isolation region 2110 formed over a channel stop region 2118. The device may further include source/drain regions 2108. The source/drain regions 2108 may be p-type. The device may further include a p-type lightly doped drain region 2106. The device may include a gate region 2116 and a further gate region 2120 disposed above the gate region 2116. The gate region 2116 may include a floating gate and the further gate region 2120 may include a control gate. The device may include "L-shaped" spacers 2104 for isolating the gate regions 2116 and 2120. The gate region 2116 may be formed over a gate oxide layer 2112, e.g. a 25 nm high voltage gate oxide layer or a gate oxide layer having a thickness ranging from about 15 nm to about 30 nm. The device may include a CoSi blocking layer 2102 formed over the further gate 2120 and source/drain regions 2108.

Figure 21B:
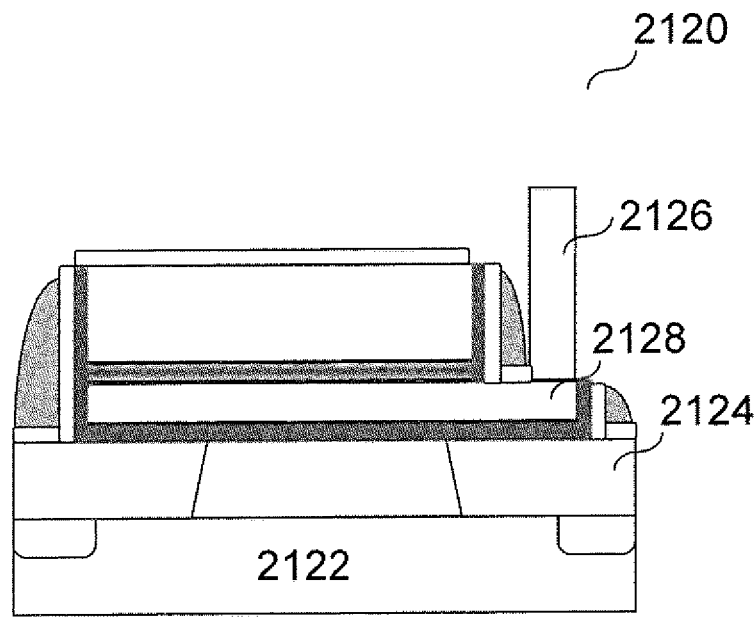

FIG. 21B shows an illustration 2120 of the medium voltage PMOS device of FIG. 21A in which a gate contact 2126 may be made to contact the floating polysilicon gate 2128. The device may include an N-well 2122 doped substrate, and shallow trench isolation region 2124.

Figure 21C:
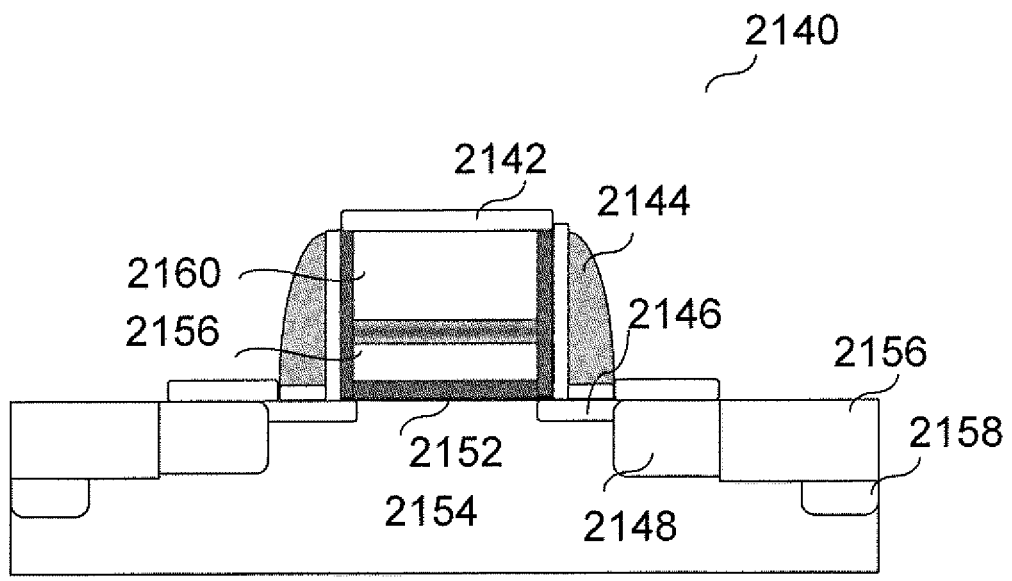

FIG. 21C shows an illustration 2140 of a medium voltage NMOS device. The device may include a P-well 2154 disposed in a substrate, and a shallow trench isolation region 2156 formed over a channel stop region 2158. The device may further include source/drain regions 2148. The source/drain regions 2148 may be n-type. The device may further include an n-type lightly doped drain region 2146. The device may include a gate region 2156 and a further gate region 2160 disposed above the gate region 2156. The gate region 2156 may include a floating gate and the further gate region 2160 may include a control gate. The device may include "L-shaped" spacers 2144 for isolating the gate regions 2156 and 2160. The gate region 2156 may be formed over a gate oxide layer 2152, e.g. a 25 nm high voltage gate oxide layer or a gate oxide layer having a thickness ranging from about 15 nm to about 30 nm. The device may include a CoSi blocking layer 2142 formed over the gate 2160 and source/drain regions 2148.

Figure 21D:
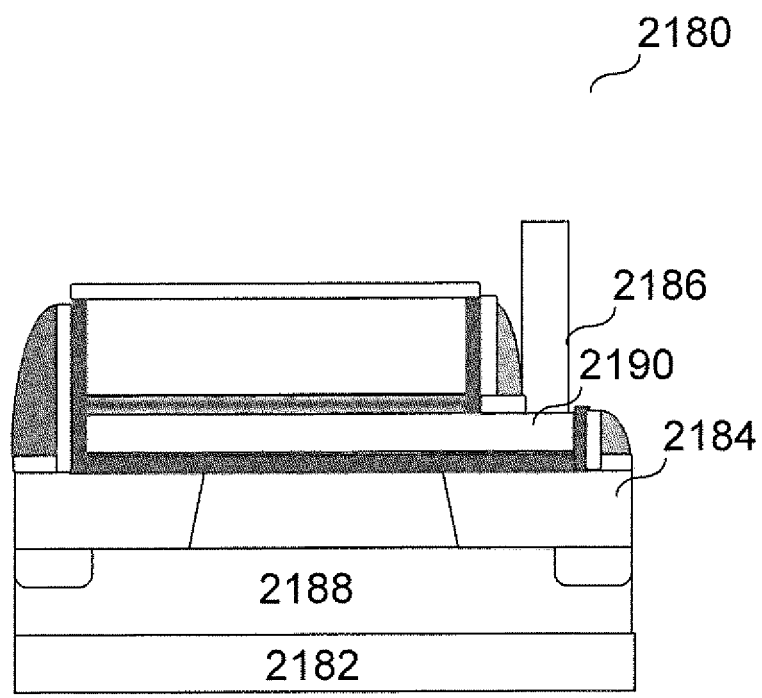

FIG. 21D shows an illustration 2180 of the medium voltage NMOS device of FIG. 21C in which a gate contact 2186 may be made to contact the floating polysilicon gate 2190. The device may include a P-well 2188 formed over an N-well 2182 disposed in a substrate, and a shallow trench isolation region 2184 formed over a channel stop region 2192.

A further method for producing an integrated circuit arrangement, including the steps of forming a single gate (control gate) or multiple gate (floating gate and control gate) transistor and a optical filter stack layer including a wavelength conversion element and further wavelength conversion elements may be described as follows.

The method may include forming a transistor gate region and forming a wavelength conversion element including the same material or same materials as the gate region of the transistor, during the same processing step, wherein the transistors may include the transistor arrangements described in FIGS. 19*a-d*. The method may include forming a transistor floating gate region and forming a wavelength conversion element including the same material or same materials as the floating gate region of the transistor, during the same processing step, wherein the transistors may include the transistor arrangements described in FIGS. 20*a-d* to 21*a-d*. The method may include forming a transistor control gate region and forming a further wavelength conversion element including the same material or same materials as the control gate region of the transistor, during the same processing step, wherein the transistors may include the transistor arrangements described in FIGS. 20*a-d* to 21*a-d*.

Forming a transistor floating gate region and forming a wavelength conversion element including the same material or same materials as the floating gate region of the transistor may include forming the transistor floating gate region and the wavelength conversion element including the same material or same materials as the floating gate region from the same processing layer above a carrier.

Forming a transistor control gate region and forming further wavelength conversion element including the same material or same materials as the control gate region of the transistor may include forming the transistor control gate region and the further wavelength conversion element including the same material or same materials as the control gate region from the same processing layer above a carrier.

A method may be carried out as follows as described with reference to features as those shown in FIG. 18.

A carrier 1808, e.g. a silicon substrate, may be selected.

A first region of the carrier 1824 may be selected wherein other electronic components within the integrated circuit, e.g. a transistor as described in FIGS. 19*a-d* to 21*a-d*, may be located. A second region of the carrier 1828 may be selected wherein a wavelength conversion element may be located.

Standard photolithography and deposition techniques, e.g. ion implantation may be used to define regions included in a transistor located in the first region, e.g. a shallow trench isolation region 1810, source/ drain regions 1812, pocket implants, well implants, of a transistor. During the processing of the regions included in a transistor, photolithography may be carried out in the second region of the carrier 1808 to define structures, e.g. a photoconverter structure 1818 such as a p-n or pin photodiode, which may be formed within the carrier 1808. One or more of the steps of forming the regions of the transistor, e.g. source/ drain regions, pocket implants, well implants, shallow trench isolation regions, may be carried out in the same processing step with forming the photoconverter 1818. For example, ion implantation of the source/ drain regions, pocket implants, well implants, shallow trench isolation regions of the transistor may be carried out in the same processing step as the ion implantation of the photoconverter region 1818.

During the processing of the regions included in a transistor, a masking layer, e.g. photoresist, may be used to protect the second region 1826 of the carrier from processing steps being carried out in the first region 1824 of the carrier, which are processing steps which may not be needed in the sequence of processing steps in the second region 1826 of the carrier. A masking layer may likewise be used to protect the first region 1824 of the carrier from processing steps being carried out in the second region 1826 of the carrier.

Photolithography may be carried out to pattern a gate region 1804 of a transistor in the first region 1824 of the carrier and a wavelength conversion element 1814 in the second region 1826 of the carrier. A layer of photoresist may be formed over the first 1824 and second regions 1826 of the carrier, and the gate region 1804 of a transistor in the first region 1824 of the carrier and a wavelength conversion element 1814 in the second region 1826 of the carrier may be formed during the same or different processing step. The photoresist formed over the second region 1826 may be patterned, e.g. using a photomask, such that the wavelength conversion element 1814 includes one or more structural elements forming an array. The formation of a gate region 1804 of a transistor in the first region 1824 of the carrier and the formation of structural elements forming an array of the wavelength conversion element in the second region 1826 of the carrier may be carried out during the same or different processing step.

A gate oxide material 1820 may be deposited to form a portion of the transistor in the first region 1824 of the carrier and to form a portion of the wavelength conversion element 1822 in the second region 1826 of the carrier in the same or different processing step.

Whenever processing steps are carried out in the first (second) region of the carrier which may not be needed in the sequence of processing steps in the second (first) region of the carrier, or when a particular fabrication process to be carried out in a first region and a second region is carried out in a different processing step, a masking layer, e.g. photoresist, may be used to protect the second (first) region of the carrier from processing steps being carried out in the first (second) region of the carrier.

A deposition step may be carried out in the first 1824 region of the carrier to form a floating gate region 1804 of the transistor located in the first region 1824 of the carrier, e.g. the deposition of polysilicon floating gate. A deposition step may be carried out in the second region 1826 of the carrier to form one or more structural elements 1814 forming an array of the wavelength conversion element in the second region of the carrier, e.g. the deposition of polysilicon to form one or more structural elements forming the array. The deposition steps to form the floating gate 1804 region of the transistor located in the first region of the carrier and to form one or more structural elements 1814 forming an array of the wavelength conversion element in the second region of the carrier may be carried out in the same or different processing step.

The floating gate region 1804 of the transistor and the wavelength conversion element 1814 (structural elements forming an array) may be formed of the same material or same materials, e.g. polysilicon, in the same processing step, such that wavelength conversion element having the same material or same materials as the floating gate region 1804 of the transistor, are formed from the same processing layer as the gate region above a carrier.

A dielectric layer 1820 may be formed above the floating gate 1804 region of the transistor or in such a way that the dielectric layer at least partially isolates the floating gate layer 1804. A dielectric layer 1822 may be formed above the wavelength conversion element 1814 (structural elements forming an array forming the wavelength conversion element), or in such a way that the dielectric layer at least partially isolates the wavelength conversion element.

The dielectric layer 1820, 1822 may be an interlayer dielectric layer material which may be formed such that each of the elements 1814 forming the array is at least partially laterally surrounded by the interlayer dielectric layer material, and wherein the interlayer dielectric layer material includes the same material or same materials as a region at least partially laterally isolating the floating gate layer. The dielectric layer 1820, 1822 may be formed during the same processing step.

A deposition step may be carried out in the first region of the carrier to form a control gate region 1802 of the transistor located in the first region of the carrier, e.g. the deposition of polysilicon control gate. A deposition step may be carried out in the second region of the carrier to form one or more structural elements 1816 forming an array of a further wavelength conversion element in the second region of the carrier, e.g. the deposition of polysilicon to form one or more structural elements forming the array. The deposition steps to form the control gate region of the transistor 1802 located in the first region of the carrier and to form one or more structural elements 1816 forming an array of the further wavelength conversion element in the second region of the carrier may be carried out in the same processing step.

The control gate region 1802 of the transistor and the wavelength conversion element 1816 (structural elements forming an array) may be formed of the same material or same materials, e.g. polysilicon, in the same processing step, such that the further wavelength conversion element 1816 having the same material or same materials as the control gate region 1802 of the transistor, are formed from the same processing layer as the control gate 1802 region above a carrier.

A masking layer may be deposited above the second region of the carrier to protect the wavelength conversion element/further wavelength conversion element stacks 1814, 1816 from further processing steps being carried out in the first region of the carrier. The further processing steps may include forming further portions forming the transistor, or other elements located in the first region of the carrier. "L-shaped" spacers for isolating the gate regions of the transistor may be deposited at least partially surrounding the floating gate 1804 and polysilicon gate 1802 regions. A CoSi blocking layer may be formed over the control gate 1802 and source/drain 1810, 1812 regions located in the first region of the carrier. The device may include a CoSi blocking layer 1902 formed over the gate 1916 and source/drain 1908 regions.

The masking layer protecting the second region of the carrier may be removed. An interlayer dielectric layer at least partially surrounding the transistor located in the first region of the carrier and the wavelength conversion element/further wavelength conversion element stack located in the second region of the carrier may be deposited. The interlayer dielectric layer at least partially surrounding the transistor may include the same material or same materials as a region at least partially laterally isolating the floating gate layer.

Figure 22A:
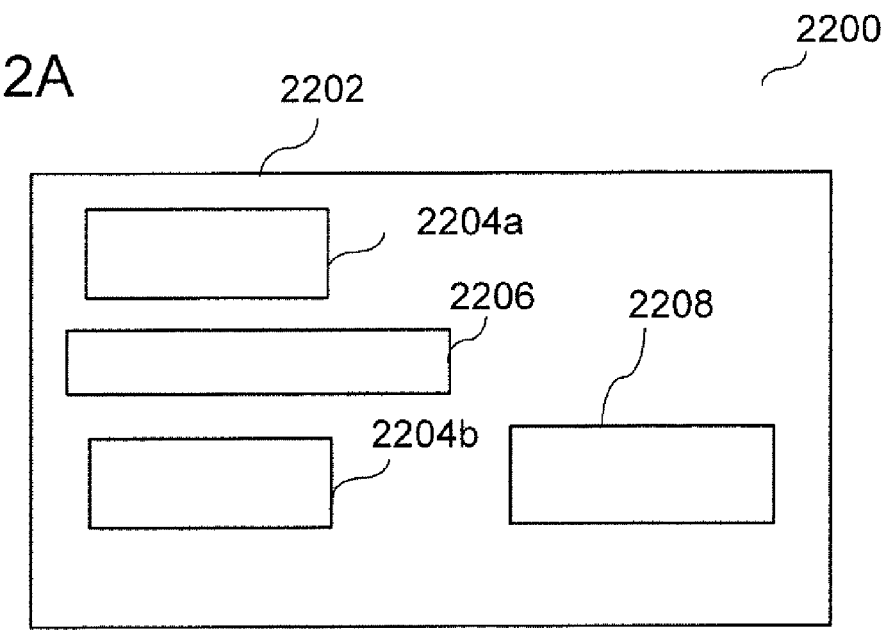
FIG. 22A shows an integrated circuit arrangement in accordance with various embodiments.

FIG. 22A shows an illustration 2200 of an integrated circuit arrangement 2202 including a plurality of devices 2204a, 2204b, a device isolation region 2206 for separating at least one device of the plurality of devices 2204a from a further at least one device of the plurality of devices 2204b, and a wavelength conversion element 2208, wherein the wavelength conversion element 2208 includes the same material or same materials as the device isolation region 2206.

Figure 22B:
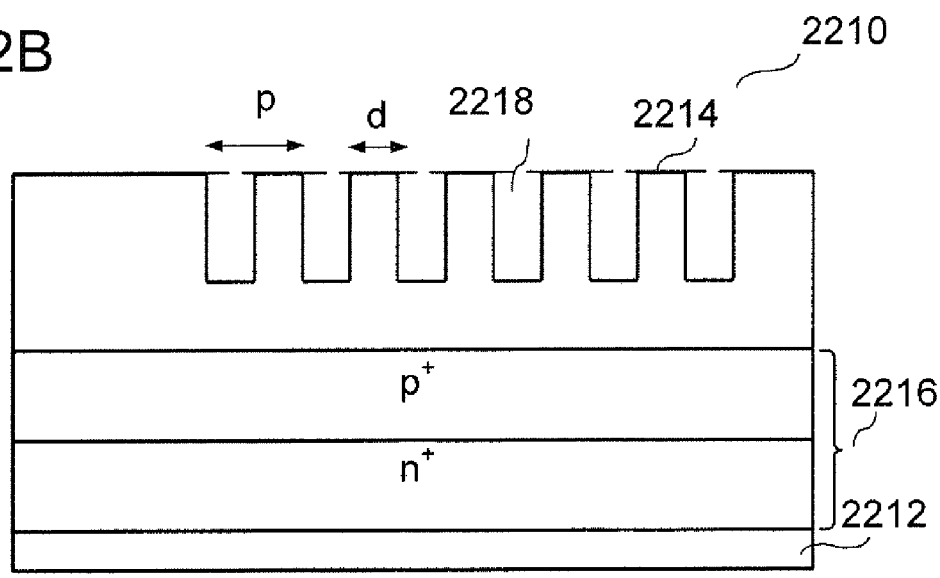
FIG. 22B shows a wavelength conversion element of an integrated circuit arrangement in accordance with various embodiments.

FIG. 22B shows an illustration 2210 of another embodiment of the wavelength conversion element. The wavelength conversion element 2008 may further include one or more structural elements 2214 forming an array, wherein the one or more structural elements 2214 forming the array may include the material of the carrier 2212, e.g. bulk silicon. A carrier material, e.g. bulk silicon, may undergo a CMOS STI etch to form the structural elements 2214 forming an array forming a region of the wavelength conversion element 2008. The trench regions 2218 formed by a CMOS STI etch, may be filled using a standard COMS STI fill process, e.g. using chemical vapor deposition, wherein the trench regions 2218 may be filled with the same material or same materials as the device isolation region 2206, e.g. silicon dioxide. In another embodiment, the material which fills the trench regions 2218 may be air. The geometry of the wavelength conversion element 2208 filter pattern (depths, dimensions, aspect ratios) may be chosen similar to the gate-poly structure mentioned in earlier embodiments and as illustrated by the hexagonal or quadratic lattice arrangements as shown in FIGS. 10 to 14. The pitch, p, may range between ⅙ to ½ times the wavelength of interest. Each structural element may have a width, d. The width, d, may range between 0.2 to 1 times the value of p, e.g., p=220 nm, and d=180 nm. The material composition of the wavelength conversion element 2008 may be silicon and silicon dioxide. In another embodiment, the material composition of the wavelength conversion element 2008 may be silicon and air. In another embodiment, the carrier may further include a photoconverter 2216, e.g. a p-n or pin photodiode, wherein the wavelength conversion element 2008 is disposed above the photoconverter 2216. The photoconverter 2216 may be disposed below the wavelength conversion element to detect transmitted light (light transmitted through the wavelength conversion element).

Figure 22C:
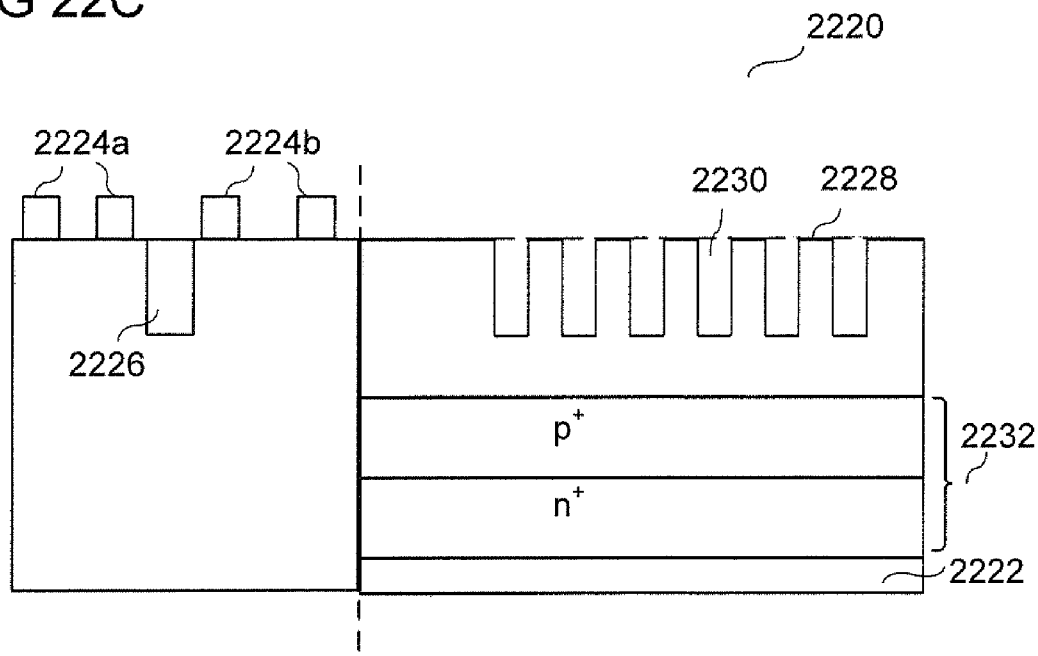
FIG. 22C shows an integrated circuit arrangement in accordance with various embodiments.

FIG. 22C shows an illustration 2220 of an integrated circuit in accordance with an embodiment. In an embodiment, an integrated circuit includes a plurality of devices 2224a, 2224b, a device isolation region 2226 for separating at least one device of the plurality of devices 2224a from a further at least one device of the plurality of devices 2224b, and a wavelength conversion element 2228, 2230 wherein the wavelength conversion element 2228, 2230 includes the same material or same materials as the device isolation region.

The wavelength conversion element 2228, 2230 may further include one or more structural elements 2228 forming an array, wherein the one or more structural elements 2228 forming the array may include the material of the carrier 2222, e.g. bulk silicon. The material of the device isolation region 2226 and the wavelength conversion element 2230 including the same material or same materials as the device isolation region 2226 may be formed from the same processing layer above a carrier 2222. The material of the device isolation region 2226 may include silicon dioxide. The wavelength conversion element 2228, 2230 may be a photonic crystal which may be realized in the carrier 2222, by a standard complementary metal oxide semiconductor shallow trench isolation (CMOS STI) etch and standard CMOS STI fill performed in the carrier 2222, wherein the carrier material may include bulk silicon.

Figure 22D:
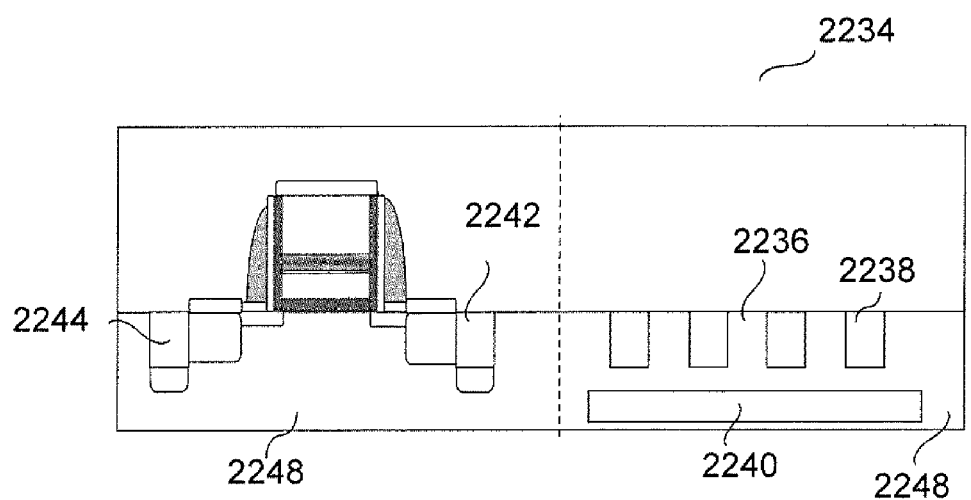
FIG. 22D shows an integrated circuit arrangement in accordance with various embodiments.

FIG. 22D shows an illustration 2234 of an integrated circuit in accordance with an embodiment, wherein the transistor may be any one of the transistors disclosed and described in FIGS. 19a-d, to 21a-d. The device isolation region, such as shallow trench isolation regions 2242, 2244 may include a material, wherein the material of the device isolation region 2242, 2244 and the wavelength conversion element 2238 including the same material or same materials as the device isolation region 2242, 2244 may be formed from the same processing layer above a carrier 2248. The carrier 2248 may further include a photoconverter 2240 wherein the wavelength conversion element 2238, 2236 is disposed above the photoconverter.

Figure 23A:
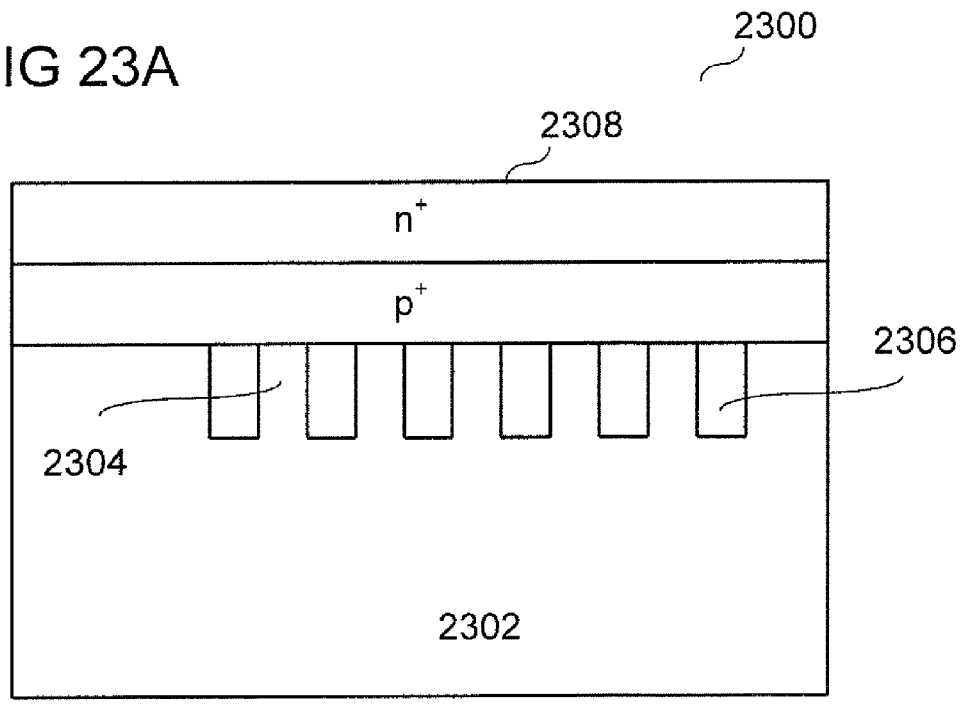
FIG. 23A shows a wavelength conversion element of an integrated circuit arrangement in accordance with various embodiments.

FIG. 23A shows an illustration 2300 of the position of a photoconverter 2308 in relation to a wavelength conversion element 2304, 2306, wherein the photoconverter 2308 may be disposed above the wavelength conversion element 2306 formed in a carrier 2302.

Figure 23B:
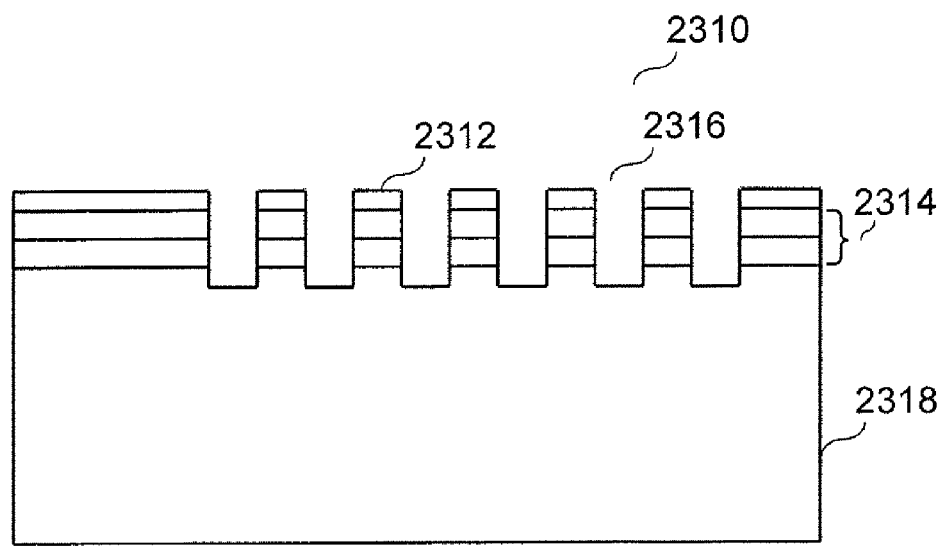
FIG. 23B shows a wavelength conversion element of an integrated circuit arrangement in accordance with various embodiments.

FIG. 23B shows an illustration 2310 of the position of a photoconverter 2314 in relation to a wavelength conversion element 2312, 2316, wherein the photoconverter 2314 may be disposed within the photonic crystal filter under the circumstances wherein another portion of light, i.e., non reflected and not transmitted light, is to be detected. Detection from one or more positions may be accomplished simultaneously and differential methods may be applied. In another embodiment an MIS cell (not shown) may be disposed below the wavelength conversion element.

Figure 24A:
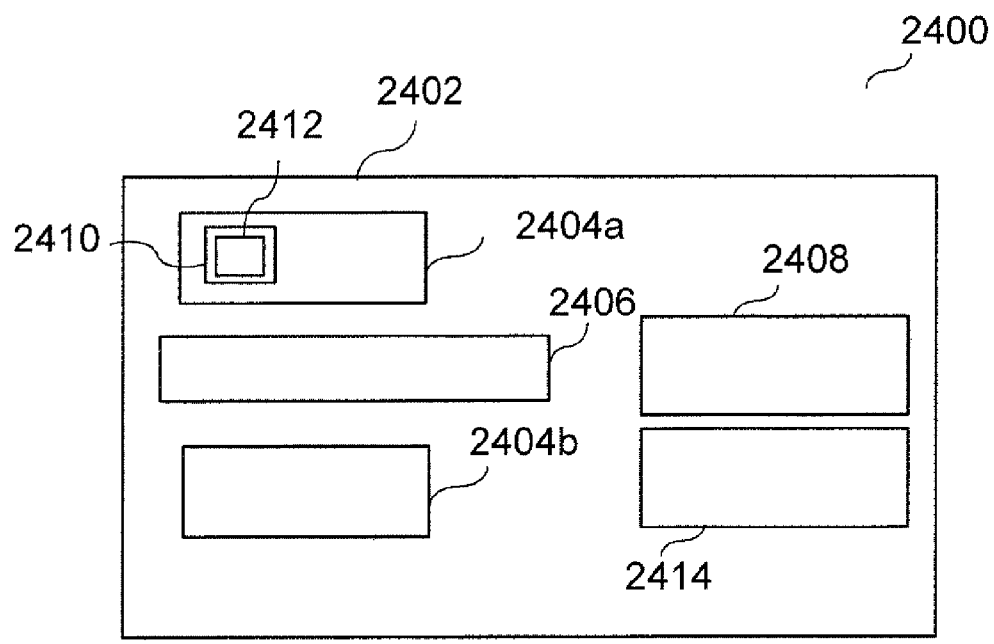
FIG. 24A shows an integrated circuit arrangement in accordance with various embodiments.

FIG. 24A shows an illustration 2400 of an integrated circuit arrangement 2402 including a plurality of devices 2404a, 2404b, a device isolation region 2406 for separating at least one device of the plurality of devices 2404a from a further at least one device of the plurality of devices 2404b, and a wavelength conversion element 2408, wherein the wavelength conversion element 2408 includes the same material or same materials as the device isolation region 2406, wherein the at least one of the plurality of devices is a transistor 2410 including a gate region 2412, the integrated circuit arrangement 2402 further comprising a further wavelength conversion element 2414, wherein the further wavelength conversion element 2414 may include the same material or same materials as the gate region 2412.

Figure 24B:
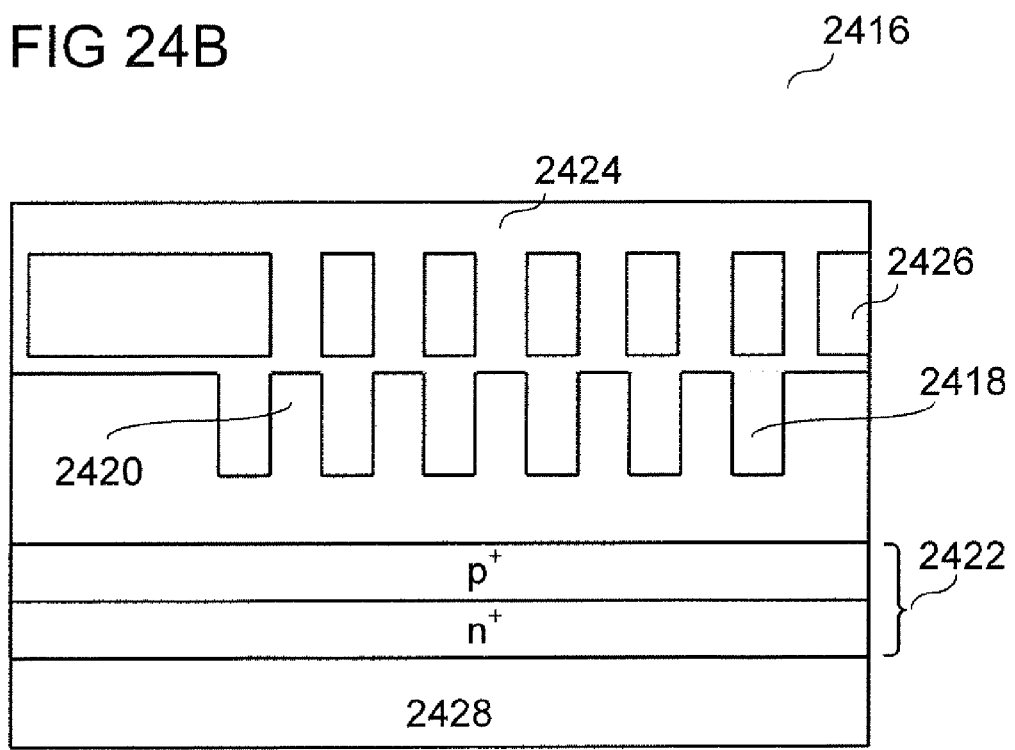
FIG. 24B shows a wavelength conversion element and a further wavelength conversion element of an integrated circuit arrangement in accordance with various embodiments.

FIG. 24B shows an illustration 2416 of how a wavelength conversion element and a further wavelength convection element may be arranged within an integrated circuit. The wavelength conversion element 2418, 2420 may include one or more structural elements 2420 forming an array, wherein the one or more structural elements 2420 forming the array may include the material of the carrier 2428, e.g. bulk silicon. The further wavelength conversion element 2424, 2426 may further include one or more structural elements 2426 forming an array, wherein the one or more structural elements 2426 forming the array may include the same material or same materials as the gate region 2412. The further wavelength conversion element may bear identical characteristics to the wavelength conversion element described in FIGS. 1 to 16.

Figure 24C:
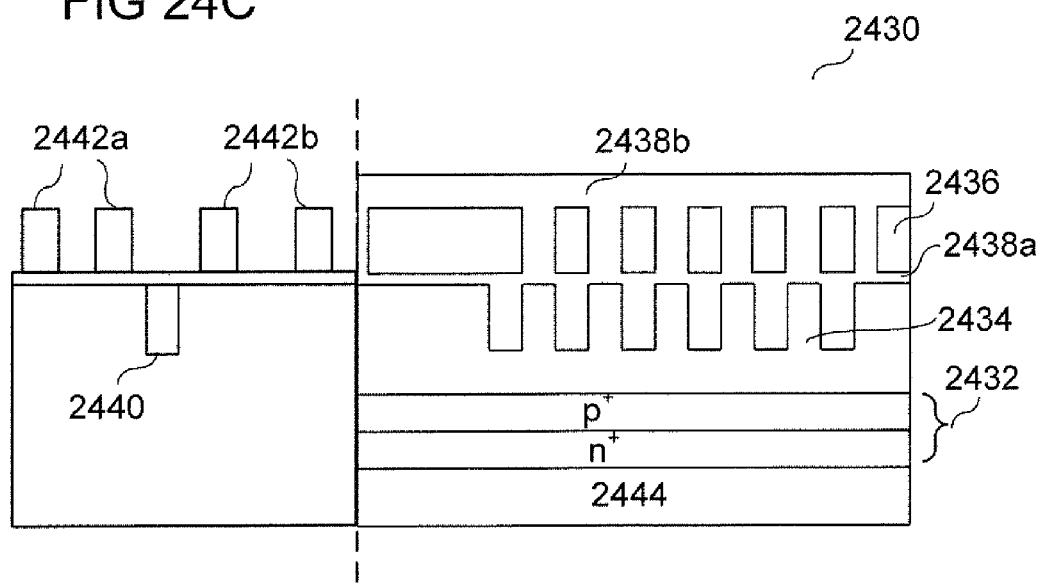
FIG. 24C shows an integrated circuit arrangement in accordance with various embodiments.

FIG. 24C shows an illustration 2430 of an integrated circuit arrangement in accordance with various embodiments. In an embodiment, an integrated circuit includes a plurality of devices 2442a, 2442b, a device isolation region 2440 for separating at least one device of the plurality of devices 2442a from a further at least one device of the plurality of devices 2442b, and a wavelength conversion element 2434, 2438a, wherein the wavelength conversion element 2434, 2438a includes the same material or same materials 2438a as the device isolation region 2440, wherein the at least one of the plurality of devices 2442a is a transistor including a gate region, the integrated circuit arrangement further comprising a further wavelength conversion element 2436, wherein the further wavelength conversion element 2436 include the same material or same materials as the transistor gate region.

Figure 24D:
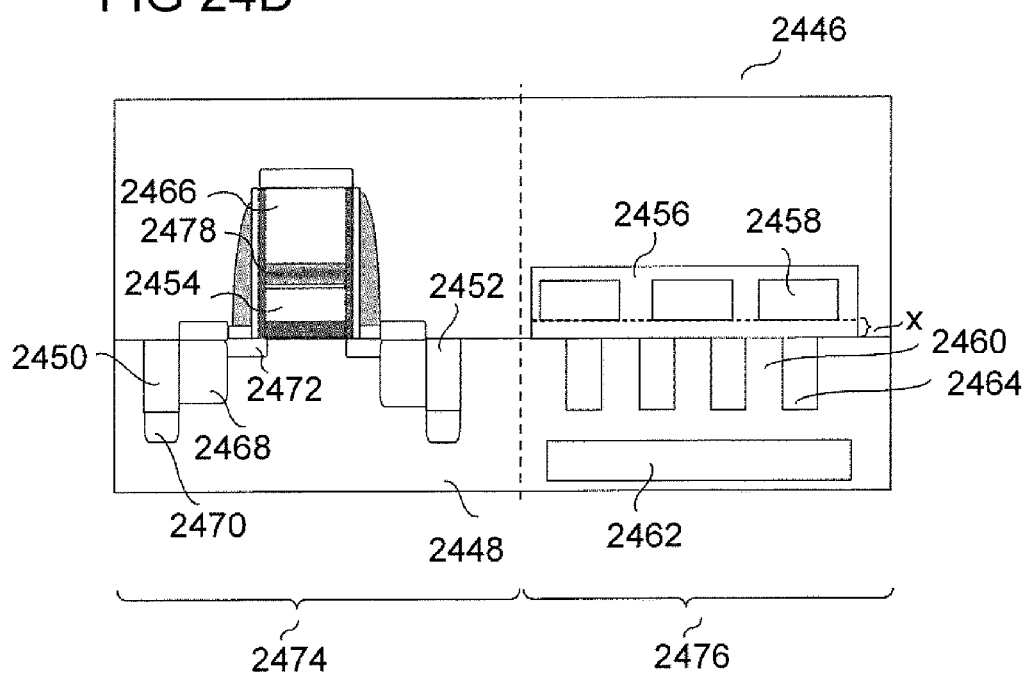
FIG. 24D shows an integrated circuit arrangement in accordance with various embodiments.

FIG. 24D shows an illustration 2446 of an integrated circuit arrangement in accordance with an embodiment wherein the transistor may be any one of the transistors disclosed and described in FIGS. 19a-d, to 21a-d.

The wavelength conversion element may include one or more structural elements 2460 forming an array, wherein the one or more structural elements 2460 forming the array may include the material of the carrier 2448, e.g. bulk silicon. The further wavelength conversion element may further include one or more structural elements 2458 forming an array, wherein the one or more structural elements 2458 forming the array may include the same material or same materials as the gate region 2454.

The device isolation region, such as shallow trench isolation regions 2450, 2452 may include a material, wherein the material of the device isolation region 2450, 2452 and the wavelength conversion element 2460, 2464 including the same material or same materials as the device isolation region 2450, 2452 may be formed from the same processing layer above a carrier 2448. The carrier 2248 may further comprise a photoconverter 2462 wherein the wavelength conversion element 2260, 2264 is disposed above the photoconverter.

The material of the device isolation region 2450, 2452 and the wavelength conversion element 2230 including the same material or same materials as the device isolation region 2450, 2452 may be formed from the same processing layer above a carrier 2448. The material of the device isolation region 2450, 2452 may include silicon dioxide. The wavelength conversion element 2460 may be a photonic crystal which may be realized in the carrier 2448, by a standard complementary metal oxide semiconductor shallow trench isolation (CMOS STI) etch and standard CMOS STI fill performed in the carrier 2448, wherein the carrier material may include bulk silicon.

A carrier material, e.g. bulk silicon, may undergo a CMOS STI etch to form the one or more structural elements 2460 forming an array forming a region of the wavelength conversion element. The trench regions 2464 formed by a CMOS STI etch, may be filled using a standard CMOS STI fill process, e.g. using chemical vapor deposition, wherein the trench regions 2464 may be filled with the same material or same materials as the device isolation region, shallow trench isolation region 2450, 2452, e.g. silicon dioxide. A smoothing technique such as chemical mechanical polishing (CMP) may be used to smoothen the surface of the trench filling material 2464. A photoresist layer may be formed over the smoothened surface of the trench filling material 2464. The photoresist may be patterned to form a transistor gate region 2454 and a further wavelength conversion element 2458, wherein the further wavelength conversion element may include one or more structural elements 2458 forming an array, wherein the one or more structural elements 2458 forming the array may include the same material or same materials as the gate region 2454. The further wavelength conversion element 2456, 2458 may be disposed above the wavelength conversion element 2460, 2464. The wavelength conversion element 2460, 2464 including the same material or same materials as the device isolation region 2450, 2452 may be formed from the same processing layer above a carrier 2448. The further wavelength conversion element 2456, 2458 including the same material or same materials as the gate region 2454 of the transistor may be formed from the same processing layer above a carrier 2448. The carrier may further include a photoconverter 2462 wherein the wavelength conversion element 2460, 2464 is disposed above the photoconverter 2462. The further wavelength conversion element may include an interlayer dielectric layer 2456, wherein the interlayer dielectric layer material 2456 may include the same material or same materials as the device isolating region 2450, e.g. silicon dioxide. The interlayer dielectric layer material 2456 may include the same material or same materials e.g. silicon dioxide, as a region at least partially laterally isolating the gate region 2466. The interlayer dielectric layer material 2456 and the region at least partially laterally isolating the gate region 2466 may be formed from the same processing layer above a carrier 2448. The combination of a photonic crystal filter wavelength conversion element wherein the wavelength conversion element 2458 may include the same material or same materials as the gate region 2454 of the transistor, e.g. polysilicon gate material, and a photonic crystal filter wavelength conversion element 2460, 2464 including the same material or same materials, e.g. silicon dioxide, as a device isolation region 2450, 2452, provides an option to form an integrated three-dimensional photonic bandgap crystal from two individual layers of photonic two-dimensional structures by making use of standard CMOS process flows making the processess for forming the wavelength conversion elements (e.g. photonic crystal) layers CMOS compatible.

Depending on the targeted filter performance, i.e the spectral transmission band width, the thickness, x, of the horizontal dielectric layer 2466 between the wavelength conversion element 2460, 2466 and the further wavelength conversion element 2458 may be optimised. For detection purposes, the photoconverter 2462 may be disposed below the wavelength conversion element to detect transmitted light, or the photoconverter 2462 may be disposed within the wavelength conversion element to detect transmitted light, as illustrated in FIGS. 22B and 23B respectively.

A method may be carried out as follows as described with reference to features as those shown in FIG. 24D.

A carrier 2448, e.g. a silicon substrate, may be selected.

A first region of the carrier 2474 may be selected wherein other electronic components within the integrated circuit, e.g. a transistor as described in FIGS. 19a-d to 21a-d, may be located. A second region of the carrier 2476 may be selected wherein a wavelength conversion element may be located.

Standard photolithography and deposition techniques, e.g. ion implantation may be used to define regions included in a transistor located in the first region, e.g. channel stop regions 2470, source/drain regions 2468, 2472, pocket implants, well implants, of a transistor. During the processing of the regions included in a transistor, photolithography may be carried out in the second region of the carrier 2476 to define structures, e.g. a photoconverter structure 2462 such as a p-n or pin photodiode, which may be formed within or above the carrier 2448. One or more of the steps of forming the regions of the transistor, e.g. source/drain regions, pocket implants, well implants may be carried out in the same processing step with forming the photoconverter 2462. For example, ion implantation of the source/drain regions, pocket implants and well implants of the transistor may be carried out in the same processing step as the ion implantation of the photoconverter region 2462.

During the processing of the regions included in a transistor, a masking layer, e.g. photoresist, may be used to protect the second region 2476 of the carrier from processing steps being carried out in the first region 2474 of the carrier, which are processing steps which may not be needed in the sequence of processing steps in the second region 2476 of the carrier. A masking layer may likewise be used to protect the first region 2474 of the carrier from processing steps being carried out in the second region 2476 of the carrier.

A layer of photoresist may be formed over the first 2474 and second regions 2476 of the carrier. Photolithography may be carried out to pattern a shallow trench isolation region 2452 (or an arbitrary number of shallow trench isolation regions) and wavelength conversion element 2464 in the second region 2476 of the carrier. An STI etch may be carried out to form the shallow trench isolation region 2452 and the wavelength conversion element 2464 region. The shallow trench isolation region 2452 and the wavelength conversion element 2464 region may be formed during the same or different processing step. The shallow trench isolation region 2452 and the wavelength conversion element 2464 region may be formed from the same processing layer within or above a carrier. A shallow trench isolation material, e.g. silicon dioxide may be deposited to fill the regions 2452, 2464 created by the shallow trench isolation etch. The shallow trench isolation material deposited in the shallow trench isolation region 2452 and the wavelength conversion element 2464 region may be deposited in the same processing step. The shallow trench isolation material deposited in the shallow trench isolation region 2452 and the wavelength conversion element 2464 region may be deposited in the same processing layer within or above a carrier. The photoresist formed over the second region 2476 may be patterned, e.g. using a photomask, such that the wavelength conversion element 2460, 2464 includes one or more structural elements forming an array.

Chemical mechanical polishing (CMP) may be used to smoothen the surface of the trench filling material 2464. CMP in the first region 2474 and the second region 2476 may be carried out in the same processing step or in different processing steps. A masking layer, e.g. photoresist, may be used to protect the second region 2476 of the carrier from a transistor gate oxide deposition step to be carried out in the first region 2474 of the carrier. A masking layer, e.g. photoresist, may be used to protect the first region 2474 of the carrier from deposition or CMP of a horizontal dielectric layer, e.g. silicon dioxide with thickness x, carried out in the second region 2476.

A photoresist layer may be formed over the first region 2474 and second region 2476. The photoresist may be patterned using photolithography to form a transistor gate region 2454 and a further wavelength conversion element 2458, wherein the further wavelength conversion element may include one or more structural elements 2458 forming an array, wherein the one or more structural elements 2458 forming the array may include the same material or same materials as the gate region 2454.

A deposition step may be carried out in the first region 2474 of the carrier to form a floating gate region 2454 of the transistor located in the first region 2474 of the carrier, e.g. the deposition of a polysilicon floating gate. A deposition step may be carried out in the second region 2476 of the carrier to form one or more structural elements 2458 forming an array of the wavelength conversion element in the second region 2476 of the carrier, e.g. the deposition of polysilicon to form one or more structural elements forming the array. The deposition steps to form the floating gate 2454 region of the transistor located in the first region of the carrier and to form one or more structural elements 2458 forming an array of the wavelength conversion element in the second region 2476 of the carrier may be carried out in the same or different processing step.

The floating gate region 2454 of the transistor and the wavelength conversion element 2458 (structural elements forming an array) may be formed of the same material or same materials, e.g. polysilicon, in the same processing step, such that wavelength conversion element having the same material or same materials as the floating gate region 2454 of the transistor, are formed from the same processing layer as the gate region above a carrier.

A dielectric layer 2478 may be deposited above the floating gate 2454 region of the transistor in the first region 2474, in such a way that the dielectric layer at least partially isolates the floating gate layer 2454. A dielectric layer 2456 may be formed above the wavelength conversion element 2458 (structural elements forming an array forming the wavelength conversion element), or in such a way that the dielectric layer 2456 at least partially isolates the wavelength conversion element 2458.

The dielectric layer 2456 may be an interlayer dielectric layer material which may be formed such that each of the elements 2458 forming the array is at least partially laterally surrounded by the interlayer dielectric layer material 2456, and wherein the interlayer dielectric layer material 2456 includes the same material or same materials as a region at least partially laterally isolating the floating gate layer 2454.

The dielectric layer 2454 and dielectric layer 2456 may be formed during the same processing step.

Further deposition steps such as the deposition of a control gate 2466, buffer layers, spacers, and CoSi blocking layers may be carried out in the first region 2474 of the carrier. Whenever processing steps are carried out in the first (second) region of the carrier which may not be needed in the sequence of processing steps in the second (first) region of the carrier, or when a particular fabrication process to be carried out in a first region and a second region is carried out in a different processing step, a masking layer, e.g. photoresist, may be used to protect the second (first) region of the carrier from processing steps being carried out in the first (second) region of the carrier.

Figure 25A:
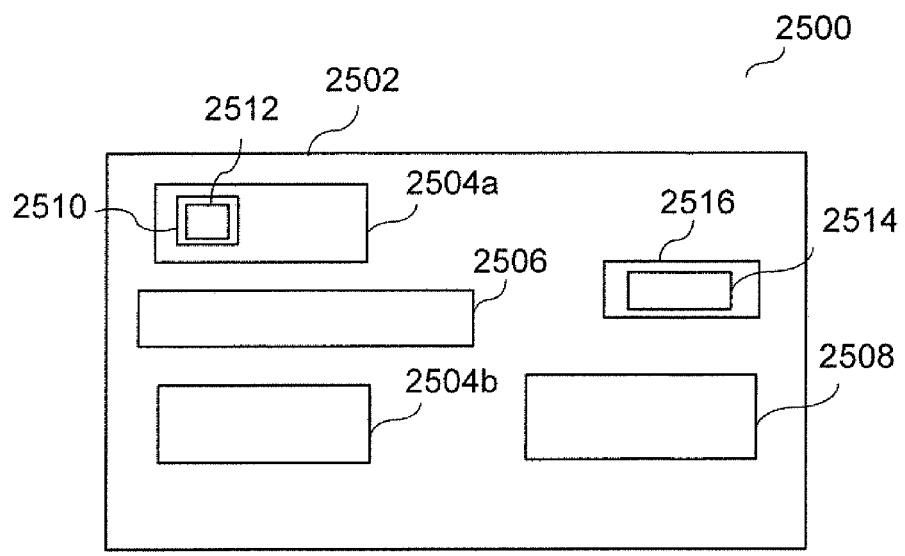
FIG. 25A shows an integrated circuit arrangement in accordance with various embodiments.

FIG. 25A shows an illustration 2500 of an integrated circuit arrangement 2502 including a plurality of devices 2504a, 2504b, a device isolation region 2506 for separating at least one device of the plurality of devices 2504a from a further at least one device of the plurality of devices 2504b, and a wavelength conversion element 2508, wherein the wavelength conversion element 2508 includes the same material or same materials as the device isolation region 2506, wherein the at least one of the plurality of devices is a transistor 2510 including a gate region 2512. The integrated circuit arrangement 2502 further includes a photoconverter 2514, wherein the photoconverter 2514 is formed in a region comprising the same material or same materials as the gate region 2516.

Figure 25B:
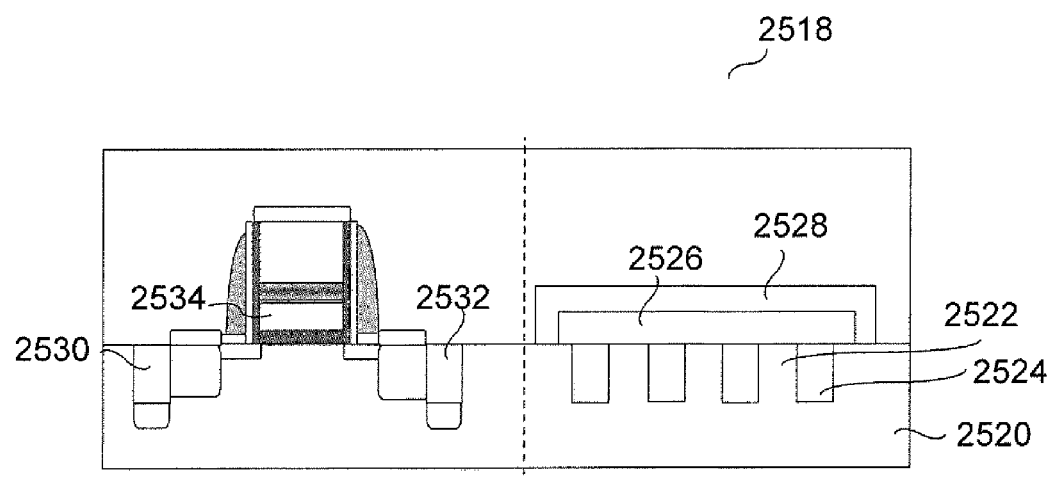
FIG. 25B shows an integrated circuit arrangement in accordance with various embodiments.

FIG. 25B shows an illustration 2518 of how a wavelength conversion element may be arranged within an integrated circuit. The wavelength conversion element 2522, 2524, may include one or more structural elements 2522 forming an array, wherein the one or more structural elements 2522 forming the array may include the material of the carrier 2520 e.g. bulk silicon. The integrated circuit arrangement 2502 further includes a photoconverter 2526, e.g. a p-n or pin photodiode, wherein the photoconverter 2526 is formed in a region 2528 including the same material or same materials as the gate region 2528, e.g, polysilicon. The wavelength conversion element may be disposed below the photoconverter, e.g. a p-n or pin photodiode, as shown in FIG. 23A, wherein the the photoconverter may be embedded in polysilicon (not shown in FIG. 23A).

As shown in FIG. 25B, an integrated circuit arrangement in accordance with an embodiment may include a transistor wherein the transistor may be any one of the transistors disclosed and described in FIGS. 19a-d to 21a-d.

The device isolation region, such as shallow trench isolation regions 2530, 2532 may include a material, wherein the material of the device isolation region 2530, 2532 and the wavelength conversion element including the same material or same materials as the device isolation region 2522, 2524 may be formed from the same processing layer above a carrier 2520. The material of the device isolation region 2530, 2532 may include silicon dioxide. The wavelength conversion element may be a photonic crystal which may be realized in the carrier 2520, by a standard complementary metal oxide semiconductor shallow trench isolation (CMOS STI) etch and standard CMOS STI fill performed in the carrier 2520, wherein the carrier material may include bulk silicon.

A carrier 2520 material, e.g. bulk silicon, may undergo a CMOS STI etch to form the one or more structural elements 2522 forming an array forming a region of the wavelength conversion element. The trench regions 2524 formed by a CMOS STI etch, may be filled using a standard COMS STI fill process, e.g. using chemical vapor deposition, wherein the trench regions 2524 may be filled with the same material or same materials as the device isolation region 2530, 2532, e.g. silicon dioxide. A technique for levelling or smoothening the surface of the deposited material, such as chemical mechanical polishing (CMP) may be used to smoothen the surface of the trench filling material 2524. A photoresist layer may be formed over the smoothened surface of the trench filling material 2524. The photoresist may be patterned to form a transistor gate region 2534 and photoconverter region 2526. The photoconverter 2526 may be formed from a materials deposition process and ion implantation. A gate material 2534, e.g. polysilicon, may be deposited to form a gate region 2534 and region 2528 which may surround the photoconverter 2526. Thereby, the photoconverter 2526 may be formed in a region comprising the same material or same materials as the gate region 2528.

FIG. 26 shows an illustration 2600 of an integrated circuit arrangement 2602 including a carrier 2604 including a first side and a second side, wherein the second side faces the opposite direction 2612 to the direction which the first side faces 2610, one or more devices 2606 formed in the first side of the carrier, and a wavelength conversion element 2608 formed in the second side of the carrier.

Figure 27A:
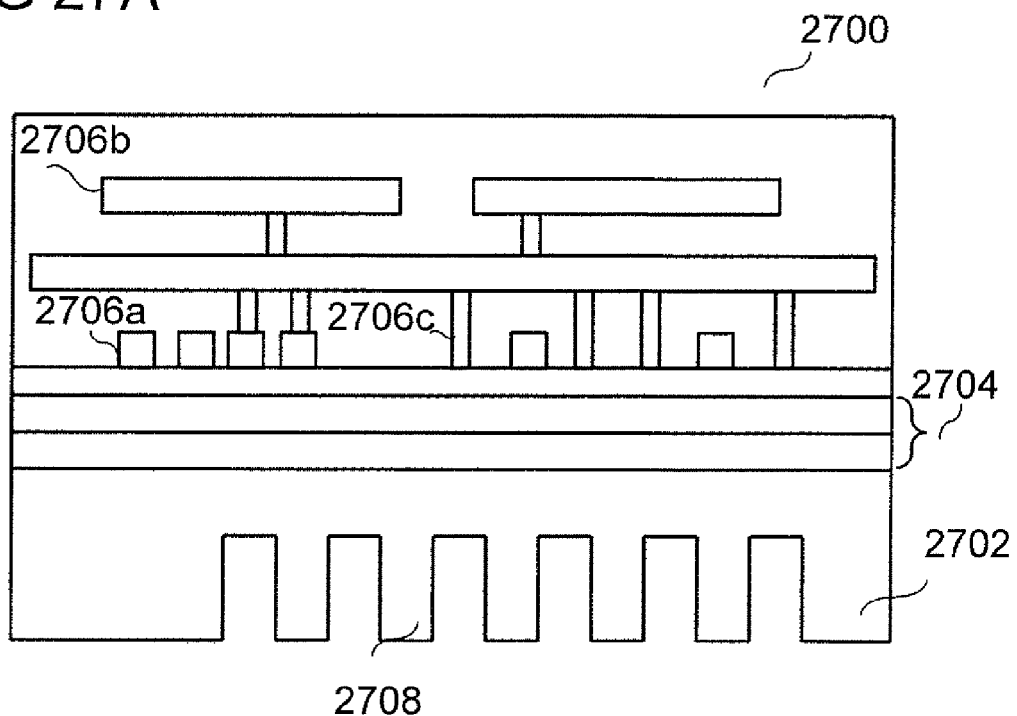
FIG. 27A shows an integrated circuit arrangement in accordance with various embodiments.

FIG. 27A shows an illustration 2700 of an integrated circuit arrangement of an embodiment, including a carrier 2702 including a first side and a second side, wherein the second side faces the opposite direction to the direction which the first side faces, one or more devices 2706 formed in the first side of the carrier, and a wavelength conversion element 2708 formed in the second side of the carrier. The one or more devices may include a transistor, including a gate region 2706a, e.g. a polysilicon gate, conducting lines 2706b, e.g., metal lines, and interconnects 2706c, e.g. metal interconnects.

The wavelength conversion element 2708 which may be a photonic crystal filter, may be realized by a dedicated Plasma Etch process on the backside of the wafer, by structuring the bulk silicon substrate material. The wavelength conversion element structuring process, or the wafer backside structuring sequence, may follow after the completion of front-end CMOS processes, testing and wafer thinning processes. A wafer may be thinned to 40 μm for 8" wafers. A wafer may be thinned to 20 μm in accordance with the CMOS device technology roadmap.

The geometry of the wavelength conversion element spectral filter pattern (depths, dimensions, aspect ratios) may be chosen similar to the embodiments already disclosed and as illustrated by the hexagonal or quadratic lattice arrangements as shown in FIGS. 10 to 14. The pitch, p, may range between ⅙ to ½ times the wavelength of interest. Each structural element may have a width, d. The width, d, may range between 0.2 to 1 times the value of p, e.g., p=220 nm, and d=180 nm. As this is a dedicated spectral filter, the depth of the filter structure may be freely chosen, without imposing the limitations of a dual-use process, limiting the filter design, e.g., the wavelength conversion element may be structured in a process independently of an STI process, or a transistor gate region formation process. However, in this process may an additional lithography and etch step may be provided to form the wavelength conversion element. The material composition of the photonic crystal wavelength conversion element 2702 in this embodiment may be silicon/air, hence the refractive index offset between the materials is further increased compared to the previous embodiments, wherein the material composition of the wavelength conversion may be polysilicon/silicon dioxide. Low-temperature chemical vapor deposition of a material for filling the etched trenches and further planarization may be performed. Trench filling by transparent glue or mold during the packaging process may be performed.

Figure 27B:
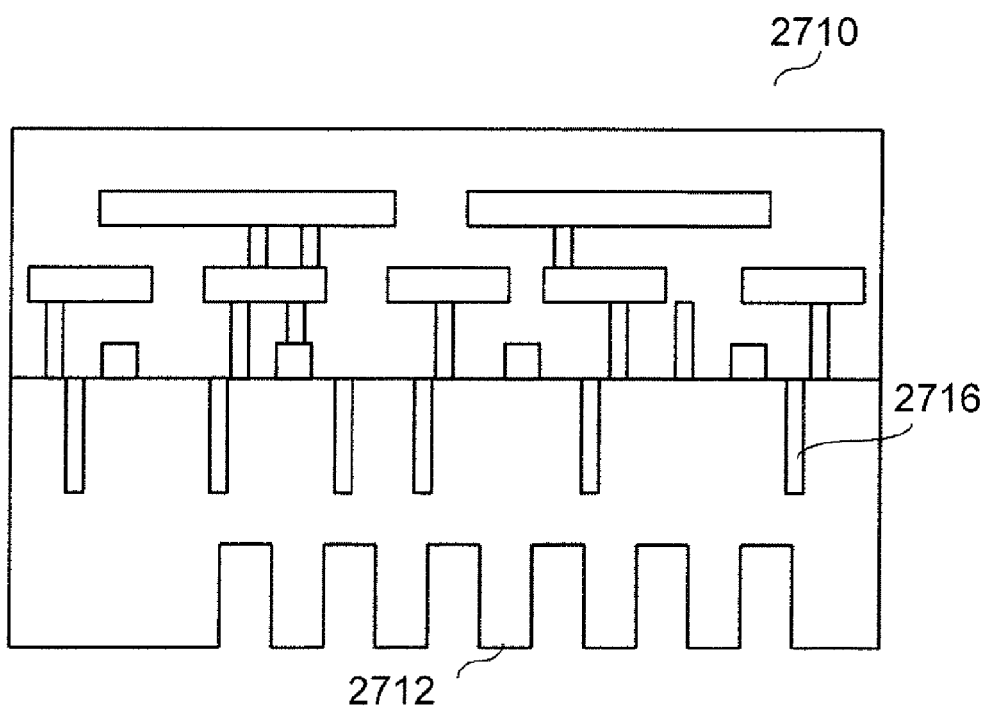
FIG. 27B shows an integrated circuit arrangement in accordance with various embodiments.

Illumination may be done through the backside or second side of the wafer. Detection is accomplished by a photoconverter 2704, e.g. p-n or pin photodiode in the bulk silicon substrate material if the wafer thickness is in the order of the penetration depth of the incoming light, or, in another embodiment shown in illustration 2710 of FIG. 27B, by a cell configured as a photosensitive cell, e.g. an MIS cell 2716. In both cases the light transmitted through the wavelength conversion element 2712 from the backside or second side of the wafer is detected.

The refractive index offset between the combination of materials of $Si/SiO_2$ and polysilicon/$SiO_2$ remains almost unchanged. Therefore, numerical calculation engines for calculating the spectral transmission of different filter geometries and with different combination of materials may be applied to all embodiments. In an embodiment, the photonic crystal filter may be realized by patterning the (gate)-poly of the CMOS process situated on top of the silicon substrate. The photo-detection of the spectrally filtered light may be accomplished by a photoconverter such as a p-n or pin photodiode in the bulk silicon material below the photonic filter.

In an embodiment, a two-dimensional photonic crystal may thus be created by using standard CMOS materials such as polysilicon and silicon dioxide as an interlayer dielectric. By creating a two-dimensional photonic crystal using a patterned polysilicon in parallel with patterning, a CMOS "gate" structure may be formed on the top of a photodiode. The pattern etched in the "gate", e.g. polysilicon gate, may define the spectral characteristic of a spectral filter. The photonic crystal including polysilicon may be isolated from the photodiode by a thin oxide layer. The layer thicknesses of the layers for creating the photonic crystal may be similar to standard CMOS processes. Furthermore, patterns such as poly-rods may be embedded in an interlayer dielectric layer or in inverse. The patterns may be created using standard photolithography methods in parallel with other CMOS processes, e.g. a CMOS polysilicon layer, within an integrated circuit arrangement as described in the embodiments. The spectral filters and manufacturing results may be easily detected by reverse engineering and via scanning electron microscopy. The filters may further be manufactured with backend processes, such as by using backend metals used during the backend metallization process, e.g. aluminum not thicker than 50 nm may be used.

In an embodiment, a two-dimensional photonic crystal may thus be created by using standard CMOS materials such as silicon, formed by etching a carrier material and silicon dioxide as an STI fill material. The thicknesses of the wavelength conversion element, i.e., depth d may be identical to standard CMOS process. The pattern for creating photonic crystal may be created with photolithography in parallel with creating the CMOS STI trench layer. The patterns of the photonic crystal and the STI trench pattern may be filled in parallel by an interlayer dielectric oxide, followed by a polishing step.

A three-dimensional photonic crystal may thus be created by using standard CMOS materials such as such as silicon, formed by etching a carrier material, silicon dioxide, which is also an STI fill material, polysilicon which is also a gate material and silicon dioxide which is also an interlayer dielectric material. The thicknesses of the wavelength conversion elements such as the silicon/silicon dioxide wavelength conversion element and the polysilicon/interlayer dielectric layer wavelength conversion element, i.e., depth d, may be identical to standard CMOS process. The pattern for creating the wavelength conversion element photonic crystal may be created with photolithography in parallel with creating the CMOS STI trench layer. The filter patterns of the wavelength conversion element photonic crystal and the STI trench pattern may be filled in parallel by an interlayer dielectric oxide, followed by a polishing step. The pattern for creating a further wavelength conversion element photonic crystal may be created with photolithography in parallel with creating a transistor gate region. The filter patterns of the wavelength conversion element photonic crystal and the gate region pattern may be formed by depositing polysilicon to form the transistor gate region and further wavelength conversion element in parallel steps.

In an embodiment, a two-dimensional photonic crystal may thus be created by using standard CMOS materials such as such as silicon, formed by etching a carrier material and air or transparent glue. The structure and layer thickness of the wavelength conversion element photonic crystal filter is independent from standard CMOS process. The wavelength conversion element filter pattern may be created by a dedicated plasma Etch process on the wafer backside, wherein the patterns are created with photolithography on the wafer backside after wafer thinning.

The spectral characteristics of a photodiode may be defined by the geometry of a wavelength conversion element layer which may be integrated into a front-end CMOS process. That is, an integrated circuit arrangement may be provided which provides a means to create photodiodes with different spectral response in parallel with front-end CMOS processes. In various embodiments, two diodes that have a very similar spectral response except in certain parts of the spectra may be created.

The signal of the photodiode may be obtained by calculating the integral across the spectra of the incident light. Careful design of geometries of the diode may create a "flute" effect, wherein the fraction of the signal within a certain wavelength range may be calculated. Color filters or ultimately spectrometers which may be used to determine the brightness of a light source, and in addition to identify different types of light source e.g. sunlight or different kinds of artificial light. Light temperature of displays may be adjusted with such sensors. Future devices may include color displays by transmittance/reflection of ambient light that will be adjusted based on the spectra of the ambient light in order to generate true colors.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit arrangement, comprising
   a transistor comprising a gate region;
   a wavelength conversion element, the wavelength conversion element comprising one or more structural elements forming array, wherein the one or more structural elements comprise the same material as the gate region and wherein the wavelength conversion element and the gate region are formed from the same processing layer above a carrier, and
   a further wavelength conversion element comprising one or more further structural elements forming a further array disposed above the wavelength conversion element, wherein the carrier further comprises a photoconverter, and
wherein the wavelength conversion element is disposed over the photoconverter, and
wherein the gate region is separate from the wavelength conversion element and is not disposed over the photoconverter.

2. The integrated circuit arrangement according to claim 1, wherein the material of the gate region of the transistor comprises a front end of line (FEOL) material.

3. The integrated circuit arrangement according to claim 2, wherein the front end of line (FEOL) material is polysilicon.

4. The integrated circuit arrangement according to claim 1, wherein the material of the gate region of the transistor comprises a metal.

5. The integrated circuit arrangement according to claim 1,
wherein the wavelength conversion element further comprises an interlayer dielectric layer material, and
wherein each of the elements forming the array is at least partially laterally surrounded by the interlayer dielectric layer material.

6. The integrated circuit arrangement according to claim 1, further comprising
a further gate region disposed over the gate region,
wherein the further wavelength conversion element comprises the same material or same materials as the further gate region of the transistor.

7. The integrated circuit arrangement according to claim 6,
wherein the further transistor gate region and the further wavelength conversion element comprising the same material or same materials as the further gate region are formed from the same processing layer above the carrier.

8. The integrated circuit arrangement according to claim 6, wherein the material of the gate region and the further gate region of the transistor comprises a front end of line (FEOL) material.

9. The integrated circuit arrangement according to claim 6, wherein the front end of line (FEOL) material is polysilicon.

10. The integrated circuit arrangement according to claim 6, wherein the material of the gate region and further gate region of the transistor comprises a metal.

11. An integrated circuit arrangement, comprising
a transistor comprising a gate region;
a wavelength conversion element, and
a further wavelength conversion element disposed above the wavelength conversion element,
wherein the wavelength conversion element comprises an interlayer dielectric material,
wherein the interlayer dielectric layer material comprises the same material or same materials as a region at least partially laterally isolating the gate region,
wherein the interlayer dielectric layer material and the region at least partially laterally isolating the gate region are formed from the same processing layer above a carrier,
wherein the carrier further comprises a photoconverter, and
wherein the wavelength conversion element is disposed over the photoconverter, and
wherein the gate region is separate from the wavelength conversion element and is not disposed over the photoconverter.

12. An integrated circuit arrangement according to claim 11, wherein the wavelength conversion element comprises the same material or same materials as the gate region of the transistor.

13. The integrated circuit arrangement according to claim 11, wherein the material of the gate region of the transistor comprises a front end of line (FEOL) material.

14. The integrated circuit arrangement according to claim 13, wherein the front end of line (FEOL) material is polysilicon.

15. The integrated circuit arrangement according to claim 11, wherein the material of the gate region of the transistor comprises a metal.

16. The integrated circuit arrangement according to claim 11, wherein the wavelength conversion element further comprises
one or more structural elements forming an array, wherein the one or more structural elements forming the array comprise the same material or same materials as the gate region.

17. The integrated circuit arrangement according to claim 11, further comprising:
a further gate region disposed over the gate region
wherein the further wavelength conversion element comprises a further interlayer dielectric layer material.

18. The integrated circuit arrangement according to claim 17,
wherein the gate region and further gate region and the wavelength conversion element and further wavelength conversion element are formed above a carrier;
wherein the gate region and the wavelength conversion element comprising the same material or same materials as the gate region are formed from the same processing layer above the carrier; and
wherein the further transistor gate region and the further wavelength conversion element comprising the same material or same materials as the further gate region are formed from the same processing layer above the carrier.

19. The integrated circuit arrangement according to claim 17, wherein the material of the gate region and further gate region of the transistor comprises a front end of line (FEOL) material comprising polysilicon.

20. The integrated circuit arrangement according to claim 17, wherein the material of the gate region and further gate region of the transistor comprise a metal.

21. An integrated circuit arrangement, comprising
a plurality of devices;
a device isolation region for separating at least one device of the plurality of devices from a further at least one device of the plurality of devices,
a wavelength conversion element,
a further wavelength conversion element disposed above the wavelength conversion element, and
a photo converter,
wherein the wavelength conversion element comprises the same material or same materials as the device isolation region,
wherein at least one of the plurality of devices is a transistor comprising a gate region, and wherein the further wavelength conversion element comprises the same material or same materials as the gate region,
wherein the wavelen h conversion element is disposed over the photoconverter, and
wherein the gate region is separate from the wavelength conversion element and is not disposed over the photoconverter.

22. The integrated circuit arrangement according to claim 21, wherein at least one of the plurality of devices is a transistor comprising a gate region, and wherein the photoconverter is formed in a region comprising the same material or same materials as the gate region.

* * * * *